US012658738B2

(12) United States Patent
Kwon et al.

(10) Patent No.: US 12,658,738 B2
(45) Date of Patent: Jun. 16, 2026

(54) METHOD AND DEVICE FOR SLOT GENERATION IN WIRELESS POWER TRANSMISSION SYSTEM

(71) Applicant: LG ELECTRONICS INC., Seoul (KR)

(72) Inventors: Taewook Kwon, Seoul (KR); Gyunghwan Yook, Seoul (KR); Jinho Youn, Seoul (KR); Yongcheol Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 116 days.

(21) Appl. No.: 18/705,873

(22) PCT Filed: Oct. 27, 2022

(86) PCT No.: PCT/KR2022/016559
§ 371 (c)(1),
(2) Date: Dec. 5, 2024

(87) PCT Pub. No.: WO2023/075445
PCT Pub. Date: May 4, 2023

(65) Prior Publication Data
US 2025/0105678 A1 Mar. 27, 2025

(30) Foreign Application Priority Data
Oct. 28, 2021 (KR) ........................ 10-2021-0145820

(51) Int. Cl.
*H02J 50/60* (2016.01)
*H02J 50/12* (2016.01)
*G01R 27/26* (2006.01)

(52) U.S. Cl.
CPC .............. *H02J 50/60* (2016.02); *H02J 50/12* (2016.02); *G01R 27/2688* (2013.01)

(58) Field of Classification Search
CPC ...................................................... H02J 50/60
(Continued)

(56) References Cited

U.S. PATENT DOCUMENTS

| 2021/0083518 A1* | 3/2021 | Stingu | H02J 50/60 |
| 2023/0048919 A1* | 2/2023 | Park | H02J 50/12 |
| 2023/0126095 A1* | 4/2023 | Park | H02J 50/80 |
| | | | 307/104 |

FOREIGN PATENT DOCUMENTS

| JP | 2016007124 | 1/2016 |
| KR | 1020130078264 | 7/2013 |

(Continued)

OTHER PUBLICATIONS

Korean Intellectual Property Office Application No. 10-2024-7014211, Notice of Allowance dated Aug. 4, 2025, 2 pages.
(Continued)

*Primary Examiner* — Joseph Chang
(74) *Attorney, Agent, or Firm* — LEE, HONG, DEGERMAN, KANG & WAIMEY

(57) ABSTRACT

The present disclosure provides a method for transmitting wireless power, performed by a wireless power transmitter, in a wireless power transmission system, and a device using same, the method comprising: entering a power transmission phase associated with transmitting the wireless power to a wireless power receiver; generating a slot in the power transmission phase; and performing foreign object detection on the slot, wherein the wireless power transmitter transmits the wireless power to the wireless power receiver on the basis of a first operating frequency before generating the slot, the wireless power transmitter resumes transmitting the wireless power on the basis of a second operating frequency after the slot is ended, and the second operating frequency is a higher frequency than the first operating frequency.

14 Claims, 36 Drawing Sheets

(58) Field of Classification Search
USPC ........................................................ 307/104
See application file for complete search history.

(56) References Cited

FOREIGN PATENT DOCUMENTS

| KR | 1020140124575 | 10/2014 |
| KR | 1020140124709 | 10/2014 |
| KR | 10201900122214 | 10/2019 |
| WO | 2021030120 | 2/2021 |
| WO | 2021115913 | 6/2021 |

OTHER PUBLICATIONS

PCT International Application No. PCT/KR2022/016559, International Search Report dated Feb. 6, 2023, 4 pages.

* cited by examiner

10

10

(a) BR/EDR Protocol Stack (b) LE Protocol Stack

| | b7 | b6 | b5 | b4 | b3 | b2 | b1 | b0 |
|---|---|---|---|---|---|---|---|---|
| B0 | '00' | | Reference Power | | | | | |
| B1 | Reserved | | | | | | | |
| B2 | ZERO | AI | Reserved | OB | ZERO | Count | | |
| B3 | Window Size | | | | Window Offset | | | |
| B4 | Neg | Pol | Depth | | Buffer Size | | | Dup |

Extended Power Transfer Contract

|        | b7 | b6 | b5 | b4 | b3 | b2 | b1 | b0 |
|--------|----|----|----|----|----|----|----|----|
| B0 | Reserved | | Negotiable Load Power | | | | | |
| B1 | Reserved | | Potential Load Power | | | | | |
| B2 | Dup | AR | OB | Buffer Size | | | WPID | NRS |

FIG. 18

| | b7 | b6 | b5 | b4 | b3 | b2 | b1 | b0 |
|---|---|---|---|---|---|---|---|---|
| B0 | 1 | | | | TBD | | | |
| B1 | PRMC | | | | | | | |
| B2 | | | | | | | | |
| B3 | 1 | | | | | | | |
| B4 | Random Identifier | | | | | | | |
| B5 | | | | | | | | |
| B6 | Mfg Rsvd | | | | | | | |

MPP ID Packet Structure

FIG. 19

| | $b_7$ | $b_6$ | $b_5$ | $b_4$ | $b_3$ | $b_2$ | $b_1$ | $b_0$ |
|---|---|---|---|---|---|---|---|---|
| $B_0$ | XID Selector (0xFE) | | | | | | | |
| $B_1$ | Restricted | R | Chime | Reserved | Family Collection | | | |
| $B_2$ | Preferred Frequency | | Freq Mask | | | | | |
| $B_3$ | VRECT | | | | | | | |
| $B_4$ | Alpha0 Rx | | | | | | | |
| $B_5$ | Alpha1 Rx | | | | | | | |
| $B_6$ | Alpha-Kth Rx | | | | | | | |
| $B_7$ | Mfg Rsvd | | | | | | | |

MPP XID Packet Parameters

Transmitter removes power signal and restarts ping phase with the new frequency

FIG. 23

$$Q = 2\pi f_0 \frac{E_{stored}}{P_{loss}}$$

$$Q = \frac{1}{R}\sqrt{\frac{L}{C}} = \frac{2\pi f_o L}{C} = \frac{1}{2\pi f_o RC}$$

(1) PRx coil rectifier voltage, voltage drop occurs in slot section (2) PRx coil voltage, voltage peak occurs after slot section (3) Slot section PRx coil rectifier voltage PRx coil voltage Slot section Even in slots, the PRx coil rectifier voltage is maintained at the existing target Increase the input of the PRx coil rectifier by increasing the PTx input before the slot

FIG. 43

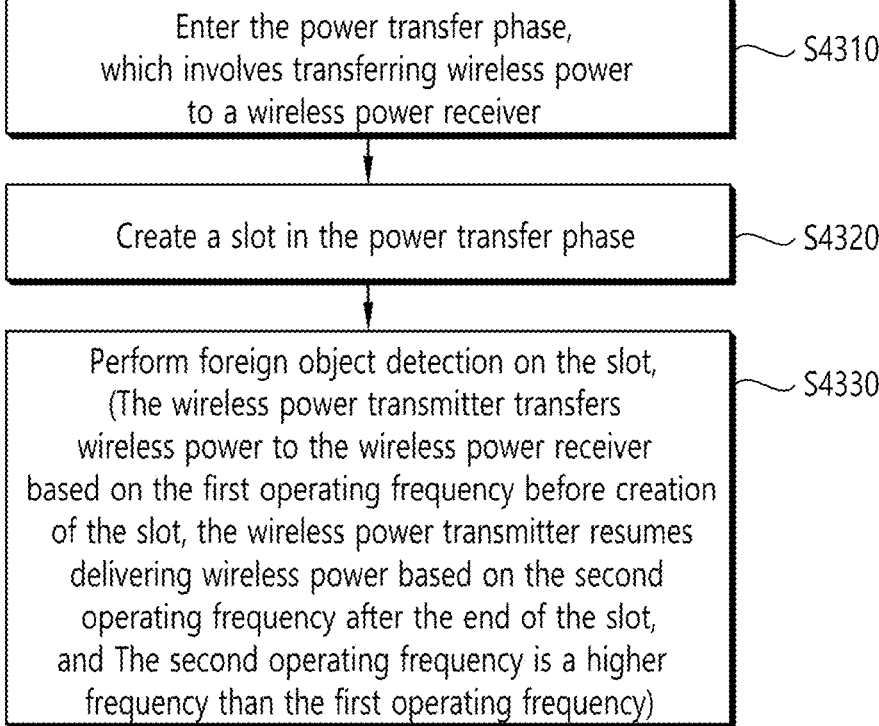

Enter the power transfer phase,
which involves transferring wireless power
to a wireless power receiver — S4310

Create a slot in the power transfer phase — S4320

Perform foreign object detection on the slot,
(The wireless power transmitter transfers
wireless power to the wireless power receiver
based on the first operating frequency before creation
of the slot, the wireless power transmitter resumes
delivering wireless power based on the second
operating frequency after the end of the slot,
and The second operating frequency is a higher
frequency than the first operating frequency) — S4330

FIG. 44

Enter the power transfer phase associated
with receiving wireless power
from a wireless power transmitter
(The wireless power receiver receives wireless power
from the wireless power transmitter
based on the first operating frequency before
creation of the slot, the wireless power receiver
resumes receiving wireless power based on the second
operating frequency after the end of the slot,
and The second operating frequency is a higher
frequency than the first operating frequency) — S4410

1

METHOD AND DEVICE FOR SLOT GENERATION IN WIRELESS POWER TRANSMISSION SYSTEM

CROSS-REFERENCE TO RELATED APPLICATION(S)

This application is the National Stage filing under 35 U.S.C. 371 of International Application No. PCT/KR2022/016559, filed on Oct. 27, 2022, which claims the benefit of earlier filing date and right of priority to Korean Application No. 10-2021-0145820, filed on Oct. 28, 2021, the contents of which are all incorporated by reference herein in their entirety.

TECHNICAL FIELD

This specification relates to wireless power transfer.

BACKGROUND

The wireless power transfer (or transmission) technology corresponds to a technology that may wirelessly transfer (or transmit) power between a power source and an electronic device. For example, by allowing the battery of a wireless device, such as a smartphone or a tablet PC, and so on, to be recharged by simply loading the wireless device on a wireless charging pad, the wireless power transfer technique may provide more outstanding mobility, convenience, and safety as compared to the conventional wired charging environment, which uses a wired charging connector. Apart from the wireless charging of wireless devices, the wireless power transfer technique is raising attention as a replacement for the conventional wired power transfer environment in diverse fields, such as electric vehicles, Bluetooth earphones, 3D glasses, diverse wearable devices, household (or home) electric appliances, furniture, underground facilities, buildings, medical equipment, robots, leisure, and so on.

The wireless power transfer (or transmission) method is also referred to as a contactless power transfer method, or a no point of contact power transfer method, or a wireless charging method. A wireless power transfer system may be configured of a wireless power transmitter supplying electric energy by using a wireless power transfer method, and a wireless power receiver receiving the electric energy being supplied by the wireless power transmitter and supplying the receiving electric energy to a receiver, such as a battery cell, and so on.

The wireless power transfer technique includes diverse methods, such as a method of transferring power by using magnetic coupling, a method of transferring power by using radio frequency (RF), a method of transferring power by using microwaves, and a method of transferring power by using ultrasound (or ultrasonic waves). The method that is based on magnetic coupling is categorized as a magnetic induction method and a magnetic resonance method. The magnetic induction method corresponds to a method transmitting power by using electric currents that are induced to the coil of the receiver by a magnetic field, which is generated from a coil battery cell of the transmitter, in accordance with an electromagnetic coupling between a transmitting coil and a receiving coil. The magnetic resonance method is similar to the magnetic induction method in that is uses a magnetic field. However, the magnetic resonance method is different from the magnetic induction method in that energy is transmitted due to a concentration of magnetic fields on both a transmitting end and a receiving end, which is caused by the generated resonance.

Meanwhile, in the power transfer phase, when the wireless power transmitter creates a slot, a configuration that prevents overvoltage and/or undervoltage problems from occurring in the wireless power receiver needs to be provided.

SUMMARY

According to an embodiment of the present specification, a method and apparatus where the wireless power transmitter transfers wireless power to the wireless power receiver based on the first operating frequency before creation of the slot, the wireless power transmitter resumes delivering wireless power based on the second operating frequency after the end of the slot and the second operating frequency is a higher frequency than the first operating frequency may be provided.

According to the present specification, the effect of preventing the circuit of the wireless power receiver from being damaged can occur. In addition, according to the present specification, the problem of stopping charging of the wireless power receiver after the slot can be prevented.

Effects obtainable through specific examples of the present specification are not limited to the effects listed above. For example, there may be various technical effects that a person having ordinary skill in the related art can understand or derive from this specification. Accordingly, the specific effects of the present specification are not limited to those explicitly described in the present specification, and may include various effects that can be understood or derived from the technical features of the present specification.

BRIEF DESCRIPTION OF THE DRAWINGS

FIG. 18 schematically shows the structure of an MPP ID packet.

FIG. 19 schematically shows an example of an XID packet in MPP.

FIG. 23 shows a flowchart of the calibration method.

FIG. 43 is a flowchart of a method for transmitting wireless power from the perspective of a wireless power transmitter, according to an embodiment of the present specification.

FIG. 44 is a flowchart of a method of receiving wireless power from the perspective of a wireless power receiver, according to an embodiment of the present specification.

MODE

In this specification, "A or B" may refer to "only A", "only B" or "both A and B". In other words, "A or B" in this specification may be interpreted as "A and/or B". For example, in this specification, "A, B, or C" may refer to "only A", "only B", "only C", or any combination of "A, B and C".

The slash (/) or comma used in this specification may refer to "and/or". For example, "A/B" may refer to "A and/or B". Accordingly, "A/B" may refer to "only A", "only B", or "both A and B". For example, "A, B, C" may refer to "A, B, or C".

In this specification, "at least one of A and B" may refer to "only A", "only B", or "both A and B". In addition, in this specification, the expression of "at least one of A or B" or "at least one of A and/or B" may be interpreted to be the same as "at least one of A and B".

Also, in this specification, "at least one of A, B and C" may refer to "only A", "only B", "only C", or "any combination of A, B and C". Also, "at least one of A, B or C" or "at least one of A, B and/or C" may refer to "at least one of A, B and C".

In addition, parentheses used in the present specification may refer to "for example". Specifically, when indicated as "control information (PDCCH)", "PDCCH" may be proposed as an example of "control information". In other words, "control information" in this specification is not limited to "PDCCH", and "PDCCH" may be proposed as an example of "control information". In addition, even when indicated as "control information (i.e., PDCCH)", "PDCCH" may be proposed as an example of "control information".

In the present specification, technical features that are individually described in one drawing may be individually or simultaneously implemented. The term "wireless power", which will hereinafter be used in this specification, will be used to refer to an arbitrary form of energy that is related to an electric field, a magnetic field, and an electromagnetic field, which is transferred (or transmitted) from a wireless power transmitter to a wireless power receiver without using any physical electromagnetic conductors. The wireless power may also be referred to as a wireless power signal, and this may refer to an oscillating magnetic flux that is enclosed by a primary coil and a secondary coil. For example, power conversion for wirelessly charging devices including mobile phones, cordless phones, iPods, MP3 players, headsets, and so on, within the system will be described in this specification. Generally, the basic principle of the wireless power transfer technique includes, for example, all of a method of transferring power by using magnetic coupling, a method of transferring power by using radio frequency (RF), a method of transferring power by using microwaves, and a method of transferring power by using ultrasound (or ultrasonic waves).

Figure 1:
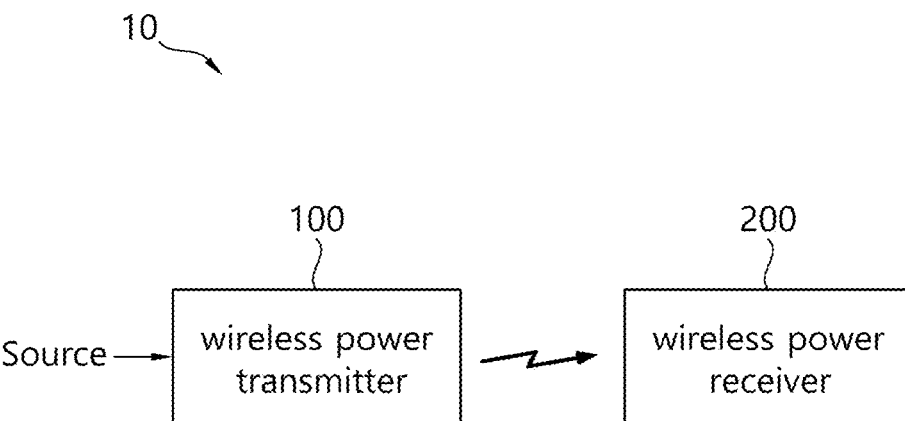
FIG. 1 is a block diagram of a wireless power system (10) according to an exemplary embodiment of the present disclosure.

FIG. 1 is a block diagram of a wireless power system (10) according to an exemplary embodiment of the present disclosure.

Referring to FIG. 1, the wireless power system (10) include a wireless power transmitter (100) and a wireless power receiver (200).

The wireless power transmitter (100) is supplied with power from an external power source(S) and generates a magnetic field. The wireless power receiver (200) generates electric currents by using the generated magnetic field, thereby being capable of wirelessly receiving power.

Additionally, in the wireless power system (10), the wireless power transmitter (100) and the wireless power receiver (200) may transceive (transmit and/or receive) diverse information that is required for the wireless power transfer. Herein, communication between the wireless power transmitter (100) and the wireless power receiver (200) may be performed (or established) in accordance with any one of an in-band communication, which uses a magnetic field that is used for the wireless power transfer (or transmission), and an out-band communication, which uses a separate communication carrier. Out-band communication may also be referred to as out-of-band communication. Hereinafter, out-band communication will be largely described. Examples of out-band communication may include NFC, Bluetooth, Bluetooth low energy (BLE), and the like.

Herein, the wireless power transmitter (100) may be provided as a fixed type or a mobile (or portable) type. Examples of the fixed transmitter type may include an embedded type, which is embedded in in-door ceilings or wall surfaces or embedded in furniture, such as tables, an implanted type, which is installed in out-door parking lots, bus stops, subway stations, and so on, or being installed in means of transportation, such as vehicles or trains. The mobile (or portable) type wireless power transmitter (100) may be implemented as a part of another device, such as a mobile device having a portable size or weight or a cover of a laptop computer, and so on.

Additionally, the wireless power receiver (200) should be interpreted as a comprehensive concept including diverse home appliances and devices that are operated by being wirelessly supplied with power instead of diverse electronic devices being equipped with a battery and a power cable. Typical examples of the wireless power receiver (200) may include portable terminals, cellular phones, smartphones, personal digital assistants (PDAs), portable media players (PDPs), Wibro terminals, tablet PCs, phablet, laptop computers, digital cameras, navigation terminals, television, electronic vehicles (EVs), and so on.

Figure 2:
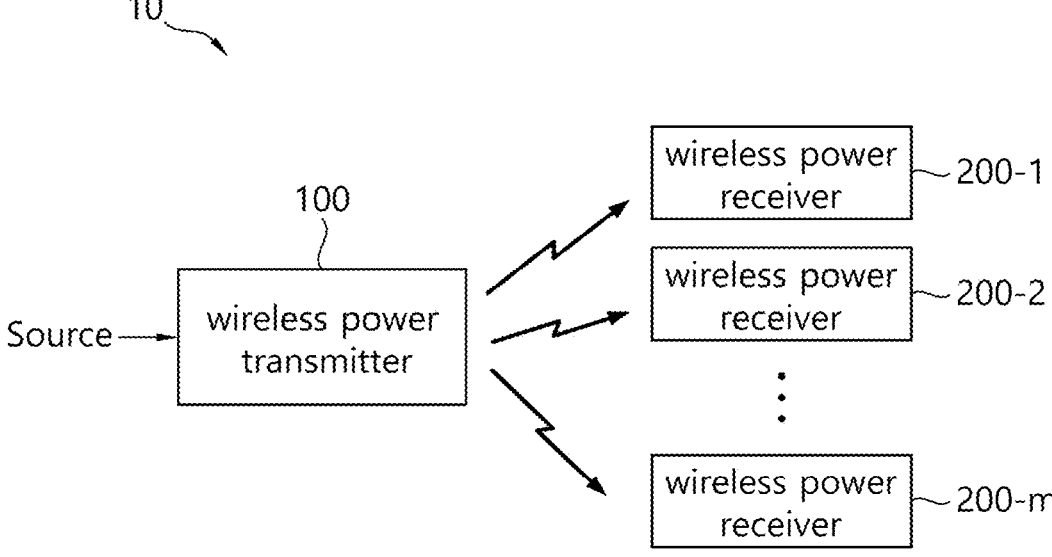
FIG. 2 is a block diagram of a wireless power system (10) according to another exemplary embodiment of the present disclosure.

FIG. 2 is a block diagram of a wireless power system (10) according to another exemplary embodiment of the present disclosure.

Referring to FIG. 2, in the wireless power system (10), one wireless power receiver (200) or a plurality of wireless power receivers may exist. Although it is shown in FIG. 1 that the wireless power transmitter (100) and the wireless power receiver (200) send and receive power to and from one another in a one-to-one correspondence (or relationship), as shown in FIG. 2, it is also possible for one wireless power transmitter (100) to simultaneously transfer power to multiple wireless power receivers (200-1, 200-2, . . . , 200-M). Most particularly, in case the wireless power transfer (or transmission) is performed by using a magnetic resonance method, one wireless power transmitter (100) may transfer power to multiple wireless power receivers (200-1, 200-2, . . . , 200-M) by using a synchronized transport (or transfer) method or a time-division transport (or transfer) method.

Additionally, although it is shown in FIG. 1 that the wireless power transmitter (100) directly transfers (or transmits) power to the wireless power receiver (200), the wireless power system (10) may also be equipped with a separate wireless power transceiver, such as a relay or repeater, for increasing a wireless power transport distance between the wireless power transmitter (100) and the wireless power receiver (200). In this case, power is delivered to the wireless power transceiver from the wireless power transmitter (100), and, then, the wireless power transceiver may transfer the received power to the wireless power receiver (200).

Hereinafter, the terms wireless power receiver, power receiver, and receiver, which are mentioned in this specification, will refer to the wireless power receiver (200). Also, the terms wireless power transmitter, power transmitter, and transmitter, which are mentioned in this specification, will refer to the wireless power transmitter (100).

Figure 3:
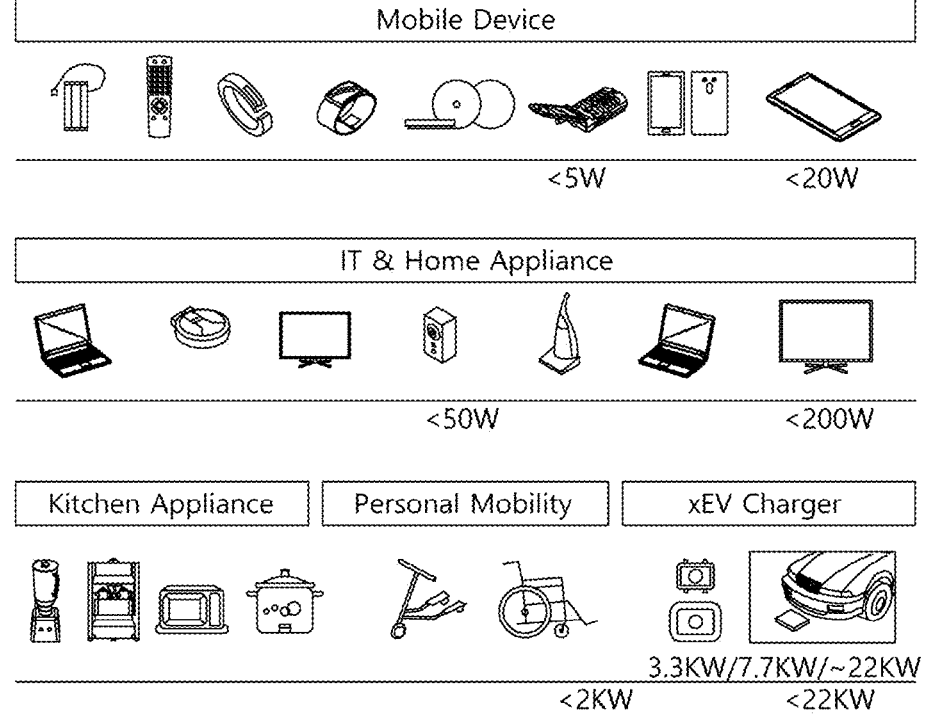
FIG. 3 shows an exemplary embodiment of diverse electronic devices adopting a wireless power transfer system.

FIG. 3 shows an exemplary embodiment of diverse electronic devices adopting a wireless power transfer system.

As shown in FIG. 3, the electronic devices included in the wireless power transfer system are sorted in accordance with the amount of transmitted power and the amount of received power. Referring to FIG. 3, wearable devices, such as smart watches, smart glasses, head mounted displays (HMDs), smart rings, and so on, and mobile electronic devices (or portable electronic devices), such as earphones, remote controllers, smartphones, PDAs, tablet PCs, and so on, may adopt a low-power (approximately 5 W or less or approximately 20 W or less) wireless charging method.

Small-sized/Mid-sized electronic devices, such as laptop computers, robot vacuum cleaners, TV receivers, audio devices, vacuum cleaners, monitors, and so on, may adopt a mid-power (approximately 50 W or less or approximately 200 W or less) wireless charging method. Kitchen appliances, such as mixers, microwave ovens, electric rice cookers, and so on, and personal transportation devices (or other electric devices or means of transportation), such as powered wheelchairs, powered kick scooters, powered bicycles, electric cars, and so on may adopt a high-power (approximately 2 kW or less or approximately 22 kW or less) wireless charging method.

The electric devices or means of transportation, which are described above (or shown in FIG. 1) may each include a wireless power receiver, which will hereinafter be described in detail. Therefore, the above-described electric devices or means of transportation may be charged (or recharged) by wirelessly receiving power from a wireless power transmitter.

Hereinafter, although the present disclosure will be described based on a mobile device adopting the wireless power charging method, this is merely exemplary. And, therefore, it shall be understood that the wireless charging method according to the present disclosure may be applied to diverse electronic devices.

A standard for the wireless power transfer (or transmission) includes a wireless power consortium (WPC), an air fuel alliance (AFA), and a power matters alliance (PMA).

The WPC standard defines a baseline power profile (BPP) and an extended power profile (EPP). The BPP is related to a wireless power transmitter and a wireless power receiver supporting a power transfer of 5 W, and the EPP is related to a wireless power transmitter and a wireless power receiver supporting the transfer of a power range greater than 5 W and less than 30 W.

Diverse wireless power transmitters and wireless power receivers each using a different power level may be covered by each standard and may be sorted by different power classes or categories.

For example, the WPC may categorize (or sort) the wireless power transmitters and the wireless power receivers as PC-1, PC0, PC1, and PC2, and the WPC may provide a standard document (or specification) for each power class (PC). The PC-1 standard relates to wireless power transmitters and receivers providing a guaranteed power of less than 5 W. The application of PC-1 includes wearable devices, such as smart watches.

The PC0 standard relates to wireless power transmitters and receivers providing a guaranteed power of 5 W. The PC0 standard includes an EPP having a guaranteed power ranges that extends to 30 W. Although in-band (IB) communication corresponds to a mandatory communication protocol of PC0, out-of-band (OB) communication that is used as an optional backup channel may also be used for PC0. The wireless power receiver may be identified by setting up an OB flag, which indicates whether or not the OB is supported, within a configuration packet. A wireless power transmitter supporting the OB may enter an OB handover phase by transmitting a bit-pattern for an OB handover as a response to the configuration packet. The response to the configuration packet may correspond to an NAK, an ND, or an 8-bit pattern that is newly defined. The application of the PC0 includes smartphones.

The PC1 standard relates to wireless power transmitters and receivers providing a guaranteed power ranging from 30 W to 150 W. OB corresponds to a mandatory communication channel for PC1, and IB is used for initialization and link establishment to OB. The wireless power transmitter may enter an OB handover phase by transmitting a bit-pattern for an OB handover as a response to the configuration packet. The application of the PC1 includes laptop computers or power tools.

The PC2 standard relates to wireless power transmitters and receivers providing a guaranteed power ranging from 200 W to 2 kW, and its application includes kitchen appliances.

As described above, the PCs may be differentiated in accordance with the respective power levels. And, information on whether or not the compatibility between the same PCs is supported may be optional or mandatory. Herein, the compatibility between the same PCs indicates that power transfer/reception between the same PCs is possible. For example, in case a wireless power transmitter corresponding to PC x is capable of performing charging of a wireless power receiver having the same PC x, it may be understood that compatibility is maintained between the same PCs. Similarly, compatibility between different PCs may also be supported. Herein, the compatibility between different PCs indicates that power transfer/reception between different PCs is also possible. For example, in case a wireless power transmitter corresponding to PC x is capable of performing charging of a wireless power receiver having PC y, it may be understood that compatibility is maintained between the different PCs.

The support of compatibility between PCs corresponds to an extremely important issue in the aspect of user experience and establishment of infrastructure. Herein, however, diverse problems, which will be described below, exist in maintaining the compatibility between PCs.

In case of the compatibility between the same PCs, for example, in case of a wireless power receiver using a lap-top charging method, wherein stable charging is possible only when power is continuously transferred, even if its respective wireless power transmitter has the same PC, it may be difficult for the corresponding wireless power receiver to stably receive power from a wireless power transmitter of the power tool method, which transfers power non-continuously. Additionally, in case of the compatibility between different PCs, for example, in case a wireless power transmitter having a minimum guaranteed power of 200 W transfers power to a wireless power receiver having a maximum guaranteed power of 5 W, the corresponding wireless power receiver may be damaged due to an overvoltage. As a result, it may be inappropriate (or difficult) to use the PS as an index/reference standard representing/indicating the compatibility.

Wireless power transmitters and receivers may provide a very convenient user experience and interface (UX/UI). That is, a smart wireless charging service may be provided, and the smart wireless charging service may be implemented based on a UX/UI of a smartphone including a wireless power transmitter. For these applications, an interface between a processor of a smartphone and a wireless charging receiver allows for "drop and play" two-way communication between the wireless power transmitter and the wireless power receiver.

As an example, a user can experience a smart wireless charging service in a hotel. When a user enters a hotel room and places the smartphone on the wireless charger in the room, the wireless charger transmits wireless power to the smartphone, and the smartphone receives wireless power. In this process, the wireless charger transmits information about the smart wireless charging service to the smartphone. When the smartphone detects that it is placed on the wireless charger, detects reception of wireless power, or when the smartphone receives information about the smart wireless charging service from the wireless charger, the smartphone enters a state where it asks the user for consent (opt-in) to additional features. To this end, the smartphone can display a message on the screen with or without an alarm sound. An example of a message may include phrases such as "Welcome to ###hotel. Select "Yes" to activate smart charging functions: Yes|No Thanks." The smartphone receives the user's input of selecting Yes or No Thanks and performs the next procedure selected by the user. If Yes is selected, the smartphone transmits the information to the wireless charger. And the smartphone and wireless charger perform the smart charging function together.

Smart wireless charging service may also include receiving auto-filled WiFi credentials. For example, a wireless charger transmits WiFi credentials to a smartphone, and the smartphone runs the appropriate app and automatically enters the WiFi credentials received from the wireless charger.

Smart wireless charging service may also include running a hotel application that provides hotel promotions, remote check-in/check-out, and obtaining contact information.

As another example, users can experience smart wireless charging services within a vehicle. When the user gets into the vehicle and places the smartphone on the wireless charger, the wireless charger transmits wireless power to the smartphone, and the smartphone receives wireless power. In this process, the wireless charger transmits information about the smart wireless charging service to the smartphone. When the smartphone detects that it is placed on the wireless charger, detects reception of wireless power, or when the smartphone receives information about the smart wireless charging service from the wireless charger, the smartphone enters a state where it asks the user to confirm his or her identity.

In this state, the smartphone automatically connects to the car via WiFi and/or Bluetooth. The smartphone can display the message on the screen with or without an alarm sound. An example of a message may include phrases such as "Welcome to your car. Select "Yes" to synch device with in-car controls: Yes|No Thanks." The smartphone receives the user's input of selecting Yes or No Thanks and performs the next procedure selected by the user. If Yes is selected, the smartphone transmits the information to the wireless charger. And by running the in-vehicle application/display software, the smartphone and wireless charger can perform in-vehicle smart control functions together. Users can enjoy the music they want and check regular map locations. In-vehicle application/display software may include the capability to provide synchronized access for pedestrians.

As another example, users can experience smart wireless charging at home. When a user enters a room and places the smartphone on the wireless charger in the room, the wireless charger transmits wireless power to the smartphone, and the smartphone receives wireless power. In this process, the wireless charger transmits information about the smart wireless charging service to the smartphone. When the smartphone detects that it is placed on the wireless charger, detects reception of wireless power, or when the smartphone receives information about the smart wireless charging service from the wireless charger, the smartphone enters a state where it asks the user for consent (opt-in) to additional features. To this end, the smartphone can display a message on the screen with or without an alarm sound. An example of a message may include phrases such as "Hi xxx, Would you like to activate night mode and secure the building?: Yes|No Thanks." The smartphone receives the user's input of selecting Yes or No Thanks and performs the next procedure selected by the user. If Yes is selected, the smartphone transmits the information to the wireless charger. Smartphones and wireless chargers can at least recognize user patterns and encourage users to lock doors and windows, turn off lights, or set alarms.

Hereinafter, 'profiles' will be newly defined based on indexes/reference standards representing/indicating the compatibility. More specifically, it may be understood that by maintaining compatibility between wireless power transmitters and receivers having the same 'profile', stable power transfer/reception may be performed, and that power transfer/reception between wireless power transmitters and receivers having different 'profiles' cannot be performed. The 'profiles' may be defined in accordance with whether or not compatibility is possible and/or the application regardless of (or independent from) the power class.

For example, the profile may be sorted into 3 different categories, such as i) Mobile, ii) Power tool and iii) Kitchen.

For another example, the profile may be sorted into 4 different categories, such as i) Mobile, ii) Power tool, iii) Kitchen, and iv) Wearable.

In case of the 'Mobile' profile, the PC may be defined as PC0 and/or PC1, the communication protocol/method may be defined as IB and OB communication, and the operation frequency may be defined as 87 to 205 kHz, and smartphones, laptop computers, and so on, may exist as the exemplary application.

In case of the 'Power tool' profile, the PC may be defined as PC1, the communication protocol/method may be defined as IB communication, and the operation frequency may be defined as 87 to 145 kHz, and power tools, and so on, may exist as the exemplary application.

In case of the 'Kitchen' profile, the PC may be defined as PC2, the communication protocol/method may be defined as NFC-based communication, and the operation frequency may be defined as less than 100 kHz, and kitchen/home appliances, and so on, may exist as the exemplary application.

In the case of power tools and kitchen profiles, NFC communication may be used between the wireless power transmitter and the wireless power receiver. The wireless power transmitter and the wireless power receiver may confirm that they are NFC devices with each other by exchanging WPC NFC data exchange profile format (NDEF).

Figure 4:
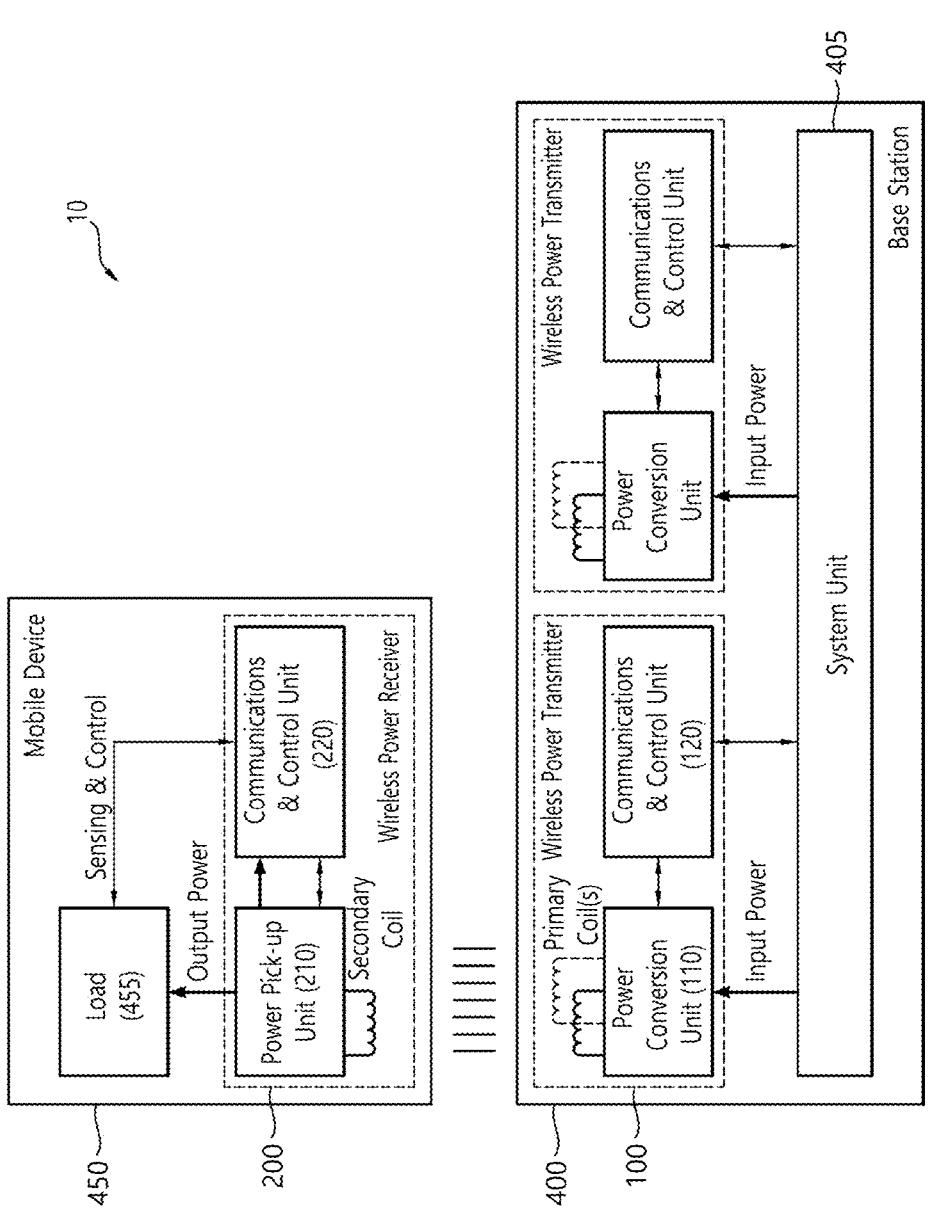
FIG. 4 is a block diagram of a wireless power transmission system according to one embodiment.

FIG. 4 is a block diagram of a wireless power transmission system according to one embodiment.

Referring to FIG. 4, the wireless power transfer system (10) includes a mobile device (450), which wirelessly receives power, and a base station (400), which wirelessly transmits power.

As a device providing induction power or resonance power, the base station (400) may include at least one of a wireless power transmitter (100) and a system unit (405). The wireless power transmitter (100) may transmit induction power or resonance power and may control the transmission. The wireless power transmitter (100) may include a power conversion unit (110) converting electric energy to a power signal by generating a magnetic field through a primary coil (or primary coils), and a communications & control unit (120) controlling the communication and power transfer between the wireless power receiver (200) in order to transfer power at an appropriate (or suitable) level. The system unit (405) may perform input power provisioning, controlling of multiple wireless power transmitters, and other operation controls of the base station (400), such as user interface control.

The primary coil may generate an electromagnetic field by using an alternating current power (or voltage or current). The primary coil is supplied with an alternating current power (or voltage or current) of a specific frequency, which is being outputted from the power conversion unit (110). And, accordingly, the primary coil may generate a magnetic field of the specific frequency. The magnetic field may be generated in a non-radial shape or a radial shape. And, the wireless power receiver (200) receives the generated magnetic field and then generates an electric current. In other words, the primary coil wirelessly transmits power.

In the magnetic induction method, a primary coil and a secondary coil may have randomly appropriate shapes. For example, the primary coil and the secondary coil may correspond to copper wire being wound around a high-permeability formation, such as ferrite or a non-crystalline metal. The primary coil may also be referred to as a transmitting coil, a primary core, a primary winding, a primary loop antenna, and so on. Meanwhile, the secondary coil may also be referred to as a receiving coil, a secondary core, a secondary winding, a secondary loop antenna, a pickup antenna, and so on.

In case of using the magnetic resonance method, the primary coil and the secondary coil may each be provided in the form of a primary resonance antenna and a secondary resonance antenna. The resonance antenna may have a resonance structure including a coil and a capacitor. At this point, the resonance frequency of the resonance antenna may be determined by the inductance of the coil and a capacitance of the capacitor. Herein, the coil may be formed to have a loop shape. And, a core may be placed inside the loop. The core may include a physical core, such as a ferrite core, or an air core.

The energy transmission (or transfer) between the primary resonance antenna and the second resonance antenna may be performed by a resonance phenomenon occurring in the magnetic field. When a near field corresponding to a resonance frequency occurs in a resonance antenna, and in case another resonance antenna exists near the corresponding resonance antenna, the resonance phenomenon refers to a highly efficient energy transfer occurring between the two resonance antennas that are coupled with one another. When a magnetic field corresponding to the resonance frequency is generated between the primary resonance antenna and the secondary resonance antenna, the primary resonance antenna and the secondary resonance antenna resonate with one another. And, accordingly, in a general case, the magnetic field is focused toward the second resonance antenna at a higher efficiency as compared to a case where the magnetic field that is generated from the primary antenna is radiated to a free space. And, therefore, energy may be transferred to the second resonance antenna from the first resonance antenna at a high efficiency. The magnetic induction method may be implemented similarly to the magnetic resonance method. However, in this case, the frequency of the magnetic field is not required to be a resonance frequency. Nevertheless, in the magnetic induction method, the loops configuring the primary coil and the secondary coil are required to match one another, and the distance between the loops should be very close-ranged.

Although it is not shown in the drawing, the wireless power transmitter (100) may further include a communication antenna. The communication antenna may transmit and/or receive a communication signal by using a communication carrier apart from the magnetic field communication. For example, the communication antenna may transmit and/or receive communication signals corresponding to Wi-Fi, Bluetooth, Bluetooth LE, ZigBee, NFC, and so on.

The communications & control unit (120) may transmit and/or receive information to and from the wireless power receiver (200). The communications & control unit (120) may include at least one of an IB communication module and an OB communication module.

The IB communication module may transmit and/or receive information by using a magnetic wave, which uses a specific frequency as its center frequency. For example, the communications & control unit (120) may perform in-band (IB) communication by transmitting communication information on the operating frequency of wireless power transfer through the primary coil or by receiving communication information on the operating frequency through the primary coil. At this point, the communications & control unit (120) may load information in the magnetic wave or may interpret the information that is carried by the magnetic wave by using a modulation scheme, such as binary phase shift keying (BPSK), Frequency Shift Keying (FSK) or amplitude shift keying (ASK), and so on, or a coding scheme, such as Manchester coding or non-return-to-zero level (NZR-L) coding, and so on. By using the above-described IB communication, the communications & control unit (120) may transmit and/or receive information to distances of up to several meters at a data transmission rate of several kbps.

The OB communication module may also perform out-of-band communication through a communication antenna. For example, the communications & control unit (120) may be provided to a near field communication module. Examples of the near field communication module may include communication modules, such as Wi-Fi, Bluetooth, Bluetooth LE, ZigBee, NFC, and so on.

The communications & control unit (120) may control the overall operations of the wireless power transmitter (100). The communications & control unit (120) may perform calculation and processing of diverse information and may also control each configuration element of the wireless power transmitter (100).

The communications & control unit (120) may be implemented in a computer or a similar device as hardware, software, or a combination of the same. When implemented in the form of hardware, the communications & control unit (120) may be provided as an electronic circuit performing control functions by processing electrical signals. And, when implemented in the form of software, the communications & control unit (120) may be provided as a program that operates the communications & control unit (120).

By controlling the operating point, the communications & control unit (120) may control the transmitted power. The operating point that is being controlled may correspond to a combination of a frequency (or phase), a duty cycle, a duty ratio, and a voltage amplitude. The communications & control unit (120) may control the transmitted power by adjusting any one of the frequency (or phase), the duty cycle, the duty ratio, and the voltage amplitude. Additionally, the wireless power transmitter (100) may supply a consistent level of power, and the wireless power receiver (200) may control the level of received power by controlling the resonance frequency.

Meanwhile, in the WPC system, the wireless power transmitter 100 may be classified, for example, in terms of power transmission amount. At this time, the wireless power transmitter 100 supporting a wireless power transmission amount of up to 5 W (i.e., the wireless power transmitter 100 supporting the BPP protocol) can be classified into, for example, type A wireless power transmitter 100 and type B wireless power transmitter 100, the wireless power transmitter 100 supporting a wireless power transmission amount of up to 15 W (i.e., the wireless power transmitter 100 supporting the EPP protocol) can be classified into, for example, type MP-A (MP-A) wireless power transmitter 100 and type MP-B (type MP-B) wireless power transmitter 100.

Type A and Type MP A Wireless Power Transmitters (100)

Type A and Type MP A wireless power transmitters 100 may have one or more primary coils. Type A and Type MP A wireless power transmitters 100 activate a single primary coil at a time, so a single primary cell matching the activated primary coil can be used.

Type B and Type MP B Wireless Power Transmitter (100)

Type B and Type MP B power transmitters may have a primary coil array. And Type B and Type MP B power transmitters can enable free positioning. To this end, Type B and Type MP B power transmitters can activate one or more primary coils in the array to realize primary cells at different locations on the interface surface.

The mobile device (450) includes a wireless power receiver (200) receiving wireless power through a secondary coil, and a load (455) receiving and storing the power that is received by the wireless power receiver (200) and supplying the received power to the device.

The wireless power receiver (200) may include a power pick-up unit (210) and a communications & control unit (220). The power pick-up unit (210) may receive wireless power through the secondary coil and may convert the received wireless power to electric energy. The power pick-up unit (210) rectifies the alternating current (AC) signal, which is received through the secondary coil, and converts the rectified signal to a direct current (DC) signal. The communications & control unit (220) may control the transmission and reception of the wireless power (transfer and reception of power).

The secondary coil may receive wireless power that is being transmitted from the wireless power transmitter (100). The secondary coil may receive power by using the magnetic field that is generated in the primary coil. Herein, in case the specific frequency corresponds a resonance frequency, magnetic resonance may occur between the primary coil and the secondary coil, thereby allowing power to be transferred with greater efficiency.

Meanwhile, although it is not shown in FIG. 4, the communications & control unit (220) may further include a communication antenna. The communication antenna may transmit and/or receive a communication signal by using a communication carrier apart from the magnetic field communication. For example, the communication antenna may transmit and/or receive communication signals corresponding to Wi-Fi, Bluetooth, Bluetooth LE, ZigBee, NFC, and so on.

The communications & control unit (220) may transmit and/or receive information to and from the wireless power transmitter (100). The communications & control unit (220) may include at least one of an IB communication module and an OB communication module.

The IB communication module may transmit and/or receive information by using a magnetic wave, which uses a specific frequency as its center frequency. For example, the communications & control unit (220) may perform IB communication by loading information in the magnetic wave and by transmitting the information through the secondary coil or by receiving a magnetic wave carrying information through the secondary coil. At this point, the communications & control unit (120) may load information in the magnetic wave or may interpret the information that is carried by the magnetic wave by using a modulation scheme, such as binary phase shift keying (BPSK), Frequency Shift Keying (FSK) or amplitude shift keying (ASK), and so on, or a coding scheme, such as Manchester coding or non-return-to-zero level (NZR-L) coding, and so on. By using the above-described IB communication, the communications & control unit (220) may transmit and/or receive information to distances of up to several meters at a data transmission rate of several kbps.

The OB communication module may also perform out-of-band communication through a communication antenna. For example, the communications & control unit (220) may be provided to a near field communication module.

Examples of the near field communication module may include communication modules, such as Wi-Fi, Bluetooth, Bluetooth LE, ZigBee, NFC, and so on.

The communications & control unit (220) may control the overall operations of the wireless power receiver (200). The communications & control unit (220) may perform calculation and processing of diverse information and may also control each configuration element of the wireless power receiver (200).

The communications & control unit (220) may be implemented in a computer or a similar device as hardware, software, or a combination of the same. When implemented in the form of hardware, the communications & control unit (220) may be provided as an electronic circuit performing control functions by processing electrical signals. And, when implemented in the form of software, the communications & control unit (220) may be provided as a program that operates the communications & control unit (220).

Figure 5:
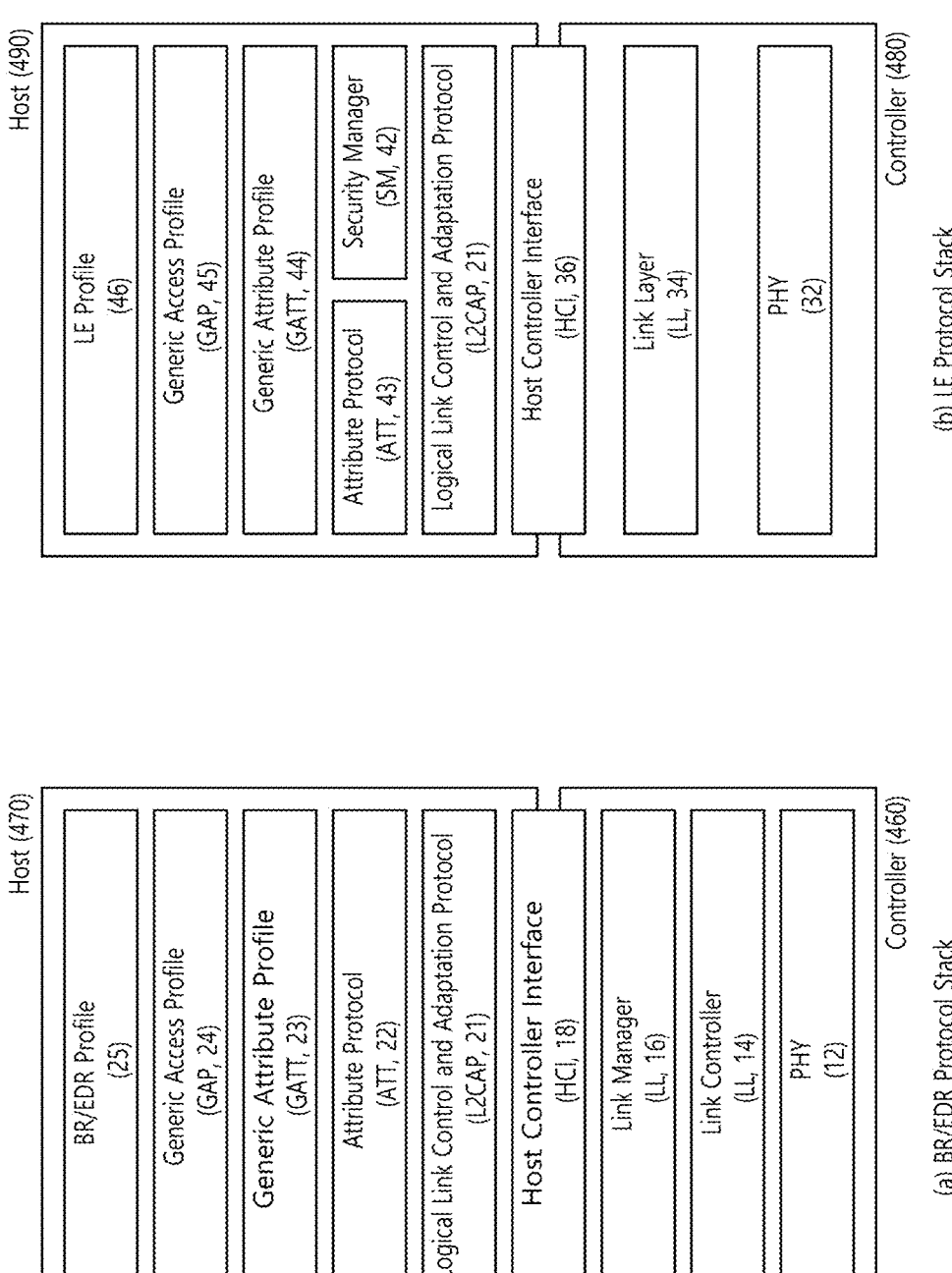
FIG. 5 is a diagram illustrating an example of a Bluetooth communication architecture to which an embodiment according to the present disclosure may be applied.

When the communication/control circuit 120 and the communication/control circuit 220 are Bluetooth or Bluetooth LE as an OB communication module or a short-range communication module, the communication/control circuit 120 and the communication/control circuit 220 may each be implemented and operated with a communication architecture as shown in FIG. 5.

FIG. 5 is a diagram illustrating an example of a Bluetooth communication architecture to which an embodiment according to the present disclosure may be applied.

Referring to FIG. 5, (a) of FIG. 5 shows an example of a protocol stack of Bluetooth basic rate (BR)/enhanced data rate (EDR) supporting GATT, and (b) shows an example of Bluetooth low energy (BLE) protocol stack.

Specifically, as shown in (a) of FIG. 5, the Bluetooth BR/EDR protocol stack may include an upper control stack 460 and a lower host stack 470 based on a host controller interface (HCI) 18.

The host stack (or host module) 470 refers to hardware for transmitting or receiving a Bluetooth packet to or from a wireless transmission/reception module which receives a Bluetooth signal of 2.4 GHz, and the controller stack 460 is connected to the Bluetooth module to control the Bluetooth module and perform an operation.

The host stack 470 may include a BR/EDR PHY layer 12, a BR/EDR baseband layer 14, and a link manager layer 16.

The BR/EDR PHY layer 12 is a layer that transmits and receives a 2.4 GHz radio signal, and in the case of using Gaussian frequency shift keying (GFSK) modulation, the BR/EDR PHY layer 12 may transmit data by hopping 79 RF channels.

The BR/EDR baseband layer 14 serves to transmit a digital signal, selects a channel sequence for hopping 1400 times per second, and transmits a time slot with a length of 625 us for each channel.

The link manager layer 16 controls an overall operation (link setup, control, security) of Bluetooth connection by utilizing a link manager protocol (LMP).

The link manager layer 16 may perform the following functions.

Performs ACL/SCO logical transport, logical link setup, and control.

Detach: It interrupts connection and informs a counterpart device about a reason for the interruption.

Performs power control and role switch.

Performs security (authentication, pairing, encryption) function.

The host controller interface layer 18 provides an interface between a host module and a controller module so that a host provides commands and data to the controller and the controller provides events and data to the host.

The host stack (or host module, 470) includes a logical link control and adaptation protocol (L2CAP) 21, an attribute protocol 22, a generic attribute profile (GATT) 23, a generic access profile (GAP) 24, and a BR/EDR profile 25.

The logical link control and adaptation protocol (L2CAP) 21 may provide one bidirectional channel for transmitting data to a specific protocol or profile.

The L2CAP 21 may multiplex various protocols, profiles, etc., provided from upper Bluetooth.

L2CAP of Bluetooth BR/EDR uses dynamic channels, supports protocol service multiplexer, retransmission, streaming mode, and provides segmentation and reassembly, per-channel flow control, and error control.

The generic attribute profile (GATT) 23 may be operable as a protocol that describes how the attribute protocol 22 is used when services are configured. For example, the generic attribute profile 23 may be operable to specify how ATT attributes are grouped together into services and may be operable to describe features associated with services.

Accordingly, the generic attribute profile 23 and the attribute protocols (ATT) 22 may use features to describe device's state and services, how features are related to each other, and how they are used.

The attribute protocol 22 and the BR/EDR profile 25 define a service (profile) using Bluetooth BR/EDR and an application protocol for exchanging these data, and the generic access profile (GAP) 24 defines device discovery, connectivity, and security level.

As shown in (b) of FIG. 5, the Bluetooth LE protocol stack includes a controller stack 480 operable to process a wireless device interface important in timing and a host stack 490 operable to process high level data.

First, the controller stack 480 may be implemented using a communication module that may include a Bluetooth wireless device, for example, a processor module that may include a processing device such as a microprocessor.

The host stack 490 may be implemented as a part of an OS running on a processor module or as an instantiation of a package on the OS.

In some cases, the controller stack and the host stack may be run or executed on the same processing device in a processor module.

The controller stack 480 includes a physical layer (PHY) 32, a link layer 34, and a host controller interface 36.

The physical layer (PHY, wireless transmission/reception module) 32 is a layer that transmits and receives a 2.4 GHz radio signal and uses Gaussian frequency shift keying (GFSK) modulation and a frequency hopping scheme including 40 RF channels.

The link layer 34, which serves to transmit or receive Bluetooth packets, creates connections between devices after performing advertising and scanning functions using 3 advertising channels and provides a function of exchanging data packets of up to 257 bytes through 37 data channels.

The host stack includes a generic access profile (GAP) 45, a logical link control and adaptation protocol (L2CAP, 41), a security manager (SM) 42, and an attribute protocol (ATT) 43, a generic attribute profile (GATT) 44, a generic access profile 45, and an LE profile 46. However, the host stack 490 is not limited thereto and may include various protocols and profiles.

The host stack multiplexes various protocols, profiles, etc., provided from upper Bluetooth using L2CAP.

First, the logical link control and adaptation protocol (L2CAP) 41 may provide one bidirectional channel for transmitting data to a specific protocol or profile.

The L2CAP 41 may be operable to multiplex data between higher layer protocols, segment and reassemble packages, and manage multicast data transmission.

In Bluetooth LE, three fixed channels (one for signaling CH, one for security manager, and one for attribute protocol) are basically used. Also, a dynamic channel may be used as needed.

Meanwhile, a basic channel/enhanced data rate (BR/EDR) uses a dynamic channel and supports protocol service multiplexer, retransmission, streaming mode, and the like.

The security manager (SM) 42 is a protocol for authenticating devices and providing key distribution.

The attribute protocol (ATT) 43 defines a rule for accessing data of a counterpart device in a server-client structure. The ATT has the following 6 message types (request, response, command, notification, indication, confirmation).

①  Request and Response message: A request message is a message for requesting specific information from the client device to the server device, and the response message is a response message to the request message, which is a message transmitted from the server device to the client device.

②  Command message: It is a message transmitted from the client device to the server device in order to indicate a command of a specific operation. The server device does not transmit a response with respect to the command message to the client device.

③  Notification message: It is a message transmitted from the server device to the client device in order to notify an event, or the like. The client device does not transmit a confirmation message with respect to the notification message to the server device.

④  Indication and confirmation message: It is a message transmitted from the server device to the client device in order to notify an event, or the like. Unlike the notification message, the client device transmits a confirmation message regarding the indication message to the server device.

In the present disclosure, when the GATT profile using the attribute protocol (ATT) 43 requests long data, a value regarding a data length is transmitted to allow a client to clearly know the data length, and a characteristic value may be received from a server by using a universal unique identifier (UUID).

The generic access profile (GAP) 45, a layer newly implemented for the Bluetooth LE technology, is used to select a role for communication between Bluetooth LED devices and to control how a multi-profile operation takes place.

Also, the generic access profile (GAP) 45 is mainly used for device discovery, connection generation, and security procedure part, defines a scheme for providing information to a user, and defines types of attributes as follows.

①  Service: It defines a basic operation of a device by a combination of behaviors related to data ②  Include: It defines a relationship between services ③  Characteristics: It is a data value used in a server ④  Behavior: It is a format that may be read by a computer defined by a UUID (value type).

The LE profile 46, including profiles dependent upon the GATT, is mainly applied to a Bluetooth LE device. The LE profile 46 may include, for example, Battery, Time, FindMe, Proximity, Time, Object Delivery Service, and the like, and details of the GATT-based profiles are as follows.

①  Battery: Battery information exchanging method

②  Time: Time information exchanging method

③  FindMe: Provision of alarm service according to distance

④  Proximity: Battery information exchanging method

⑤  Time: Time information exchanging method

The generic attribute profile (GATT) 44 may operate as a protocol describing how the attribute protocol (ATT) 43 is used when services are configured. For example, the GATT 44 may operate to define how ATT attributes are grouped together with services and operate to describe features associated with services.

Thus, the GATT 44 and the ATT 43 may use features in order to describe status and services of a device and describe how the features are related and used.

Hereinafter, procedures of the Bluetooth low energy (BLE) technology will be briefly described.

The BLE procedure may be classified as a device filtering procedure, an advertising procedure, a scanning procedure, a discovering procedure, and a connecting procedure.

Device Filtering Procedure

The device filtering procedure is a method for reducing the number of devices performing a response with respect to a request, indication, notification, and the like, in the controller stack.

When requests are received from all the devices, it is not necessary to respond thereto, and thus, the controller stack may perform control to reduce the number of transmitted requests to reduce power consumption.

An advertising device or scanning device may perform the device filtering procedure to limit devices for receiving an advertising packet, a scan request or a connection request.

Here, the advertising device refers to a device transmitting an advertising event, that is, a device performing an advertisement and is also termed an advertiser.

The scanning device refers to a device performing scanning, that is, a device transmitting a scan request.

In the BLE, in a case in which the scanning device receives some advertising packets from the advertising device, the scanning device should transmit a scan request to the advertising device.

However, in a case in which a device filtering procedure is used so a scan request transmission is not required, the scanning device may disregard the advertising packets transmitted from the advertising device.

Even in a connection request process, the device filtering procedure may be used. In a case in which device filtering is used in the connection request process, it is not necessary to transmit a response with respect to the connection request by disregarding the connection request.

Advertising Procedure

The advertising device performs an advertising procedure to perform undirected broadcast to devices within a region.

Here, the undirected broadcast is advertising toward all the devices, rather than broadcast toward a specific device, and all the devices may scan advertising to make an supplemental information request or a connection request.

In contrast, directed advertising may make an supplemental information request or a connection request by scanning advertising for only a device designated as a reception device.

The advertising procedure is used to establish a Bluetooth connection with an initiating device nearby.

Or, the advertising procedure may be used to provide periodical broadcast of user data to scanning devices performing listening in an advertising channel.

In the advertising procedure, all the advertisements (or advertising events) are broadcast through an advertisement physical channel.

The advertising devices may receive scan requests from listening devices performing listening to obtain additional user data from advertising devices. The advertising devices transmit responses with respect to the scan requests to the devices which have transmitted the scan requests, through the same advertising physical channels as the advertising physical channels in which the scan requests have been received.

Broadcast user data sent as part of advertising packets are dynamic data, while the scan response data is generally static data.

The advertisement device may receive a connection request from an initiating device on an advertising (broadcast) physical channel. If the advertising device has used a connectable advertising event and the initiating device has not been filtered according to the device filtering procedure, the advertising device may stop advertising and enter a connected mode. The advertising device may start advertising after the connected mode.

Scanning Procedure

A device performing scanning, that is, a scanning device performs a scanning procedure to listen to undirected broadcasting of user data from advertising devices using an advertising physical channel.

The scanning device transmits a scan request to an advertising device through an advertising physical channel in order to request additional data from the advertising device. The advertising device transmits a scan response as a response with respect to the scan request, by including additional user data which has requested by the scanning device through an advertising physical channel.

The scanning procedure may be used while being connected to other BLE device in the BLE piconet.

If the scanning device is in an initiator mode in which the scanning device may receive an advertising event and initiates a connection request. The scanning device may transmit a connection request to the advertising device through the advertising physical channel to start a Bluetooth connection with the advertising device.

When the scanning device transmits a connection request to the advertising device, the scanning device stops the initiator mode scanning for additional broadcast and enters the connected mode.

Discovering Procedure

Devices available for Bluetooth communication (hereinafter, referred to as "Bluetooth devices") perform an advertising procedure and a scanning procedure in order to discover devices located nearby or in order to be discovered by other devices within a given area.

The discovering procedure is performed asymmetrically. A Bluetooth device intending to discover other device nearby is termed a discovering device, and listens to discover devices advertising an advertising event that may be scanned. A Bluetooth device which may be discovered by other device and available to be used is termed a discoverable device and positively broadcasts an advertising event such that it may be scanned by other device through an advertising (broadcast) physical channel.

Both the discovering device and the discoverable device may have already been connected with other Bluetooth devices in a piconet.

Connecting Procedure

A connecting procedure is asymmetrical, and requests that, while a specific Bluetooth device is performing an advertising procedure, another Bluetooth device should perform a scanning procedure.

That is, an advertising procedure may be aimed, and as a result, only one device may response to the advertising. After a connectable advertising event is received from an advertising device, a connecting request may be transmitted to the advertising device through an advertising (broadcast) physical channel to initiate connection.

Hereinafter, operational states, that is, an advertising state, a scanning state, an initiating state, and a connection state, in the BLE technology will be briefly described.

Advertising State

A link layer (LL) enters an advertising state according to an instruction from a host (stack). In a case in which the LL is in the advertising state, the LL transmits an advertising packet data unit (PDU) in advertising events.

Each of the advertising events include at least one advertising PDU, and the advertising PDU is transmitted through an advertising channel index in use. After the advertising PDU is transmitted through an advertising channel index in use, the advertising event may be terminated, or in a case in which the advertising device may need to secure a space for performing other function, the advertising event may be terminated earlier.

Scanning State

The LL enters the scanning state according to an instruction from the host (stack). In the scanning state, the LL listens to advertising channel indices.

The scanning state includes two types: passive scanning and active scanning. Each of the scanning types is determined by the host.

Time for performing scanning or an advertising channel index are not defined.

During the scanning state, the LL listens to an advertising channel index in a scan window duration. A scan interval is defined as an interval between start points of two continuous scan windows.

When there is no collision in scheduling, the LL should listen in order to complete all the scan intervals of the scan window as instructed by the host. In each scan window, the LL should scan other advertising channel index. The LL uses every available advertising channel index.

In the passive scanning, the LL only receives packets and cannot transmit any packet.

In the active scanning, the LL performs listening in order to be relied on an advertising PDU type for requesting advertising PDUs and advertising device-related supplemental information from the advertising device.

Initiating State

The LL enters the initiating state according to an instruction from the host (stack).

When the LL is in the initiating state, the LL performs listening on advertising channel indices.

During the initiating state, the LL listens to an advertising channel index during the scan window interval.

Connection State

When the device performing a connection state, that is, when the initiating device transmits a CONNECT_REQ PDU to the advertising device or when the advertising device receives a CONNECT_REQ PDU from the initiating device, the LL enters a connection state.

It is considered that a connection is generated after the LL enters the connection state. However, it is not necessary to consider that the connection should be established at a point in time at which the LL enters the connection state. The only difference between a newly generated connection and an already established connection is a LL connection supervision timeout value.

When two devices are connected, the two devices play different roles.

An LL serving as a master is termed a master, and an LL serving as a slave is termed a slave. The master adjusts a timing of a connecting event, and the connecting event refers to a point in time at which the master and the slave are synchronized.

Hereinafter, packets defined in an Bluetooth interface will be briefly described. BLE devices use packets defined as follows.

Packet Format

The LL has only one packet format used for both an advertising channel packet and a data channel packet.

Each packet includes four fields of a preamble, an access address, a PDU, and a CRC.

When one packet is transmitted in an advertising physical channel, the PDU may be an advertising channel PDU, and when one packet is transmitted in a data physical channel, the PDU may be a data channel PDU.

Advertising Channel PDU

An advertising channel PDU has a 16-bit header and payload having various sizes.

A PDU type field of the advertising channel PDU included in the heater indicates PDU types defined in Table 1 below.

TABLE 1

| PDU Type | Packet Name |
| --- | --- |
| 0000 | ADV_IND |
| 0001 | ADV_DIRECT_IND |
| 0010 | ADV_NONCONN_IND |
| 0011 | SCAN_REQ |
| 0100 | SCAN_RSP |
| 0101 | CONNECT_REQ |
| 0110 | ADV_SCAN_IND |
| 0111-1111 | Reserved |

Advertising PDU

The following advertising channel PDU types are termed advertising PDUs and used in a specific event.

ADV_IND: Connectable undirected advertising event

ADV_DIRECT_IND: Connectable directed advertising event

ADV_NONCONN_IND: Unconnectable undirected advertising event

ADV_SCAN_IND: Scannable undirected advertising event

The PDUs are transmitted from the LL in an advertising state, and received by the LL in a scanning state or in an initiating state.

Scanning PDU

The following advertising channel DPU types are termed scanning PDUs and are used in a state described hereinafter.

SCAN_REQ: Transmitted by the LL in a scanning state and received by the LL in an advertising state.

SCAN_RSP: Transmitted by the LL in the advertising state and received by the LL in the scanning state.

Initiating PDU

The following advertising channel PDU type is termed an initiating PDU.

CONNECT_REQ: Transmitted by the LL in the initiating state and received by the LL in the advertising state.

Data Channel PDU

The data channel PDU may include a message integrity check (MIC) field having a 16-bit header and payload having various sizes.

The procedures, states, and packet formats in the BLE technology discussed above may be applied to perform the methods proposed in the present disclosure.

Referring to FIG. 4, the load (455) may correspond to a battery. The battery may store energy by using the power that is being outputted from the power pick-up unit (210). Meanwhile, the battery is not mandatorily required to be included in the mobile device (450). For example, the battery may be provided as a detachable external feature. As another example, the wireless power receiver may include an operating means that may execute diverse functions of the electronic device instead of the battery.

As shown in the drawing, although the mobile device (450) is illustrated to be included in the wireless power receiver (200) and the base station (400) is illustrated to be included in the wireless power transmitter (100), in a broader meaning, the wireless power receiver (200) may be identified (or regarded) as the mobile device (450), and the wireless power transmitter (100) may be identified (or regarded) as the base station (400).

Figure 6:
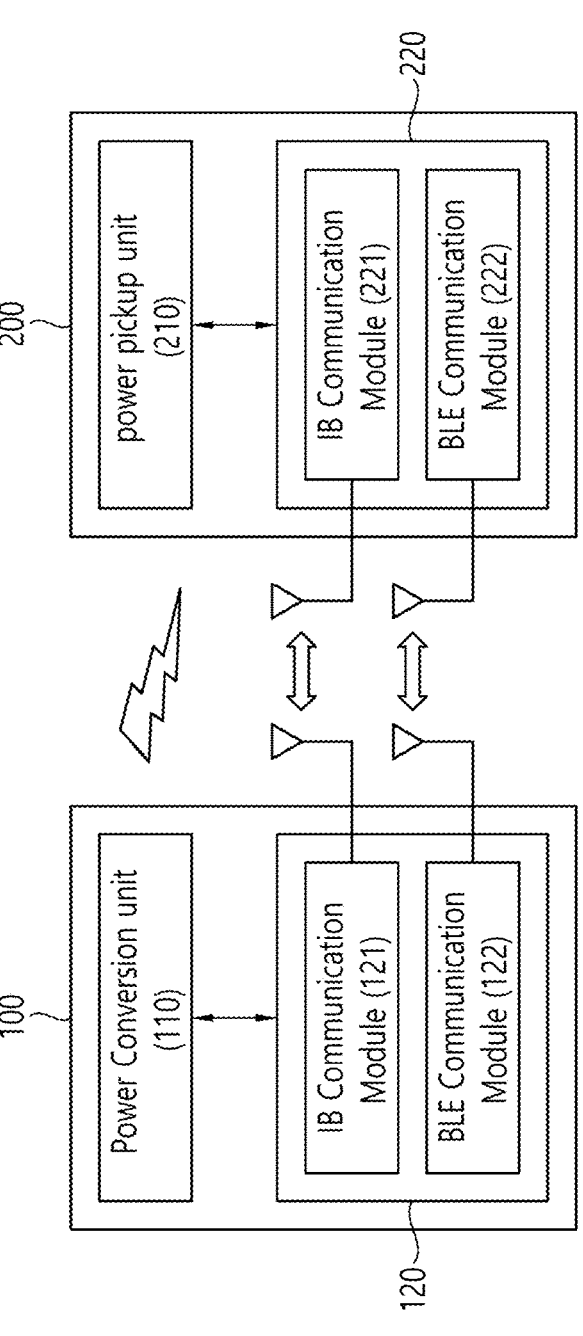
FIG. 6 is a block diagram illustrating a wireless power transfer system using BLE communication according to an example.

When the communication/control circuit 120 and the communication/control circuit 220 include Bluetooth or Bluetooth LE as an OB communication module or a short-range communication module in addition to the IB communication module, the wireless power transmitter 100 including the communication/control circuit 120 and the wireless power receiver 200 including the communication/control circuit 220 may be represented by a simplified block diagram as shown in FIG. 6.

FIG. 6 is a block diagram illustrating a wireless power transfer system using BLE communication according to an example.

Referring to FIG. 6, the wireless power transmitter 100 includes a power conversion circuit 110 and a communication/control circuit 120. The communication/control circuit 120 includes an in-band communication module 121 and a BLE communication module 122.

Meanwhile, the wireless power receiver 200 includes a power pickup circuit 210 and a communication/control circuit 220. The communication/control circuit 220 includes an in-band communication module 221 and a BLE communication module 222.

In one aspect, the BLE communication modules 122 and 222 perform the architecture and operation according to FIG. 5. For example, the BLE communication modules 122 and 222 may be used to establish a connection between the wireless power transmitter 100 and the wireless power receiver 200 and exchange control information and packets necessary for wireless power transfer.

In another aspect, the communication/control circuit 120 may be configured to operate a profile for wireless charging. Here, the profile for wireless charging may be GATT using BLE transmission.

Figure 7:
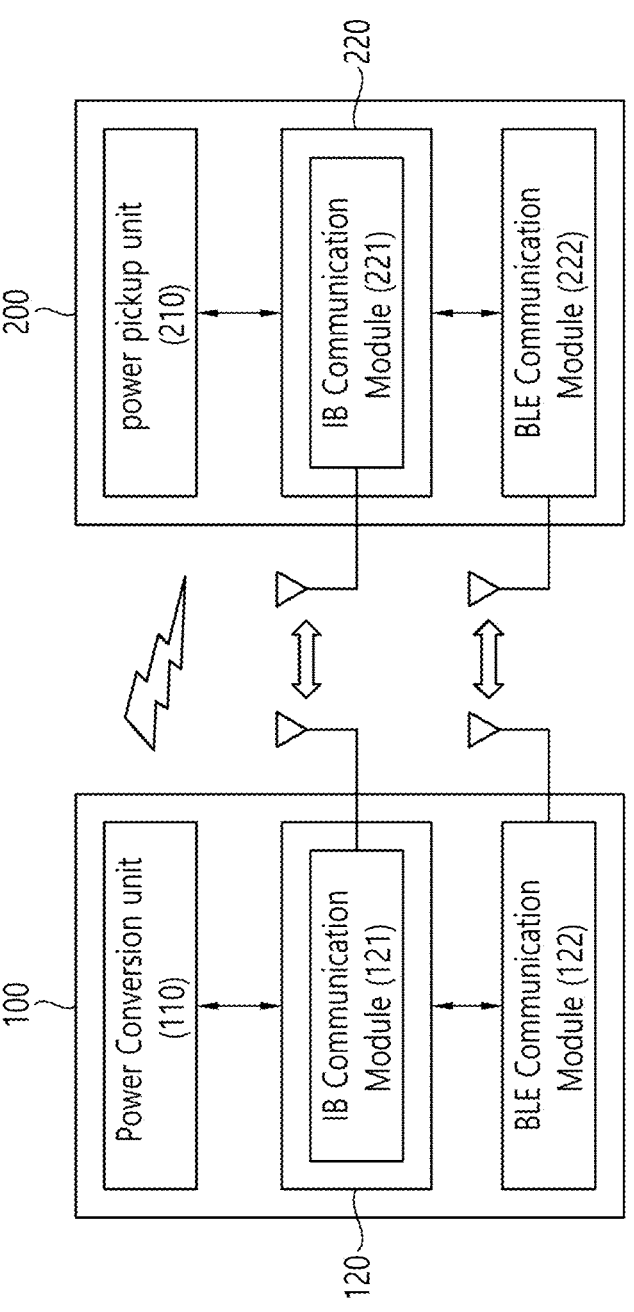
FIG. 7 is a block diagram illustrating a wireless power transfer system using BLE communication according to another example.

FIG. 7 is a block diagram illustrating a wireless power transfer system using BLE communication according to another example.

Referring to FIG. 7, the communication/control circuits 120 and 220 respectively include only in-band communication modules 121 and 221, and the BLE communication modules 122 and 222 may be provided to be separated from the communication/control circuits 120 and 220.

Hereinafter, the coil or coil unit includes a coil and at least one device being approximate to the coil, and the coil or coil unit may also be referred to as a coil assembly, a coil cell, or a cell.

Meanwhile, when the user places the wireless power receiver 200 within the operating volume of the wireless power transmitter 100, the wireless power transmitter 100 and the wireless power receiver 200 begin communication for the purpose of configuring and controlling power transmission. At this time, the power signal can provide a carrier for all communications, and the protocol for communication can be composed of several steps. Hereinafter, the communication protocol will be described.

Figure 8:
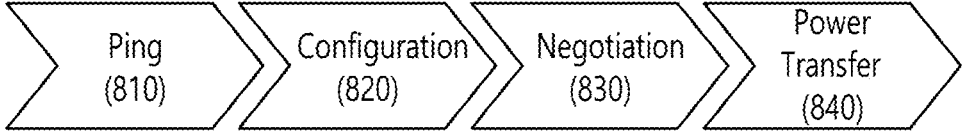
FIG. 8 is a state transition diagram for explaining the wireless power transfer procedure.

FIG. 8 is a state transition diagram for explaining the wireless power transfer procedure.

WPC can define two communication protocols.

Baseline Protocol (or BPP): May refer to an original protocol that supports only one-way communication from the wireless power receiver 200 to the wireless power transmitter 100.

Extended Protocol (or EPP): Supports two-way communication and improved foreign object detection (FOD) functions, and can also support data transport stream functions and authentication options.

Referring to FIG. 8, the power transfer operation between the wireless power transmitter 100 and the wireless power receiver 200 according to an embodiment of the present specification can be largely divided into a ping phase (810), a configuration phase (820), a negotiation phase (830), and a power transfer phase.

Ping Phase (810)

In the ping phase 810, the wireless power transmitter 100 may attempt to establish communication with the wireless power receiver 200. Before attempting to establish communication, measurements may be performed to determine whether there are objects such as bank cards, coins or other metals that may be damaged or heated during power transfer. Here, these measurements can be performed without waking up the wireless power receiver 200.

Here, after obtaining design information from the wireless power receiver 200, the wireless power transmitter 100 may postpone a conclusion about whether the detected metal is a foreign object or a friendly metal to the negotiation phase 830.

Configuration Phase (820)

In the configuration phase 820, the wireless power receiver 200 may send basic identification and configuration data to the wireless power receiver 200. And, both the wireless power transmitter 100 and the wireless power receiver 200 can use this information to create a baseline power transfer contract.

Additionally, the wireless power transmitter 100 and the wireless power receiver 200 may determine whether to continue the baseline protocol or the extended protocol in the configuration phase 820.

Here, the wireless power receiver 200 can use functions such as enhanced FOD, data transport stream, and authentication only when implementing the extended protocol.

Negotiation Phase (830)

In the negotiation phase 830, the wireless power transmitter 100 and the wireless power receiver 200 may establish an extended power transfer contract that includes additional settings and restrictions. Additionally, the wireless power receiver 200 may provide design information to the wireless power transmitter 100. Later, the design information can be used to complete the FOD before transitioning to the power transfer phase 840.

Here, the negotiation phase 830 may correspond to a step that does not exist in the baseline protocol.

Power Transfer Phase (840)

The power transfer phase 840 may be a step in which power is transferred to the load of the wireless power receiver 200.

In the extended protocol, the wireless power transmitter 100 and the wireless power receiver 200 may perform system calibration when this step begins. This stage may occasionally be interrupted to renegotiate elements of the power transfer contract. However, power transfer may continue even during this renegotiation.

Below, as previously explained, each protocol for Ping Phase 810, Configuration Phase 820, Negotiation Phase 830, and Power Transfer Phase 840 will be explained in more detail.

1. Ping Phase (810)

When the ping phase 810 begins, the wireless power transmitter 100 does not yet know whether the wireless power receiver 200 is within the operating volume. In addition, the wireless power transmitter 100 cannot recognize the wireless power receiver 200. For that reason, this system is usually disabled due to lack of power signal.

In this situation, before the wireless power transmitter 100 starts a digital ping to request a response from the wireless power receiver 200, the wireless power transmitter 100 may go through the following steps.

Figure 9:
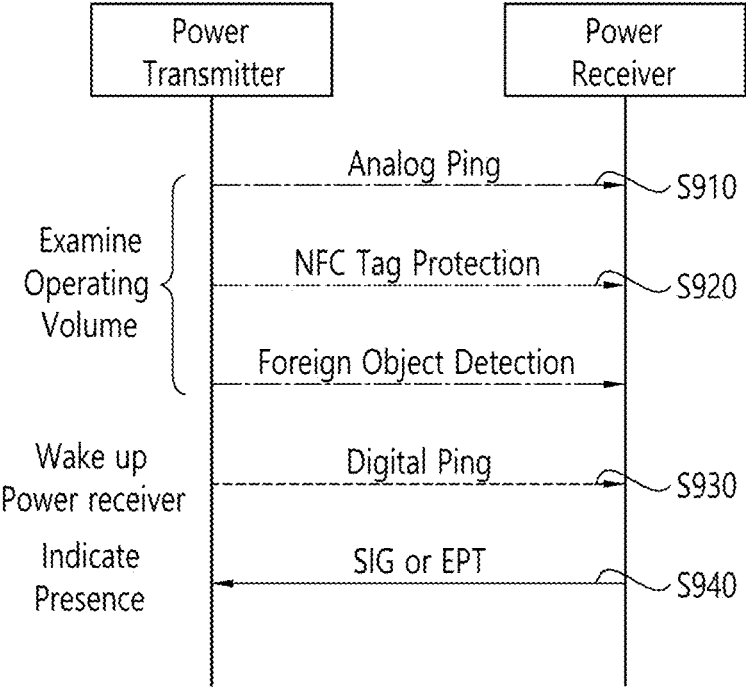
FIG. 9 schematically shows an example of the protocol of the ping phase 810.

FIG. 9 schematically shows an example of the protocol of the ping phase 810.

According to FIG. 9, the wireless power transmitter 100 can perform analog ping (S910). That is, the wireless power transmitter 100 can confirm whether an object exists in the operating volume by transmitting an analog ping. For example, a wireless power transmitter can detect whether an object exists in the operating space based on a change in current in the transmission coil or primary coil.

The wireless power transmitter 100 may apply NFC tag protection (S920). Here, NFC tag protection can be performed through the following procedures.

a) First, it can be confirmed whether one or more of the detected objects include an NFC tag.

b) Afterwards, it can be checked whether the object containing the NFC tag can withstand the power signal without damage.

c) If the wireless power transmitter 100 determines that the NFC tag cannot withstand the power signal, it does not start digital ping and maintains the ping phase, the wireless power transmitter 100 can inform the user of the reason why it cannot proceed.

The wireless power transmitter 100 may perform foreign object detection (S930). That is, the wireless power transmitter 100 can collect information helpful in determining whether there is a foreign object other than the wireless power receiver 200. For this purpose, the wireless power transmitter 100 can use various methods such as a pre-power FOD method.

Meanwhile, in the three steps (S910, S920, and S930) described above, the radio power receiver may not operate.

If the wireless power transmitter 100 performs the above steps and determines that the wireless power receiver 200 is potentially present in the operating volume, the wireless power transmitter 100 may start a digital ping (S940). Here, the digital ping may request a response such as a signal strength (SIG) data packet or an end power transfer (EPT) data packet from the wireless power receiver 200.

Thereafter, the wireless power transmitter 100 may receive the SIG or EPT from the wireless power receiver 200 (S950). Here, the SIG data packet may provide a measure of coupling, and the SIG data packet may include information about signal strength values. Additionally, the EPT data packet may provide a request to stop power transmission and a reason for the request.

If the wireless power transmitter 100 does not receive the above response from the wireless power receiver 200, the wireless power transmitter 100 may repeat the above steps while remaining in the ping phase 810.

2. Configuration Phase (820)

The configuration phase 820 is part of the following protocol.

The wireless power receiver 200 can identify itself to the wireless power transmitter 100.

The wireless power receiver 200 and the wireless power transmitter 100 can establish a baseline power transfer contract.

The wireless power receiver 200 and the wireless power transmitter 100 can determine the protocol variant to be used for power transmission.

In the configuration phase 820, the wireless power transmitter 100 and the wireless power receiver 200 may continue to operate using the digital ping parameter. This may mean that the power and current levels of both the wireless power transmitter 100 and the wireless power receiver 200 change only when the user moves the wireless power receiver 200 from position within the operating volume.

Hereinafter, the protocol in the configuration phase 820 will be described in more detail.

Figures 10, 11:
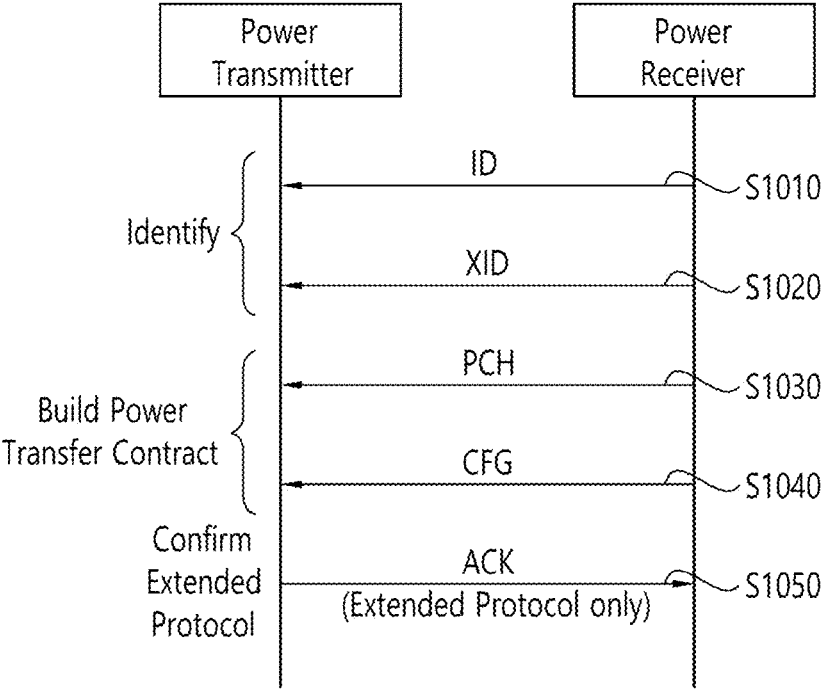
FIG. 10 schematically shows an example of the protocol of the configuration phase 820.
FIG. 11 is a diagram illustrating a message field of a configuration packet (CFG) of a wireless power reception device according to an embodiment.

FIG. 10 schematically shows an example of the protocol of the configuration phase 820.

According to FIG. 10, the wireless power transmitter 100 may receive an identification (ID) from the wireless power receiver 200 (S1010). Alternatively, the wireless power transmitter 100 may also receive an extended identification (XID) from the wireless power receiver 200 (S1020). That is, the wireless power receiver 200 may identify itself using an ID data packet and, optionally, an XID data packet.

The wireless power transmitter 100 may selectively receive a power control hold-off (PCH) data packet from the wireless power receiver 200 (S1030), the wireless power transmitter 100 may receive a CFG data packet from the wireless power receiver 200 (S1040). That is, the wireless power receiver 200 can provide data for use in a power transfer contract using PCH and/or CFG data packets.

Finally, the wireless power transmitter 100 can check the extended protocol if possible (S1050).

Each data packet described above can be summarized as follows.

ID: The ID data packet may be information that identifies the wireless power receiver 200. Here, the ID may include a manufacturer code, basic device identifier, etc. In addition, the ID may also include information that identifies the presence or absence of an XID data packet in the setup phase.

XID: XID data packets may contain additional identification data.

PCH: The PCH data packet may configure the delay between the reception of the CE data packet and the wireless power transmitter 100 starting coil current adjustment.

CFG: CFG data packets can provide basic configuration data.

For example, a CFG data packet can provide all parameters governing power transfer in the baseline protocol. In addition, CFG data packets can provide all FSK communication parameters used in the extended protocol. Additionally, CFG data packets may provide additional functions of the wireless power receiver 200.

FIG. 11 is a diagram illustrating a message field of a configuration packet (CFG) of a wireless power reception device according to an embodiment.

According to FIG. 11, the configuration packet (CFG) according to one embodiment may have a header value of 0x51, and the message field of the configuration packet (CFG) may include a 1-bit authentication (AI) flag and a 1-bit outband (OB) flag.

The authentication flag (AI) indicates whether the wireless power receiving device supports the authentication function. For example, if the value of the authentication flag (AI) is '1', it indicates that the wireless power receiving device supports the authentication function or can operate as an authentication initiator, if the value of the authentication flag (AI) is '0', it may indicate that the wireless power receiving device does not support the authentication function or cannot operate as an authentication initiator.

The out-of-band (OB) flag indicates whether the wireless power receiving device supports out-of-band communication. For example, if the value of the out-of-band (OB) flag is '1', the wireless power receiver indicates out-of-band communication, if the value of the outband (OB) flag is '0', it may indicate that the wireless power receiving device does not support outband communication.

Provision of the ID and/or XID described above is for identification purposes. Additionally, the provision of PCH and/or CFG is for the construction of a power transfer contract.

3. Negotiation Phase (830)

The negotiation phase 830 is part of an extended protocol that allows the wireless power transmitter 100 and the wireless power receiver 200 to change the power transfer contract. There are two types of this stage.

Negotiation phase (830): The negotiation phase (830) directly follows the configuration phase (820) and serves to create an initial extended power transfer contract. In addition, the negotiation phase 830 also serves to complete the pre-power FOD function. Here, the length of the negotiation phase is not limited.

Renegotiation phase: The renegotiation phase can interrupt the power transfer phase (840) multiple times and generally serves to adjust a single element of the power transfer contract. In addition, FOD/qf, FOD/rf, and SRQ/rpr data packets may not be used in the renegotiation phase. Constraints on CE data packets in the power transfer phase 840 limit the length of the renegotiation phase.

In the negotiation or renegotiation phase, the power transfer contract related to the reception/transmission of wireless power between a wireless power receiving device and a wireless power transmitting device is expanded or changed, or a renewal of the power transfer contract is made that adjusts at least some of the elements of the power transfer contract, or information may be exchanged to establish out-of-band communication.

Figure 12:
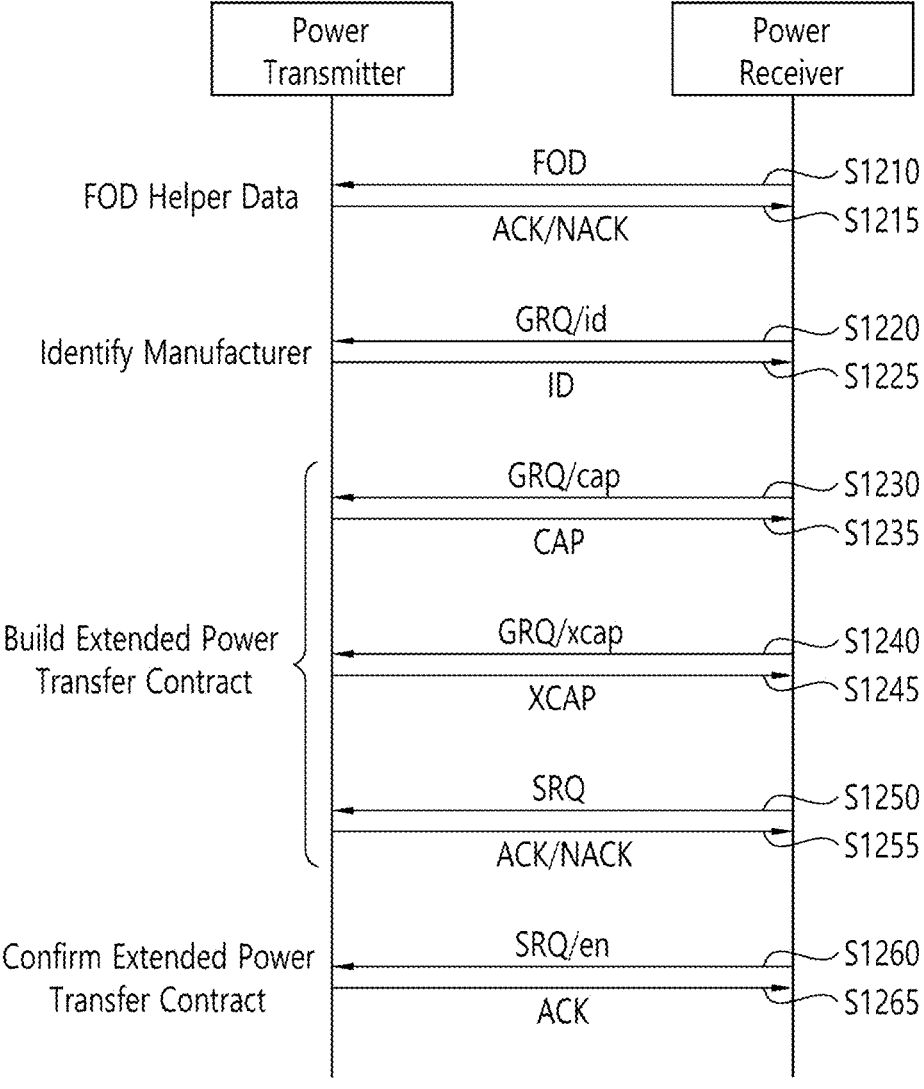
FIG. 12 is a flowchart schematically illustrating a protocol of a negotiation stage or a renegotiation stage according to an embodiment.

FIG. 12 is a flowchart schematically illustrating a protocol of a negotiation stage or a renegotiation stage according to an embodiment.

Referring to FIG. 12, the wireless power transmitter 100 may receive a FOD status data packet (e.g. FOD) from the wireless power receiver 200 (S1210). Here, the wireless power receiver 200 can use the FOD status data packet to inform the wireless power transmitter 100 of the effect its presence has on selected properties of the reference wireless power transmitter 100. And, the wireless power transmitter 100 can configure the FOD function using this information.

The wireless power transmitter 100 may transmit an ACK/NAK for the FOD status data packet to the wireless power receiver 200 (S1215).

Meanwhile, the wireless power receiver 200 may receive an identification data packet (ID), a capabilities data packet (CAP), and an extended CAP (XCAP) of the wireless power transmitter 100 using a general request data packet (GRQ).

The general request packet (GRQ) may have a header value of 0x07 and may include a 1-byte message field. The message field of the general request packet (GRQ) may include a header value of a data packet that the wireless power receiver 200 requests from the wireless power transmitter 100 using the GRQ packet.

For example, in the negotiation phase or renegotiation phase, the wireless power receiver 200 may transmit a GRQ packet (GRQ/id) requesting an ID packet of the wireless power transmitter 100 to the wireless power transmitter 100 (S1220).

The wireless power transmitter 100 that has received the GRQ/id may transmit an ID packet to the wireless power receiver 200 (S1225). The ID packet of the wireless power transmitter 100 includes information about the 'Manufacturer Code'. The ID packet containing information about the 'Manufacturer Code' allows the manufacturer of the wireless power transmitter 100 to be identified.

Or, in the negotiation phase or re-negotiation phase, the wireless power receiver 200 may transmit a GRQ packet (GRQ/cap) requesting a capability packet (CAP) of the wireless power transmitter 100 to the wireless power transmitter 100 (S1230). The message field of GRQ/cap may include the header value (0x31) of the capability packet (CAP).

The wireless power transmitter 100 that has received the GRQ/cap may transmit a capability packet (CAP) to the wireless power receiver 200 (S1235).

Or, in the negotiation phase or re-negotiation phase, the wireless power receiver 200 may transmit a GRQ packet (GRQ/xcap) requesting a capability packet (CAP) of the wireless power transmitter 100 to the wireless power transmitter 100 (S1240). The message field of GRQ/xcap may include the header value (0x32) of the performance packet (XCAP).

The wireless power transmitter 100 that has received GRQ/xcap may transmit a capability packet (XCAP) to the wireless power receiver 200 (S1245).

Figures 13, 14:
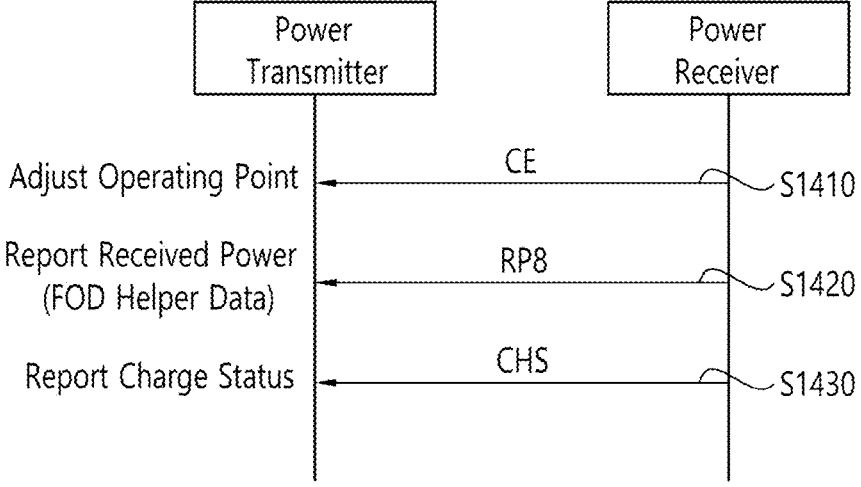
FIG. 13 is a diagram illustrating a message field of a capability packet (CAP) of a wireless power transmission device according to an embodiment.
FIG. 14 schematically shows a flow chart of the data flow for the power transfer phase 840 in the baseline protocol.

FIG. 13 is a diagram illustrating a message field of a capability packet (CAP) of a wireless power transmission device according to an embodiment.

A capability packet (CAP) according to one embodiment may have a header value of 0x31 and, referring to FIG. 13, may include a 3-byte message field.

Referring to FIG. 13, the message field of the capability packet (CAP) may include a 1-bit authentication (AR) flag and a 1-bit outband (OB) flag.

The authentication flag (AR) indicates whether the wireless power transmitter 100 supports the authentication function. For example, if the value of the authentication flag (AR) is '1', it indicates that the wireless power transmitter 100 supports an authentication function or can operate as an authentication responder, if the value of the authentication flag (AR) is '0', it may indicate that the wireless power transmitter 100 does not support the authentication function or cannot operate as an authentication responder.

The outband (OB) flag indicates whether the wireless power transmitter 100 supports outband communication. For example, if the value of the outband (OB) flag is '1', the wireless power transmitter 100 instructs outband communication, if the value of the out-of-band (OB) flag is '0', this may indicate that the wireless power transmitter 100 does not support out-of-band communication.

In the negotiation phase, the wireless power receiver 200 can receive the capability packet (CAP) of the wireless power transmitter 100 and check whether the wireless power transmitter 100 supports the authentication function and whether out-band communication is supported.

Returning to FIG. 12, the wireless power receiver 200 can update the elements of the power transfer contract (Power Transfer Contract) related to the power to be provided in the power transfer phase using at least one specific request packet (SRQ, Specific Request data packet) in the negotiation phase or re-negotiation phase (S1250), ACK/NAK for this can be received (S1255).

Meanwhile, in order to confirm the extended power transfer contract and end the negotiation phase, the wireless power receiver 200 transmits SRQ/en to the wireless power transmitter 100 (S1260), it can receive ACK from the wireless power transmitter 100 (S1265).

4. Power Transfer Phase (840)

The power transfer phase 840 is a part of the protocol in which actual power is transferred to the load of the wireless power receiver 200. Here, power transfer may proceed according to the conditions of the power transfer contract created in the negotiation phase 830.

<Power Control Based on CE>

The wireless power receiver 200 can control the power level by transmitting control error (CE) data that measures the deviation between the target and the actual operating point of the wireless power receiver 200 to the wireless power transmitter 100. The wireless power transmitter 100 and wireless power receiver 200 aim to make the control error data zero, at which point the system will operate at the target power level.

<In-Power Transfer FOD Method>

In addition to control error data, the wireless power transmitter 100 and the wireless power receiver 200 may exchange information to facilitate FOD. The wireless power receiver 200 regularly reports the amount of power it receives (received power level) to the wireless power transmitter 100, the wireless power transmitter 100 may inform the wireless power receiver 200 whether a foreign object has been detected. Methods that can be used for FOD in the power transfer phase may correspond to, for example, power loss calculations. In this approach, the wireless power transmitter 100 compares the received power level reported by the wireless power receiver 200 with the amount of transmitted power (transmitted power level) and it can send a signal (whether a foreign object has been monitored) to the wireless power receiver 200 when the difference exceeds a threshold.

<Renegotiation Phase>

If necessary depending on the situation, the wireless power transmitter 100 or the wireless power receiver 200 may request renegotiation of the power transfer contract during the power transfer phase. Examples of changed circumstances in which renegotiation of a power transfer contract may occur include:

When the wireless power receiver 200 requires (substantially) more power than previously negotiated.

When the wireless power transmitter 100 detects that it is operating at low efficiency.

When the wireless power transmitter 100 can no longer maintain its current power level due to increased operating temperature (Or vice versa, i.e., when the wireless power receiver 200 can operate at a higher power level after sufficiently cooling).

Here, an example of a specific protocol for the renegotiation phase is the same as described above.

<Data Transport Stream>

The wireless power transmitter 100 and the wireless power receiver 200 may start a data transmission stream and exchange application level data throughout the power transfer phase 840.

Here, an important common application is authentication, where each side can verify the other's credentials in a tamper-proof manner. For example, the wireless power receiver 200 may want to check the credentials of the wireless power transmitter 100 to ensure that the wireless power transmitter 100 can be trusted to operate safely at high power levels. Having the appropriate credentials can mean you have passed compliance testing.

Accordingly, the present specification may provide a method of starting power transfer at a low power level and controlling power to a higher level only after successfully completing the authentication protocol.

<Protocol in Power Transfer Phase 840>

So far, the operation between the wireless power transmitter 100 and the wireless power receiver 200 in the power transfer phase 840 has been briefly described. Hereinafter, for a smooth understanding of the operation in the power transfer phase 840, the protocol in the power transfer phase 840 will be described separately as a baseline protocol and an extended protocol.

FIG. 14 schematically shows a flow chart of the data flow for the power transfer phase 840 in the baseline protocol.

According to FIG. 14, the wireless power receiver 200 may transmit CE to the wireless power transmitter 100 (S1410). Here, the wireless power receiver 200 can generally transmit CE data packets several times per second.

The wireless power receiver 200 may generally transmit a received power (RP) data packet (RP8 in the baseline protocol) to the wireless power transmitter 100 once every 1.5 seconds (S1420).

Optionally, the wireless power receiver 200 may transmit a charge status (CHS) data packet to the wireless power transmitter 100 (S1430).

The data packet described above can be summarized and explained as follows.

CE: CE data packets can provide feedback on the desired power level. CE data packets may include a control error value, here, the control error value may be a signed integer value that is a relative measurement value of the deviation between the actual operating point and the target operating point of the wireless power receiver 200. If the control error value at this time is a positive value, it indicates that the actual operating point is below the target operating point, the wireless power transmitter 100 may be requested to increase the power signal. If the control error value is a negative value, it indicates that the actual operating point is above the target operating point, the wireless power transmitter 100 may be requested to reduce the power signal.

RP8: RP8 data packets can report the received power level. Here, RP8 data packets can only be included in the baseline protocol.

CHS: CHS data packets can provide the charge level of the battery at the load.

Figure 15:
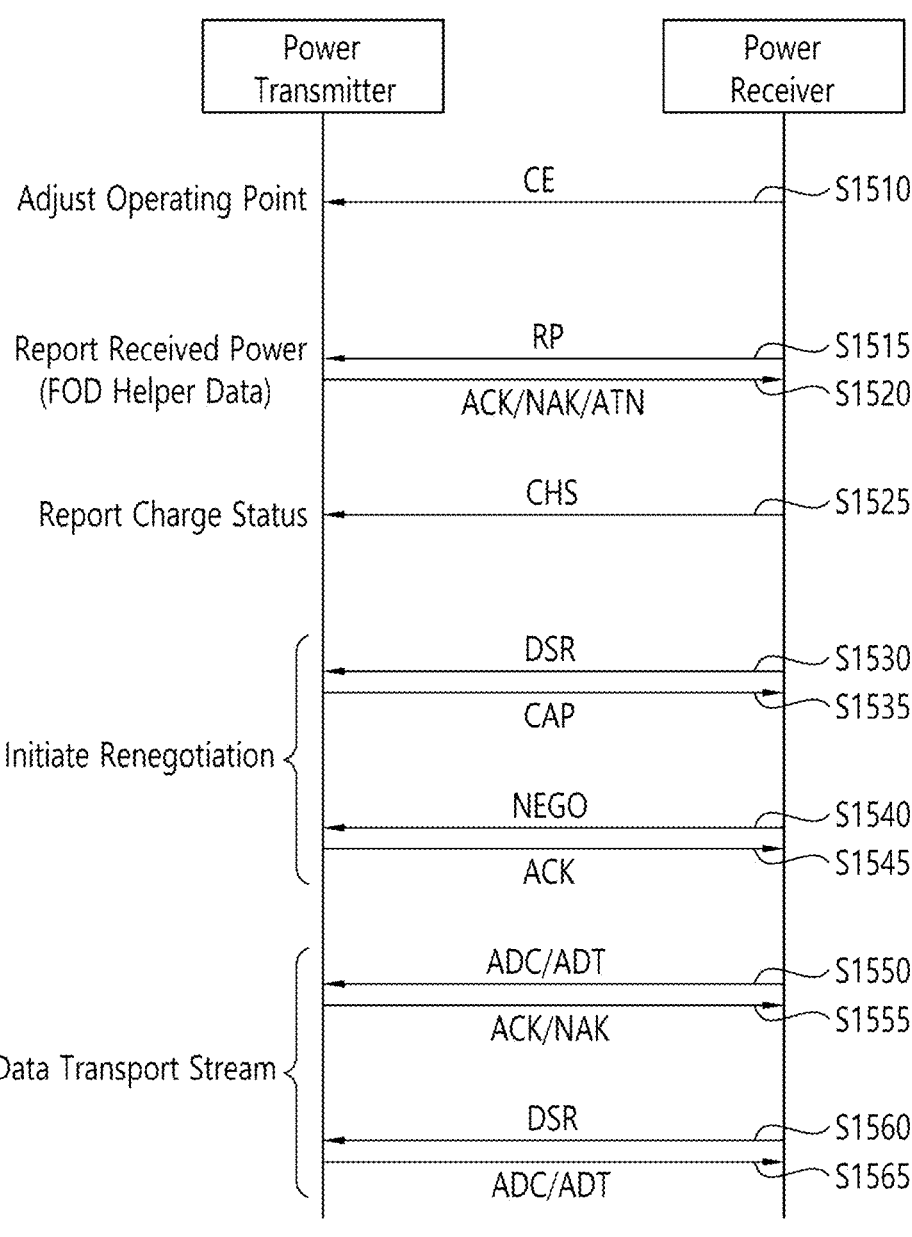
FIG. 15 schematically shows a flow chart of the data flow for the power transfer phase 840 in the extended protocol.

FIG. 15 schematically shows a flow chart of the data flow for the power transfer phase 840 in the extended protocol.

According to FIG. 15, the wireless power receiver 200 may transmit CE to the wireless power transmitter 100 (S1510). Here, the wireless power receiver 200 can generally transmit CE data packets several times per second.

The wireless power receiver 200 may generally transmit a received power (RP) data packet (RP in the extended protocol) to the wireless power transmitter 100 once every 1.5 seconds (S1515).

In the power transfer phase, control error packets (CE) and received power packets (RP) are data packets that must be repeatedly transmitted/received according to the required timing constraints to control wireless power.

The wireless power transmitter 100 can control the level of wireless power transmitted based on the control error packet (CE) and received power packet (RP) received from the wireless power receiver 200.

Meanwhile, in the extended protocol, the wireless power transmitter 100 may respond to the received power packet (RP) with a bit pattern such as ACK, NAK, or ATN (S1520).

The fact that the wireless power transmitter 100 responds with ACK to a received power packet (RP/0) with a mode value of 0 means that power transmission can continue at the current level.

When the wireless power transmitter 100 responds with NAK to a received power packet (RP/0) with a mode value of 0, this means that the wireless power receiver 200 must reduce power consumption.

For received power packets with a mode value of 1 or 2 (RP/1 or RP/2), when the wireless power transmitter 100 responds with ACK, this means that the wireless power receiver 200 has accepted the power calibration value included in the received power packet (RP/1 or RP/2).

For received power packets with a mode value of 1 or 2 (RP/1 or RP/2), when the wireless power transmitter 100 responds with NAK, it means that the wireless power receiver 200 did not accept the power calibration value included in the received power packet (RP/1 or RP/2).

The received power packet (RP/1) with a mode value of 1 described above may mean the first calibration data point, a received power packet (RP/2) with a mode value of 2 may mean an additional calibration data point. Here, the wireless power receiver may transmit a received power packet (RP/2) with a mode value of 2 to the wireless power transmitter multiple times to transmit a plurality of additional power calibration values, the wireless power transmitter can proceed with a calibration procedure based on the received RP/1 and multiple RP/2.

When the wireless power transmitter 100 responds with ATN to the received power packet (RP), it means that the wireless power transmitter 100 requests permission for communication. That is, the wireless power transmitter 100 may transmit an attention (ATN) response pattern to request permission to transmit a data packet in response to an RP data packet. In other words, the wireless power transmitter 100 may transmit an ATN to the wireless power receiver 200 in response to the RP data packet and request the wireless power receiver 200 for permission to transmit the data packet.

Optionally, the wireless power receiver 200 may transmit a charge status (CHS) data packet to the wireless power transmitter 100 (S1525).

Meanwhile, the wireless power transmitter 100 and the wireless power receiver 200 can exchange data stream response (DSR) data packets, CAP data packets, and NEGO data packets to initiate renegotiation of elements of the power transfer contract (typically guaranteed load power).

For example, the wireless power receiver 200 transmits a DSR data packet to the wireless power transmitter 100 (S1530), the wireless power transmitter 100 may transmit a CAP to the wireless power receiver 200 (S1535).

In addition, the wireless power receiver 200 transmits a NEGO data packet to the wireless power transmitter 100 (S1540), the wireless power transmitter 100 may transmit an ACK to the wireless power receiver 200 in response to the NEGO data packet (S1545).

Here, the data packets related to the start of the renegotiation phase can be summarized as follows.

DSR: Any one of the following values can be set in the DSR data packet.

i) 0x00-DSR/nak: Indicates that the last received data packet of the wireless power transmitter 100 was rejected.

ii) 0x33-DSR/poll: Invite the wireless power transmitter 100 to send a data packet.

iii) 0x55-DSR/nd: Indicates that the last received data packet from the wireless power transmitter 100 was not expected.

iv) 0xFF-DSR/ack: Confirms that the last received data packet of the wireless power transmitter 100 has been properly processed.

CAP: The CAP data packet provides information about the function of the wireless power transmitter 100. The specific details are the same as described previously.

NEGO: NEGO data packets may request the wireless power transmitter 100 to proceed to the re-negotiation phase.

The wireless power transmitter 100 and the wireless power receiver 200 may use auxiliary data transport (ADC), auxiliary data transport (ADT), and DSR data packets to exchange application level data.

That is, from the perspective of transmission and reception of a data transmission stream for exchange of application-level data, the wireless power receiver 200 may transmit ADC/ADT to the wireless power transmitter 100 (S1550), the wireless power transmitter 100 may transmit an ACK/NAK to the wireless power receiver 200 in response (S1555). In addition, the wireless power receiver 200 can transmit DSR to the wireless power transmitter 100 (S1560), the wireless power transmitter may transmit ADC/ADT to the wireless power receiver (S1565).

Here, the data transport stream serves to transfer application-level data from the data stream initiator to the data stream responder. Additionally, application level data can be broadly divided into i) authentication applications, and ii) proprietary (general purpose) applications.

Among application level data, messages/information related to the authentication application can be organized as follows.

The message used in the authentication procedure is called an authentication message. Authentication messages are used to convey information related to authentication. There are two types of authentication messages. One is an authentication request, and the other is an authentication response. An authentication request is sent by an authentication initiator, and an authentication response is sent by an authentication responder. The wireless power transmitting device and receiving device can be an authentication initiator or an authentication responder. For example, if the wireless power transmitting device is the authentication initiator, the wireless power receiving device becomes the authentication responder, and if the wireless power receiving device is the authentication initiator, the wireless power transmitting device becomes the authentication responder.

Authentication request messages include GET_DIGESTS, GET_CERTIFICATE, and CHALLENGE.

GET_DIGESTS: This request can be used to retrieve certificate chain digests. The wireless power receiver 200 can request a desired number of digests at a time.

GET_CERTIFICATE: This request can be used to read segments of the target certificate chain.

CHALLENGE: This request can be used to initiate authentication of a power transmitter product device.

The authentication response message includes DIGESTS, CERTIFICATE, CHALLENGE_AUTH, and ERROR.

DIGESTS: The wireless power transmitter 100 can send a certificate chain summary using the DIGESTS response and report slots containing a valid certificate chain summary.

CERTIFICATE: This response can be used by the wireless power transmitter 100 to send the requested segment of the certificate chain.

CHALLENGE_AUTH: The wireless power transmitter 100 can respond to the CHALLENGE request using CHALLENGE_AUTH.

ERROR: This response can be used to transmit error information from the power transmitter.

The authentication message may be called an authentication packet, authentication data, or authentication control information. Additionally, messages such as GET_DIGEST and DIGESTS may also be called GET_DIGEST packets, DIGEST packets, etc.

Meanwhile, as described above, the wireless power receiver 200 and the wireless power transmitter 100 can transmit application level data through a data transmission stream. Application-level data transmitted through a data transport stream may consist of a data packet sequence with the following structure.

Initial ADC data packet that opens the stream.

i) Types of messages contained in the stream.

ii) Number of data bytes in the stream.

A series of ADT data packets containing the actual message.

The final ADC/end data packet that closes the stream.

Hereinafter, the data transport stream for an example in which the above ADC, ADT, and ADC/end data packets are used will be described using the drawings.

Figure 16:
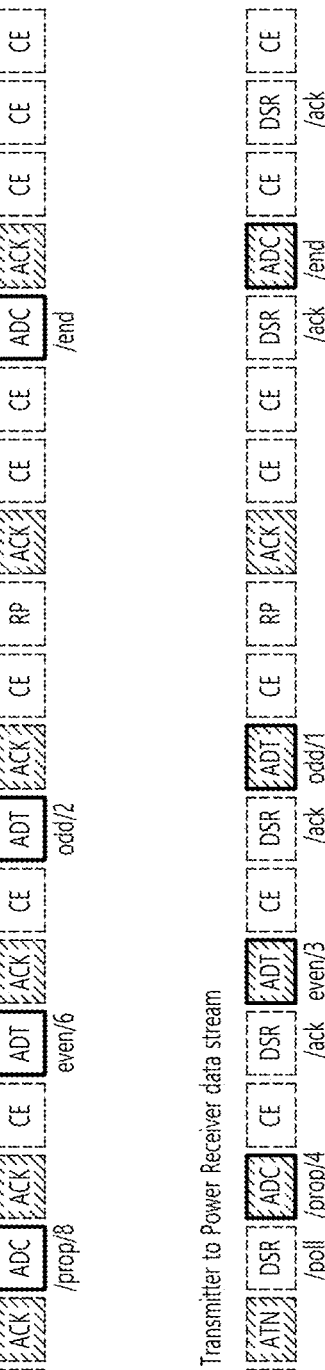
FIG. 16 illustrates an application-level data stream between the wireless power transmitter 100 and the wireless power receiver 200 according to an example.

FIG. 16 illustrates an application-level data stream between the wireless power transmitter 100 and the wireless power receiver 200 according to an example.

Referring to FIG. 16, the data stream may include auxiliary data control (ADC) data packets and/or auxiliary data transport (ADT) data packets.

ADC data packets are used to open a data stream. ADC data packets can indicate the type of message included in the stream and the number of data bytes. On the other hand, ADT data packets are sequences of data containing the actual message. ADC/end data packets are used to signal the end of a stream. For example, the maximum number of data bytes in a data transport stream may be limited to 2047.

ACK or NAC (NACK) is used to notify whether ADC data packets and ADT data packets are normally received. Between the transmission timing of the ADC data packet and the ADT data packet, control information necessary for wireless charging, such as a control error packet (CE) or DSR, may be transmitted.

Using this data stream structure, authentication-related information or other application-level information can be transmitted and received between a wireless power transmitter and a receiver.

An example for understanding the operation between the wireless power transmitter 100 and the wireless power receiver 200 in the power transfer phase 840 described above may be as follows.

Figure 17:
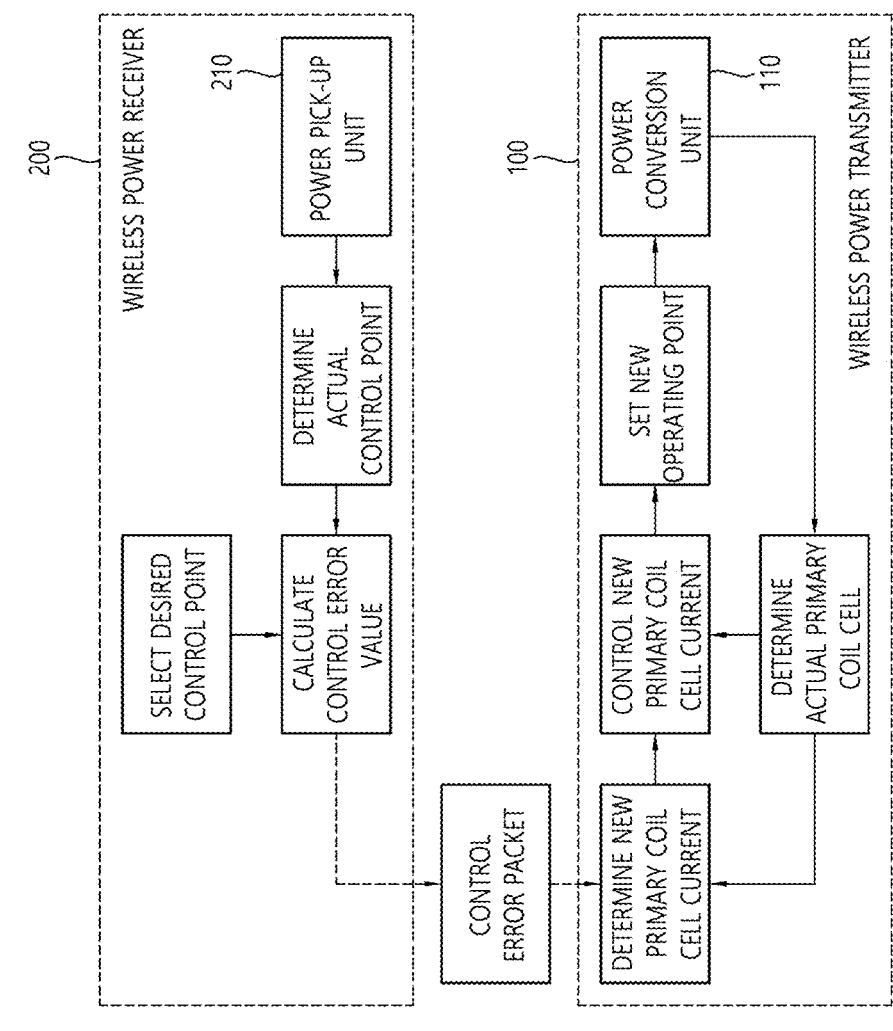
FIG. 17 shows a power control method according to one embodiment.

FIG. 17 shows a power control method according to one embodiment.

In the power transfer phase in FIG. 17, the wireless power transmitter 100 and the wireless power receiver 200 can control the amount of power transferred by performing communication along with power transmission and reception. The wireless power transmitter and wireless power receiver operate at a specific control point. The control point represents the combination of voltage and current provided from the output of the wireless power receiver when power transfer is performed.

More specifically, the wireless power receiver selects a desired control point, a desired output current/voltage, a temperature at a specific location of the mobile device, and so on, and additionally determines an actual control point at which the receiver is currently operating. The wireless power receiver calculates a control error value by using the desired control point and the actual control point, and, then, the wireless power receiver may transmit the calculated control error value to the wireless power transmitter as a control error packet.

Also, the wireless power transmitter may configure/control a new operating point—amplitude, frequency, and duty cycle—by using the received control error packet, so as to control the power transfer. Therefore, the control error packet may be transmitted/received at a constant time interval during the power transfer phase, and, according to the exemplary embodiment, in case the wireless power receiver attempts to reduce the electric current of the wireless power transmitter, the wireless power receiver may transmit the control error packet by setting the control error value to a negative number. And, in case the wireless power receiver intends to increase the electric current of the wireless power transmitter, the wireless power receiver transmit the control error packet by setting the control error value to a positive number. During the induction mode, by transmitting the control error packet to the wireless power transmitter as described above, the wireless power receiver may control the power transfer.

In the resonance mode, the device may be operated by using a method that is different from the induction mode. In the resonance mode, one wireless power transmitter should be capable of serving a plurality of wireless power receivers at the same time. However, in case of controlling the power transfer just as in the induction mode, since the power that is being transferred is controlled by a communication that is established with one wireless power receiver, it may be difficult to control the power transfer of additional wireless power receivers. Therefore, in the resonance mode according to the present disclosure, a method of controlling the amount of power that is being received by having the wireless power transmitter commonly transfer (or transmit) the basic power and by having the wireless power receiver control its own resonance frequency. Nevertheless, even during the operation of the resonance mode, the method described above in FIG. 17 will not be completely excluded. And, additional control of the transmitted power may be performed by using the method of FIG. 17.

Hereinafter, this Specification Will be Described in More Detail.

Wireless charging methods include a magnetic induction method using a magnetic induction phenomenon between a primary coil and a secondary coil, and a magnetic resonance method in which magnetic resonance is achieved using a frequency in a band of several tens of kHz to several MHz to transmit power. Here, the wireless charging standard for the magnetic resonance method is led by a conference called A4WP, and the magnetic induction method is led by the WPC (Wireless Power Consortium). Here, the WPC is designed to exchange various status information and commands related to the wireless charging system in-band.

The standards in WPC define a baseline power profile (BPP) and an extended power profile (EPP). Hereinafter, BPP and EPP will be described respectively.

A. Baseline Power Profile (BPP)

BPP relates to a power transfer profile between a wireless power transmitter and receiver that supports power transfer of up to 5 W. And, in BPP, unidirectional communication from a wireless power receiver to a wireless power transmitter is supported. The communication method at this time may correspond to ASK (amplitude shift keying). In BPP, there may be protocol phases of ping, configuration, and power transfer.

B. Extended Power Profile (EPP)

EPP relates to a power transfer profile between a wireless power transmitter and receiver that supports power transfer of up to 15 W. And, in EPP, bidirectional communication between a wireless power receiver and a wireless power transmitter is supported. The communication method from the wireless power receiver to the wireless power transmitter may correspond to ASK (amplitude shift keying), the communication method from the wireless power transmitter to the wireless power receiver may correspond to frequency shift keying (FSK). In EPP, there may be protocol phases of ping, setup, negotiation, and power transfer.

(a) Compatibility in EPP

EPP may correspond to a higher profile of BPP.

For example, if a BPP wireless power receiver is placed on an EPP wireless power transmitter, the EPP wireless power transmitter can operate as a BPP wireless power transmitter.

For example, if the EPP wireless power receiver is placed on a BPP wireless power transmitter, the EPP wireless power receiver can operate as a BPP wireless power receiver.

In other words, EPP can maintain compatibility with BPP.

(b) EPP Indication Method of EPP Wireless Power Receiver

The EPP wireless power receiver can indicate that it is an EPP wireless power receiver by setting the 'neg' bit in the configuration packet (i.e. CFG) to 1. Specific examples of configuration packets are as described above.

(c) EPP Indication Method of EPP Wireless Power Transmitter

When the EPP wireless power transmitter receives a configuration packet with the 'neg' bit set to 1 from the wireless power receiver, the EPP wireless power transmitter may respond to the wireless power receiver with an ACK FSK bit pattern.

For reference, as previously explained, the BPP wireless power transmitter does not support the FSK communication method, so the BPP wireless power transmitter cannot transmit FSK bit patterns. Accordingly, by not receiving the above ACK response, the EPP wireless power receiver, which sets the 'neg' bit to 1 and transmits a configuration packet to the BPP wireless power transmitter, can identify the other wireless power transmitter as a BPP wireless power transmitter.

Meanwhile, the wireless power transfer system seeks to provide a new power transfer profile, among the power transfer profiles proposed at this time, there is MPP (magnetic power profile). MPP may correspond to a proprietary extension from Apple based on Qi v1.3.0.

C. Magnet Power Profile (MPP)

MPP relates to a power transfer profile between a wireless power transmitter and receiver that supports power transfer of up to 15 W. And, in MPP, bidirectional communication between a wireless power receiver and a wireless power transmitter is supported. The communication method from the wireless power receiver to the wireless power transmitter may correspond to ASK (amplitude shift keying), the communication method from the wireless power transmitter to the wireless power receiver may correspond to frequency shift keying (FSK). At this time, fast FSK (NCYCLE=128) can be used during the negotiation and power transfer phase.

In MPP, there may be protocol phases of ping, configuration, MPP negotiation, and MPP power transfer.

(a) Compatibility in MPP

MPP may correspond to a higher profile of BPP.

For example, if a BPP wireless power receiver is placed on an MPP wireless power transmitter, the MPP wireless power transmitter can operate as a BPP wireless power transmitter.

For example, if the MPP wireless power receiver is placed on a BPP wireless power transmitter, the MPP wireless power receiver can operate as a BPP wireless power receiver.

In other words, MPP can maintain compatibility with BPP.

(b) MPP Operation of MPP Wireless Power Receiver (MPP Instruction Method)

The MPP wireless power receiver may use a specific MPP indicator within the extended ID packet.

In order for the MPP wireless power receiver to indicate whether MPP is supported through XID, the wireless power receiver must inform the wireless power transmitter that the XID is transmitted through an ID packet. The ID packet transmitted by the MPP wireless power receiver may be as follows.

FIG. 18 schematically shows the structure of an MPP ID packet.

According to FIG. 18, in the MPP ID packet, the value of the major version field from b4 to b7 of B0 may be set to 1.

In the MPP ID packet, the value of the minor version field from b0 to b3 of B0 may be a value to be determined later.

In the MPP ID packet, the values of the manufacturer codes of B1 and B2 may be assigned as PRMC codes.

In the MPP ID packet, the value of the 'ext' field of b7 of B3 may be set to 1 to indicate that an XID packet is additionally transmitted.

In the MPP ID packet, the values of the random identifier fields of b0 to b6 of B3 and b3 to b7 of B4 and B5 may be set according to a random device identification policy.

FIG. 19 schematically shows an example of an XID packet in MPP.

According to FIG. 19, an XID packet in MPP may include an 'XID Selector' field, a 'Restricted' field, and a 'Freq Mask' field.

Here, whether MPP is supported can be determined depending on whether the value of 'XID selector' is 0xFE. That is, if the value of B_0 of the XID is 0xFE, the XID at this time may correspond to information indicating that the wireless power receiver supports MPP.

The 'Restricted' field may correspond to information indicating whether the wireless power receiver operates in MPP restricted mode or MPP full mode. If the wireless power receiver selects to operate in MPP limited mode, the above field can be set to 1. Meanwhile, in other cases (e.g., when the wireless power receiver selects not to operate in MPP limited mode), the above field may be set to 0.

The 'Preferred Frequency' field may mean the MPP preferred frequency. Here, if the wireless power receiver wishes to retrieve information from the wireless power transmitter before switching the frequency (in the negotiation phase), this field can be set to 128 kHz. Otherwise, the wireless power receiver can set this field to 360 KHz.

The 'Freq Mask' field corresponds to a field for determining whether the operating frequency of 360 KHz is supported. That is, if the 'Freq Mask' field is set to 0, 360 kHz is supported.

In summary, the wireless power transmitter determines whether the 'Ext' bit of the ID received from the wireless power receiver is set to 1 and determines whether B_0 of the XID is set to 0xFE, the wireless power transmitter can determine whether the wireless power receiver supports MPP.

(c) MPP Operation of MPP Wireless Power Transmitter (MPP Instruction Method)

After detecting the placement of a wireless power receiver on the charging surface, the MPP wireless power transmitter can use the information contained in the ID and XID packets to perform a digital ping and identify the receiver.

Here, the wireless power transmitter may determine that the wireless power receiver supports MPP if all of the following conditions are met.

Qi version: The Qi protocol version of the ID packet is set to (Major=1, Minor=TBD) or higher.

MPP support notification: The subheader (byte 0) of the XID packet is set to the MPP selector.

If the above two conditions are not satisfied, the wireless power transmitter can proceed with subsequent procedures according to the Qi v1.3 specification.

Meanwhile, according to the MPP operation mode requested by the MPP wireless power receiver in the XID packet, the wireless power transmitter performs the following.

Restricted profile activation (MPP restricted mode): When the 'restricted' flag is set to 1.

Full profile activation (MPP full mode): when the 'restricted' flag is set to 0.

Specific examples of the above limited profile and full profiles will be described later.

Meanwhile, when the MPP wireless power transmitter receives a configuration packet with the 'neg' bit set to 1 from the wireless power receiver, the MPP wireless power transmitter (in MPP full mode) may respond to this to the wireless power receiver with an MPP ACK FSK bit pattern.

For reference, the wireless power transmitter in MPP restricted mode does not support the FSK communication method, so the wireless power transmitter in MPP restricted mode cannot transmit FSK bit patterns. However, because the wireless power transmitter in MPP restricted mode uses a 360 kHz operation signal to transmit power, accordingly, the MPP wireless power receiver setting the 'neg' bit to 1 and transmitting the configuration packet to the wireless power transmitter operating in MPP restricted mode allows the other wireless power transmitter to be identified as an MPP restricted mode wireless power transmitter through the operating frequency.

(d) Mode of MPP

Meanwhile, two modes may exist in MPP. One of them is MPP restricted mode (MPP Restricted mode) (in other words, MPP baseline profile), and the other one is MPP Full mode (in other words, MPP full profile).

To briefly explain the difference between the two, in MPP restricted mode, the 'restricted' field in the XID is set to 1, but in MPP full mode, the 'restricted' field in the XID is set to 0.

Additionally, FSK communication is not supported in MPP restricted mode, but FSK communication can be supported in MPP full mode.

Additionally, since FSK communication is not supported in MPP restricted mode, MPP ACK for CFG cannot be transmitted, accordingly, MPP negotiation is not supported in MPP restricted mode. On the other hand, in MPP full mode, FSK communication is supported, so MPP ACK for CFG can be transmitted, accordingly, MPP negotiation can be supported in MPP full mode.

Below, MPP restricted mode and MPP full mode will be described in more detail. Here, MPP restricted mode can be mixed with the MPP baseline profile, and MPP full mode can be mixed with the MPP full profile.

Below, for a better understanding of MPP restricted mode and MPP full mode, the protocols in each mode will be explained in more detail.

i) MPP Restricted Mode

As explained previously, FSK communication is not supported in MPP restricted mode. That is, in MPP restricted mode, there may be no data packets transmitted from the wireless power transmitter to the wireless power receiver. Against this background, the protocol in MPP restricted mode will be explained through drawings.

Figure 20:
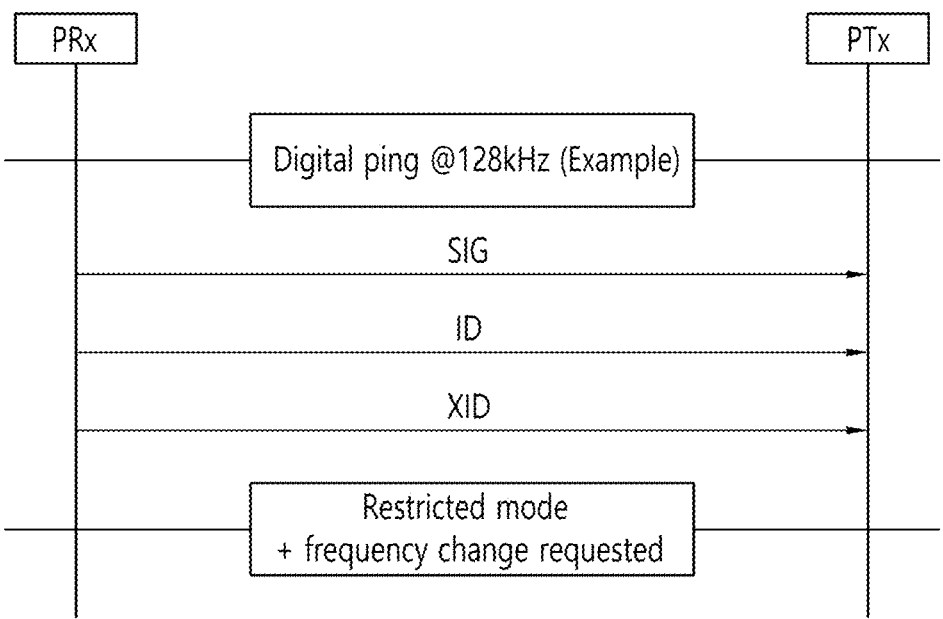
FIG. 20 schematically shows the protocol in MPP restricted mode.
Figure 20:
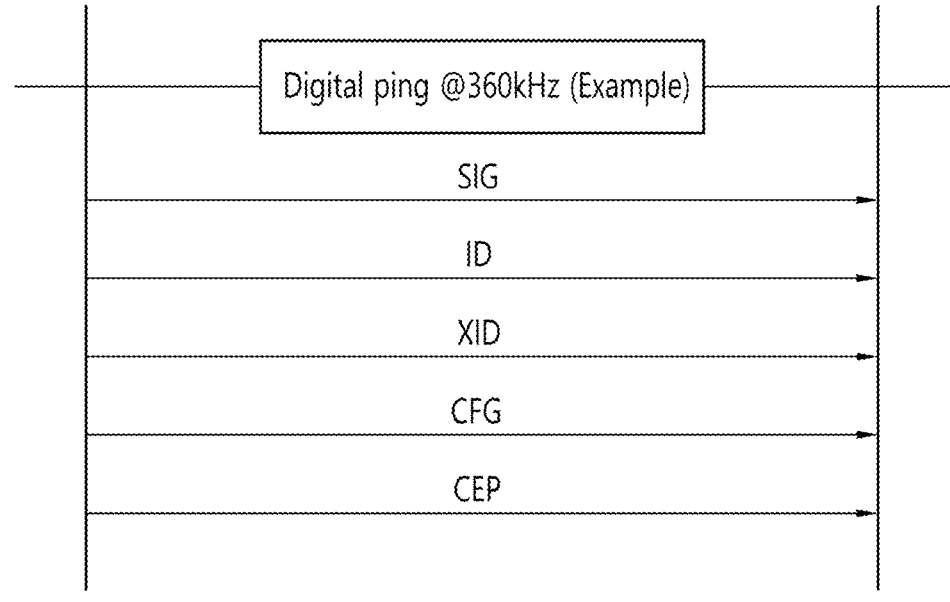

FIG. 20 schematically shows the protocol in MPP restricted mode.

According to FIG. 20, the wireless power receiver may transmit a SIG to the wireless power transmitter on a first operating frequency (e.g., 128 kHz). At this time, the first operating frequency may correspond to an operating frequency at which BPP and/or EPP can be performed. And, the first operating frequency at this time corresponds to the frequency at which the wireless power transmitter operates.

The wireless power receiver may transmit an ID packet to the wireless power transmitter on a first operating frequency. At this time, since the XID is always transmitted in MPP, the 'ext' bit of the ID may be set to 1 to indicate that the XID is additionally transmitted.

The wireless power receiver may transmit an XID packet to the wireless power transmitter on a first operating frequency.

At this time, the value of B0 in the XID may be 0xFE, and if the value of B0 in the XID is set to 0xFE, this may correspond to information indicating that the wireless power receiver supports MPP. In addition, the 'Restricted' field in the XID at this time may be set to 1 to indicate that the wireless power receiver operates in MPP restricted mode.

Here, when the wireless power transmitter receives the above XID packet indicating MPP restricted mode, the wireless power transmitter may remove the power signal and restart the ping phase at a new operating frequency.

When the ping phase is restarted, the wireless power receiver begins transmitting the SIG again. However, the operating frequency at this time may be a second operating frequency (e.g., 360 kHz).

Thereafter, the wireless power receiver transmits ID, XID, and CFG packets to the wireless power transmitter at the second operating frequency, respectively. In addition, the wireless power receiver can receive wireless power based on the MPP baseline from the wireless power transmitter by transmitting a CEP to the wireless power transmitter.

ii) MPP Full Mode

As described previously, FSK communication can be supported in MPP full mode. That is, in MPP full mode, there may be data packets transmitted from the wireless power transmitter to the wireless power receiver. In other words, MPP negotiation, etc. may be conducted between a wireless power transmitter and a wireless power receiver. Against this background, the protocol in MPP full mode will be explained through the drawings.

Figure 21:
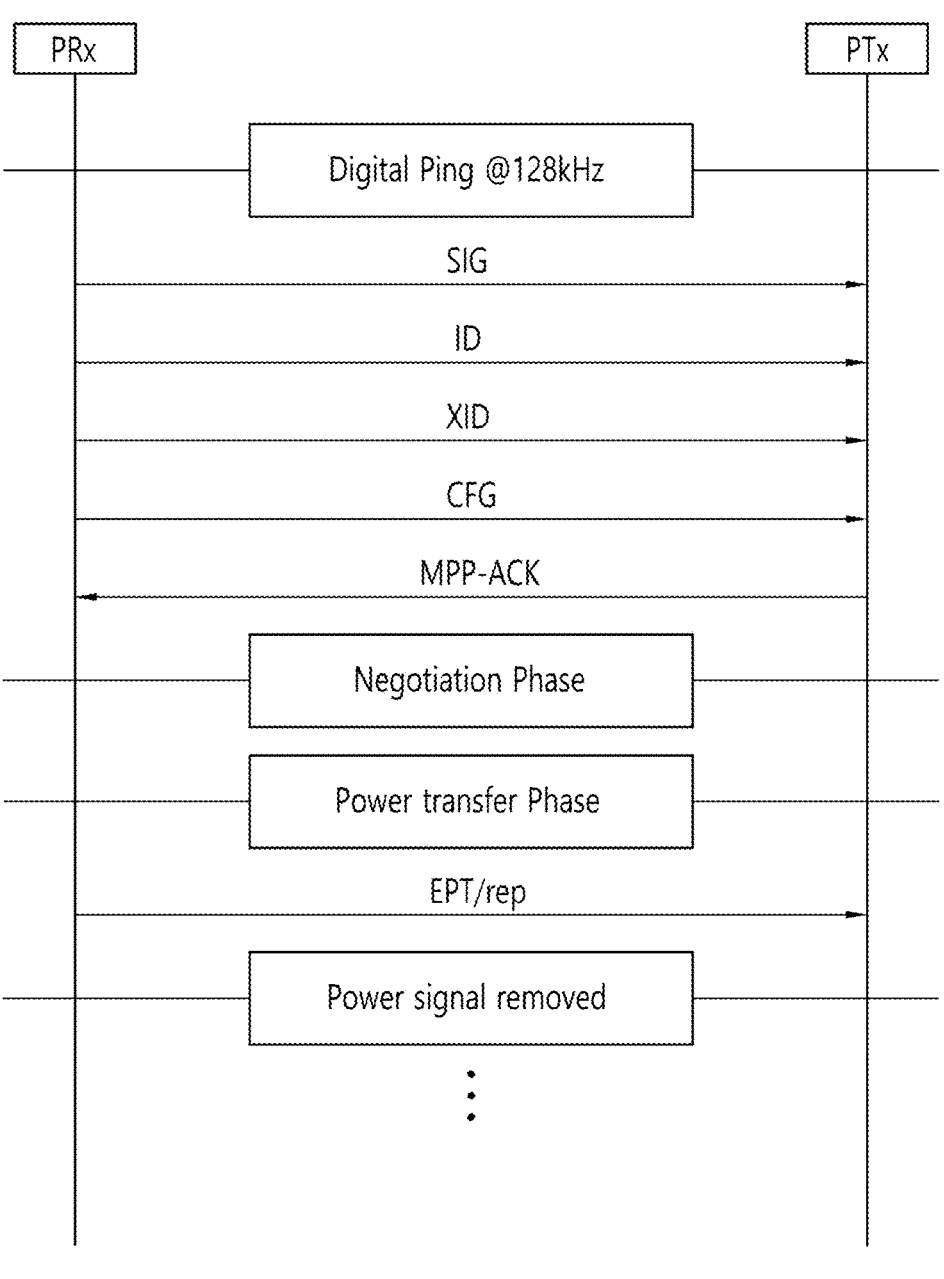
FIGS. 21 and 22 schematically show the protocol in MPP full mode.
Figure 22:
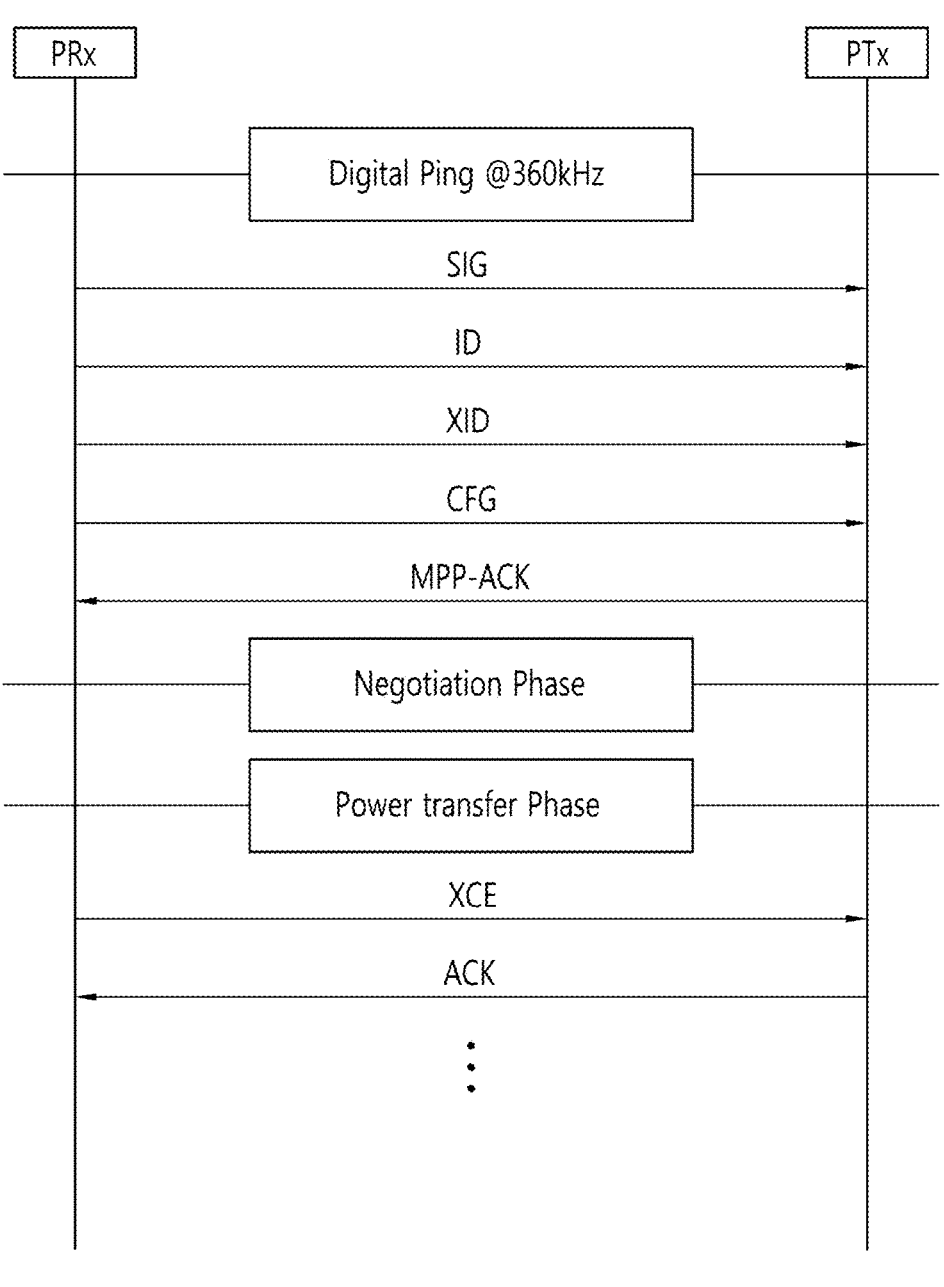

FIGS. 21 and 22 schematically show the protocol in MPP full mode.

First, according to FIG. 21, the wireless power receiver may transmit a SIG to the wireless power transmitter on a first operating frequency (e.g., 128 kHz). At this time, the first operating frequency may correspond to an operating frequency at which BPP and/or EPP can be performed. And, the first operating frequency at this time corresponds to the frequency at which the wireless power transmitter operates.

The wireless power receiver may transmit an ID packet to the wireless power transmitter on a first operating frequency. At this time, since the XID is always transmitted in MPP, the 'ext' bit of the ID may be set to 1 to indicate that the XID is additionally transmitted.

The wireless power receiver may transmit an XID packet to the wireless power transmitter on a first operating frequency.

At this time, the value of B0 in the XID may be 0xFE, and if the value of B0 in the XID is set to 0xFE, this may correspond to information indicating that the wireless power receiver supports MPP. In addition, the 'Restricted' field in the XID at this time may be set to 0 to indicate that the wireless power receiver operates in MPP full mode.

Meanwhile, in MPP full mode, unlike MPP restricted mode, the power signal is not removed even if the wireless power transmitter receives an XID packet from the wireless power receiver. At this time, since the power signal has not yet been removed, the wireless power receiver transmits a CFG packet to the wireless power transmitter after the XID packet.

And, the wireless power receiver can receive an MPP ACK from the wireless power transmitter as a response to the above CFG packet.

The wireless power receiver that receives the MPP ACK enters a negotiation phase with the wireless power transmitter, and both the wireless power receiver and the wireless power transmitter can proceed with negotiation.

After negotiation progresses, the wireless power receiver may enter a power transfer phase with the wireless power transmitter.

Meanwhile, the wireless power receiver transmits an EPT packet to the wireless power transmitter. The wireless power transmitter that receives the EPT packet removes the power signal and can then restart the ping phase at a new operating frequency.

According to FIG. 22, when the ping phase is restarted, the wireless power receiver starts again from transmitting the SIG. However, the operating frequency at this time may be a second operating frequency (e.g., 360 kHz).

Thereafter, the wireless power receiver transmits ID, XID, and CFG packets to the wireless power transmitter at the second operating frequency, respectively. And, the wireless power receiver can receive the MPP ACK from the wireless power transmitter.

The wireless power receiver that receives the MPP ACK enters a negotiation phase with the wireless power transmitter at the second operating frequency, and both the wireless power receiver and the wireless power transmitter can proceed with negotiation.

After negotiation, the wireless power receiver enters a power transfer phase with the wireless power transmitter at the second operating frequency. In addition, the wireless power receiver may receive wireless power based on the MPP full mode from the wireless power transmitter by transmitting an XCE to the wireless power transmitter and responding (e.g., receiving an ACK).

Hereinafter, this Specification Will be Described in More Detail.

In wireless charging, the presence of a foreign object between the wireless power transmitter and the wireless power receiver may pose a risk to wireless charging between the wireless power transmitter and the wireless power receiver.

This is because, due to the generation of a magnetic field between the wireless power transmitter and the wireless power receiver, heat is generated in a foreign object existing between the wireless power transmitter and the wireless power receiver, thereby reducing charging efficiency. In addition, in addition to simply reducing charging efficiency, the heat generated by the foreign object may cause the wireless power transmitter and/or wireless power receiver to malfunction.

Accordingly, the wireless power transfer system provides a protocol for foreign object detection.

A method of detecting a foreign object during power transmission provided by the current Qi specifications includes a calibration method.

Figure 23:
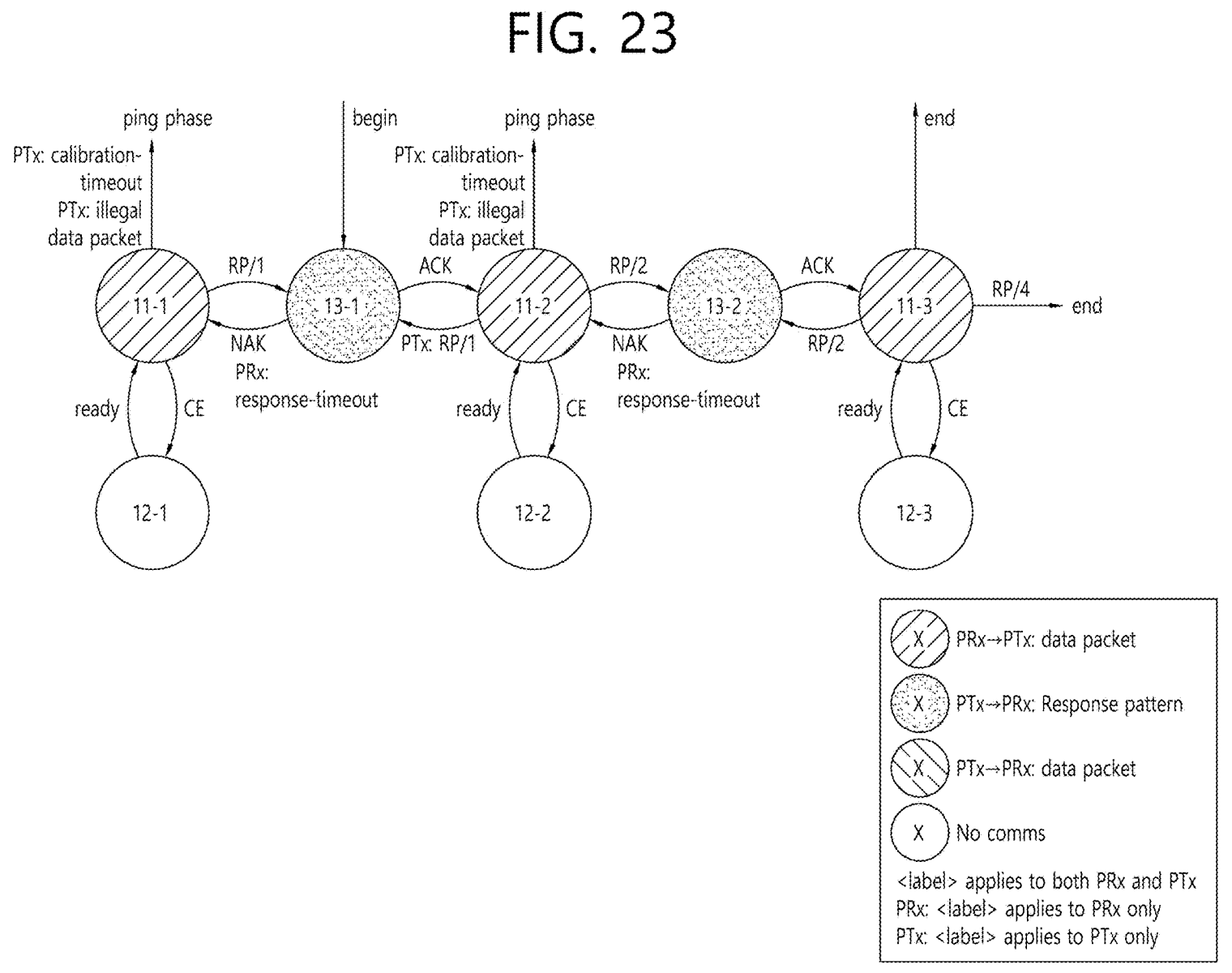

FIG. 23 shows a flowchart of the calibration method.

According to FIG. 23, when starting charging, the wireless power receiver may transmit light load information (e.g., RP/1) and heavy load information (e.g., RP/2) packets to the wireless power transmitter.

Thereafter, the wireless power transmitter may perform calibration based on data received from the wireless power receiver.

More specifically, based on the above calibration data (e.g. RP/1 and/or RP/2) and the power information sent from the wireless power receiver (e.g. RP/0 or RP/4), the wireless power transmitter can estimate power loss during charging. Here, if the power loss is greater than the threshold, the wireless power transmitter and/or wireless power receiver may determine that there is a foreign object and stop charging.

Meanwhile, as a method of measuring a foreign object before power transfer, a method of measuring quality factors can also be provided.

Hereinafter, the measurement of quality factor (Q-factor) will be described.

Figure 24:
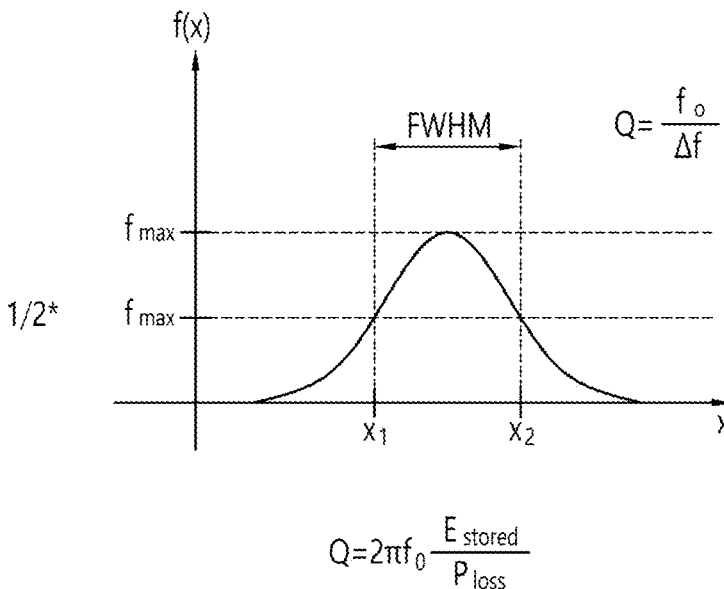
FIGS. 24 and 25 show examples of measurement/calculation of quality factors.
Figure 25:
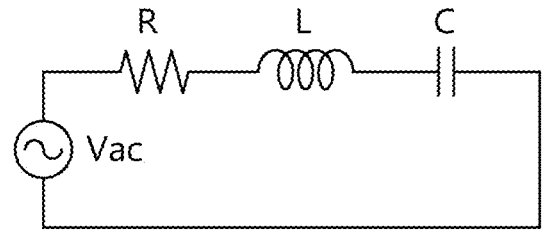

FIGS. 24 and 25 show examples of measurement/calculation of quality factors.

The quality factor, i.e. Q-factor, in FIGS. 24 and 25 is wL/R, which corresponds to a physical property used to find the resistance (R) component under given inductance (L) and frequency (w) conditions. Additionally, the above quality factor may be a value used for foreign object detection (FOD) between a wireless power transmitter and a wireless power receiver. More specifically, the wireless power receiver may remember the value of its reference Q factor in advance and transmit the reference Q factor value to the wireless power transmitter through a packet in the negotiation phase. At this time, the value of the reference Q factor may be transmitted from the wireless power receiver to the wireless power transmitter through FOD/XX (e.g. FOD/rf, FOD/qf) in the negotiation phase.

A wireless power transmitter can measure the Q-factor by generating a small signal before wireless charging (i.e., before power transfer). In addition, the wireless power transmitter can determine whether FOD exists by comparing the Q factor value measured by the wireless power transmitter with the value reported by the wireless power receiver (for example, the reference Q-factor value).

So far, the specification has described a foreign matter detection technique based on calibration during wireless power transfer and a foreign matter detection technique based on quality factors before wireless power transfer.

However, despite the existence of external substance detection techniques such as the method described above, there are limitations to the above external substance detection techniques.

First, according to the foreign substance detection technique by calibration during wireless power transfer, as shown in FIG. 23, since calibration is performed only once at the start of charging, despite the possibility of a change in alignment between the wireless power transmitter and wireless power receiver during charging, the wireless power transmitter and/or wireless power receiver will not be able to detect this.

As above, since the validity of the calibration data disappears (if the alignment is changed), the wireless power transmitter and/or wireless power receiver performs FOD with an incorrect reference value. And, because of this, the wireless power transmitter and/or wireless power receiver exposes it to the risk of IOP failure due to pulse positive FOD (False Positive FOD) and the risk of heating due to pulse negative FOD (False Negative FOD).

In addition, according to the material detection technique based on quality factors before wireless power transfer, such as FIGS. 24 and 25, since there is a difference of 1 to 2 seconds between the measurement time of the Q factor and the judgment time of FOD, there is a problem that FO may be inserted within the above time (1 to 2 seconds), which is a relatively long time from the wireless charging point of view.

Accordingly, this specification provides a method of measuring quality factors even during wireless power transfer and determining whether FO is inserted into wireless power transfer.

First, let's explain slots.

A slot may refer to a section in which the TX stops driving the coil and the voltage decreases. In other words, the slot may be a section where the wireless power transmitter stops driving the coil during charging and creates a closed loop state. To explain it another way, a slot can refer to a section where charging is temporarily interrupted.

Here, an example of a circuit for a coil in a wireless power transmitter for creating a slot may be described through the drawings as follows.

Figure 26:
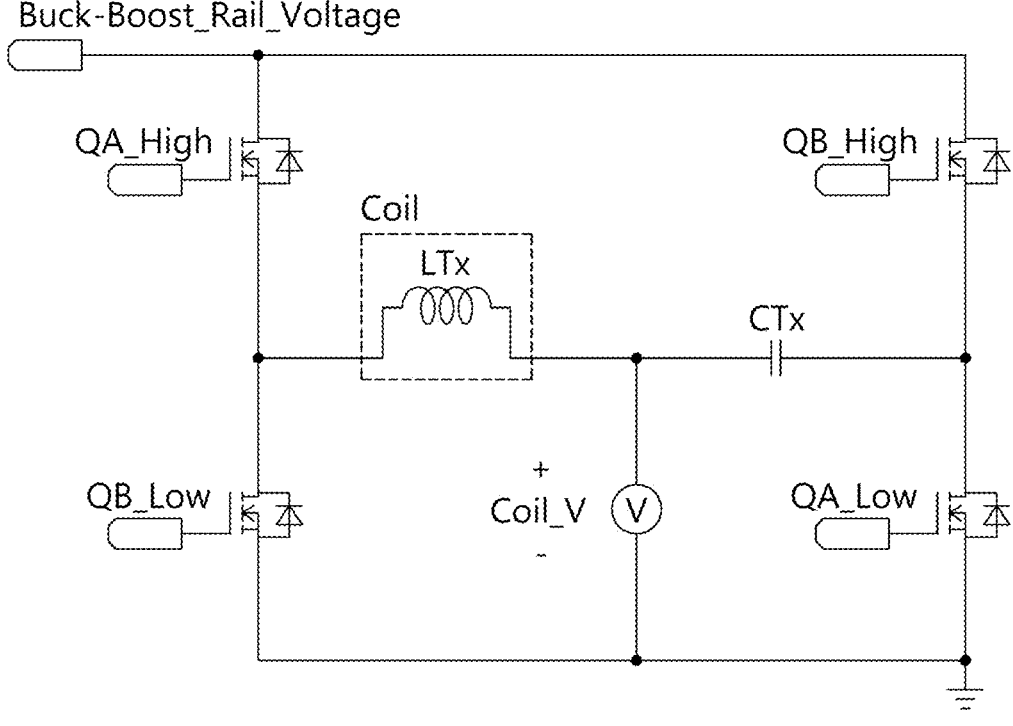
FIG. 26 schematically shows an example of a coil for creating a slot.

FIG. 26 schematically shows an example of a coil for creating a slot.

According to FIG. 26, based on the H-bridge, the wireless power transmitter can drive the charging coil. In this situation, in order to stop driving the coil as described above, the wireless power transmitter may close the 'QB_Low' and 'QA_Low' switches while driving the coil. That is, the wireless power transmitter can create a slot by closing the 'QB_Low' and 'QA_Low' switches while driving the coil.

Here, the section length of the slot may be determined depending on the frequency and number of waveforms. For example, the length of the slot section can be determined to be a section in which approximately 10 or more waveforms in which the voltage of the coil attenuates at the natural frequency occur.

And, in the time dimension, the section length of the above slot may be determined based on a section of about 100 us to 200 us, for example.

When a slot is created as above, the wireless power transmitter can calculate the quality factor, that is, the slot quality factor, on the slot. And, the method of calculating the slot quality factor is explained through the drawing as follows.

Figure 27:
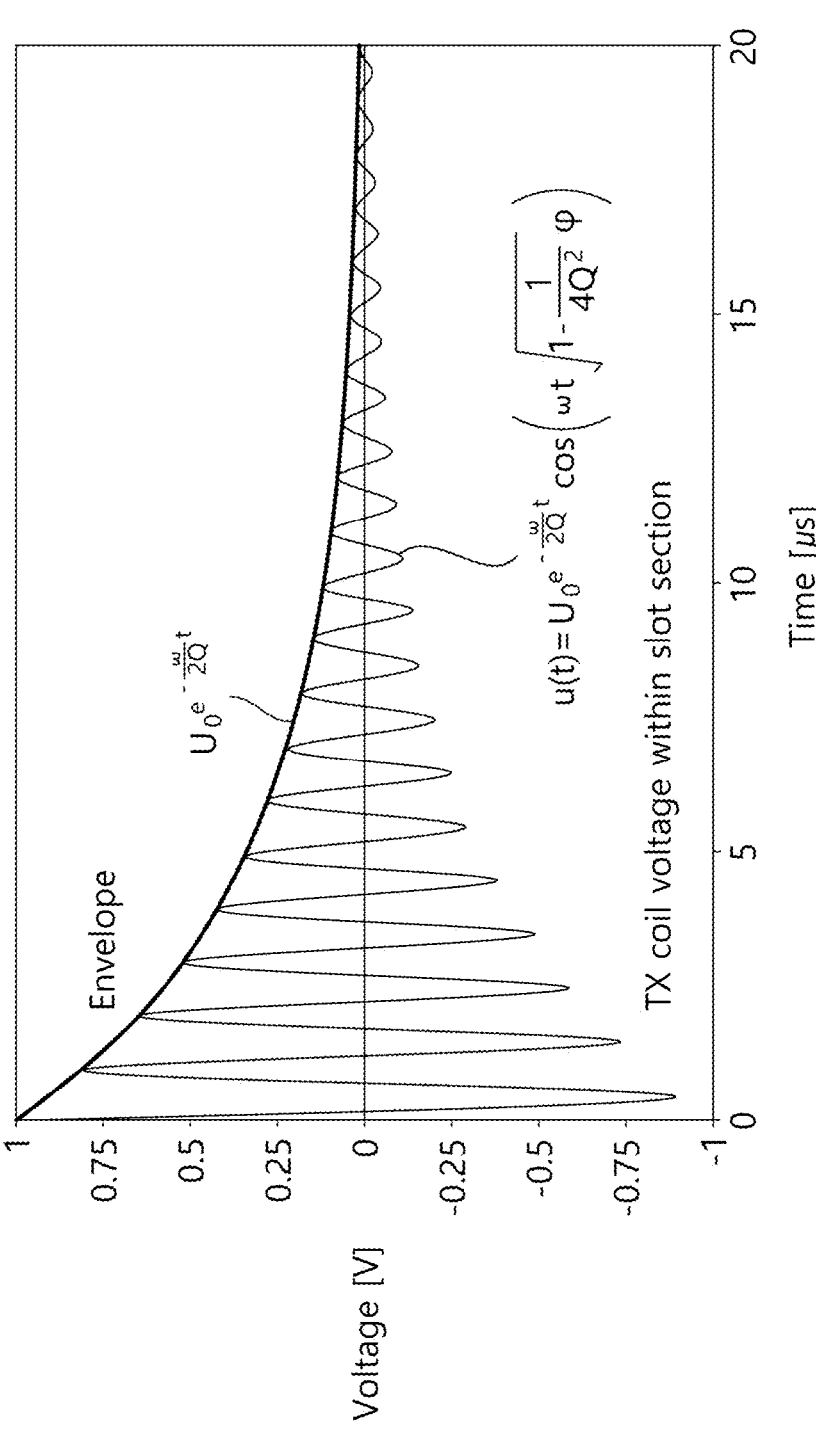
FIG. 27 schematically shows an example of calculation of a slot quality factor.

FIG. 27 schematically shows an example of calculation of a slot quality factor.

According to FIG. 27, when the wireless power transmitter stops driving the coil, the voltage at the coil of the wireless power transmitter decreases within the slot section. At this time, within the slot section, autonomous resonance occurs in the coil of the wireless power transmitter as shown in the figure, and the slot quality factor can be estimated from the attenuation ratio of this waveform.

Here, the waveform in the slot, that is, the voltage of the TX coil within the slot section, can be expressed as a formula, for example, as follows.

$$u(t) = U_0 e^{-\frac{\omega}{2Q}t} \cos\left(\omega t \sqrt{1 - \frac{1}{4Q^2}} + \varphi\right) \qquad \langle\text{Equation 1}\rangle$$

The wireless power transmitter can calculate the slot quality factor by measuring the voltage envelope of the resonance capacitor (cap) of the wireless power transmitter in the slot section, if the measurement point at this time is expressed on a circuit, the 'coil_V' part in FIG. 26 may correspond to the measurement point.

Here, the envelope can be expressed, for example, as the following formula.

$$U_0 e^{-\frac{\omega}{2Q}t} \qquad \langle\text{Equation 2}\rangle$$

That is, the wireless power transmitter can estimate the exponential function of the envelope, and the wireless power transmitter can calculate the quality factor (Q factor) using the attenuation ratio of the exponential function.

At this time, the energy transferred from the coil of the wireless power transmitter to the coil of the wireless power receiver becomes 0, when there is no foreign object, the wireless power transmitter can obtain the value of the slot quality factor (e.g. 'slotted Q-factor') that has the same value as the value of the quality factor (e.g. 'pre-power Q-factor') measured before starting charging.

In this way, the wireless power transmitter can determine the presence or absence of FO by comparing the Q value measured before charging and the slot Q value measured after charging.

Meanwhile, when creating a slot as described above, the following problem situations may occur.

Figure 28:
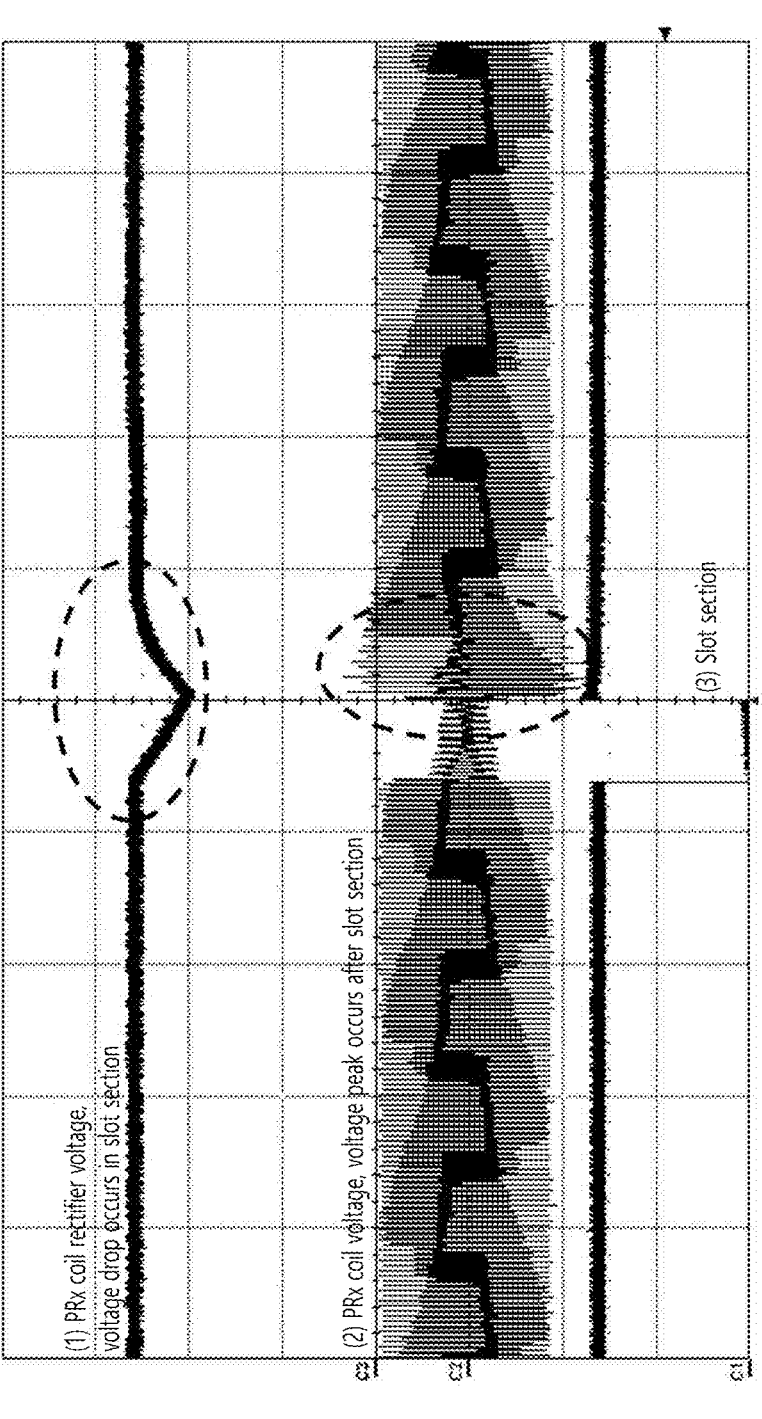
FIG. 28 schematically shows a problem situation that occurs when creating a slot.

FIG. 28 schematically shows a problem situation that occurs when creating a slot.

According to FIG. 28, (1) represents the coil rectification end voltage of the wireless power receiver. (2) represents the coil voltage of the wireless power receiver. (3) represents the slot section (in the wireless power transmitter).

As shown in the drawing, when the wireless power transmitter creates a slot as in (3) and the transmission of wireless power is temporarily interrupted, as shown in (2), the peak of the coil voltage of the wireless power receiver may occur immediately after the slot.

Here, if the coil voltage of the wireless power receiver rises beyond a level tolerated by the wireless power receiver, the circuit of the wireless power receiver may be damaged.

Accordingly, in this specification, a configuration for preventing the overvoltage phenomenon of a wireless power receiver is provided.

Additionally, as shown in the drawing, when the wireless power transmitter creates a slot as in (3) and the transmission of wireless power is temporarily interrupted, as shown in (1), a drop in the voltage of the coil rectifier of the wireless power receiver may occur in the slot section.

Here, if the voltage at the coil rectifier of the wireless power receiver drops excessively, a problem may occur in which the wireless power transfer itself is interrupted.

Accordingly, this specification also provides a configuration for preventing the undervoltage phenomenon of a wireless power receiver.

The following drawings were prepared to explain a specific example of the present specification. Since the names of specific devices or specific signals/messages/fields described in the drawings are provided as examples, the technical features of this specification are not limited to the specific names used in the drawings below.

Figure 29:
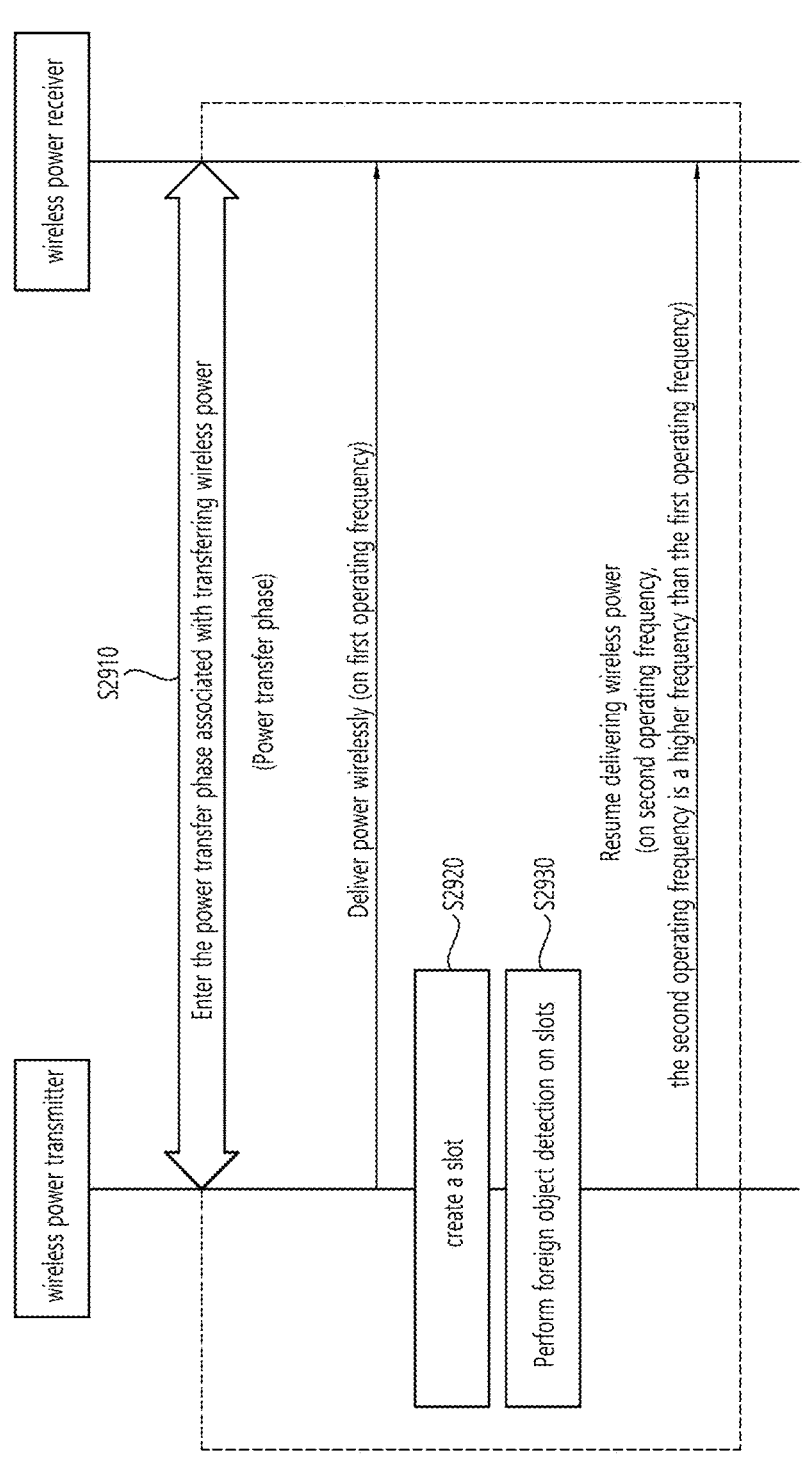
FIG. 29 is a flowchart of a method for performing foreign object detection according to an embodiment of the present specification.

FIG. 29 is a flowchart of a method for performing foreign object detection according to an embodiment of the present specification.

According to FIG. 29, the wireless power transmitter may enter a power transfer phase related to transferring wireless power to the wireless power receiver (S2910).

As described above, in the power transfer phase, power control based on CE may be performed. For example, the wireless power receiver 200 can control the power level by transmitting control error (CE) data, which measures the deviation between the target and the actual operating point of the wireless power receiver 200, to the wireless power transmitter 100.

Additionally, as described above, in the power transfer phase, FOD using RP packets may be performed. For example, the wireless power receiver 200 regularly reports the amount of power it receives (received power level) to the wireless power transmitter 100, the wireless power transmitter 100 may inform the wireless power receiver 200 whether a foreign object has been detected.

In addition, as described above, renegotiation may be performed in the power transfer phase. For example, if necessary depending on the situation, the wireless power transmitter 100 or the wireless power receiver 200 may request renegotiation of the power transfer contract during the power transfer phase.

And, as described above, in the power transfer phase, a data transport stream may be transmitted. For example, the wireless power transmitter 100 and the wireless power receiver 200 may start a data transmission stream and exchange application level data throughout the power transfer phase 840.

At this time, the wireless power transmitter may create a slot in the power transfer phase (S2920). As described above, a slot may mean, for example, a section in which the TX stops driving the coil and the voltage decreases. A more detailed description of the slot is as described above.

The wireless power transmitter may perform foreign object detection on the slot (S2930). Here, the wireless power transmitter can perform foreign object detection by calculating the quality factor on the slot as described above. A specific example of calculating the quality factor on a slot is the same as previously described, so it will be omitted.

Meanwhile, as described in FIG. 29, when the wireless power transmitter creates a slot and the transmission of wireless power is temporarily stopped, a peak in the coil voltage of the wireless power receiver may occur immediately after the slot.

Accordingly, hereinafter, the configuration for preventing the overvoltage phenomenon of the wireless power receiver will be described in more detail through the drawings. First, let us first explain the problem in wireless power receivers, that is, the overvoltage phenomenon.

1. Prevention of Overvoltage Phenomenon and Overvoltage Phenomenon

Figure 30:
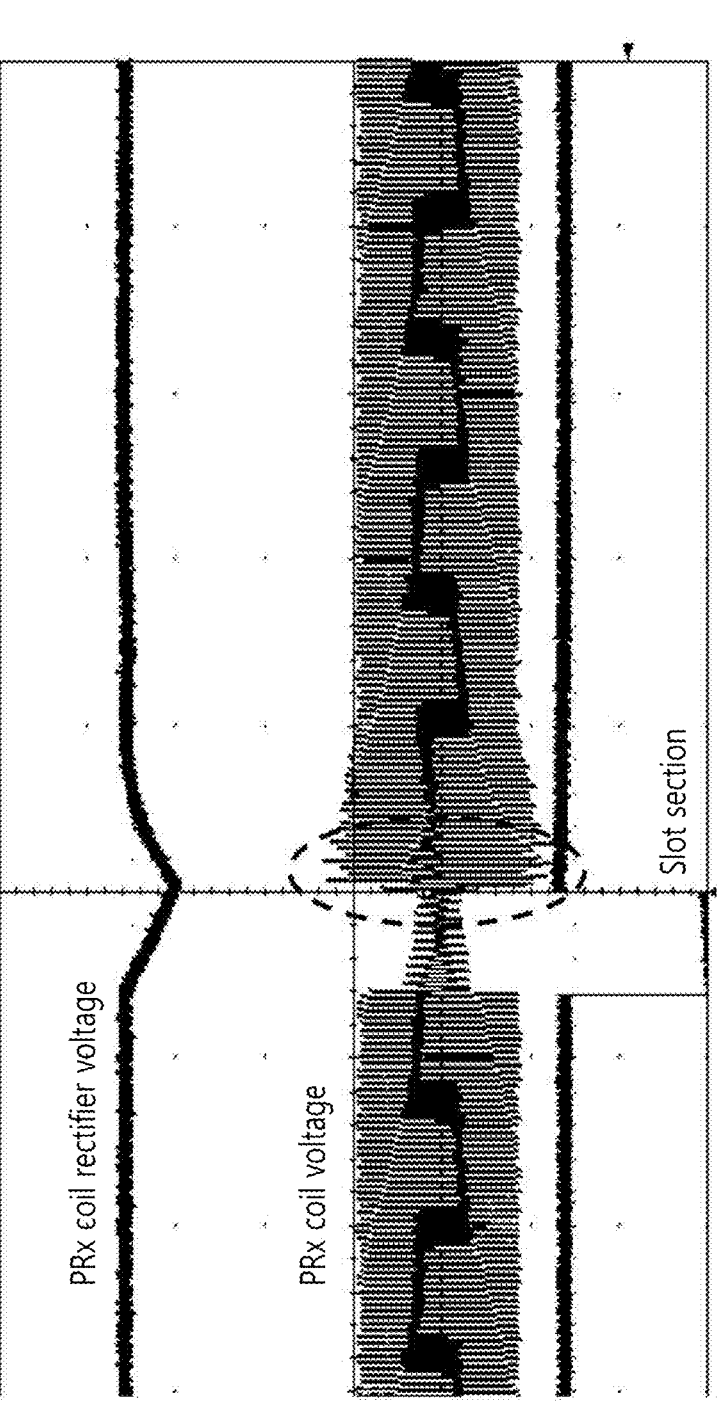
FIG. 30 schematically shows the overvoltage phenomenon of a wireless power receiver.

FIG. 30 schematically shows the overvoltage phenomenon of a wireless power receiver.

As shown in FIG. 30, when the rectified voltage of the wireless power receiver is high, (e.g., the wireless power receiver) may take a large load. In this case, when the wireless power transmitter returns to operation after the slot, an overvoltage phenomenon (for example, a situation in which an overshoot of the coil voltage that the wireless power receiver cannot handle occurs) may occur in the wireless power receiver.

In this way, if the shooting voltage is higher than the voltage design breakdown voltage of the wireless power receiver, problems such as damage to the circuit of the wireless power receiver may occur.

Here, one way to respond to overvoltage may be to include a capacitor with a larger capacity in the wireless power receiver.

However, when a large capacity capacitor is included in the wireless power receiver, the material cost of the wireless power receiver may increase. In addition, when the wireless power receiver includes a large capacitor, an increase in the weight of the wireless power receiver becomes a problem. In other words, when a large capacity capacitor is installed in a wireless power receiver that is generally used as a portable device, the weight of the wireless power receiver increases and user convenience may be greatly reduced.

Accordingly, in this specification, a wireless power transmitter performs input control to provide a configuration that protects the circuit of the wireless power receiver. A detailed explanation of this is provided through the drawings.

Figure 31:
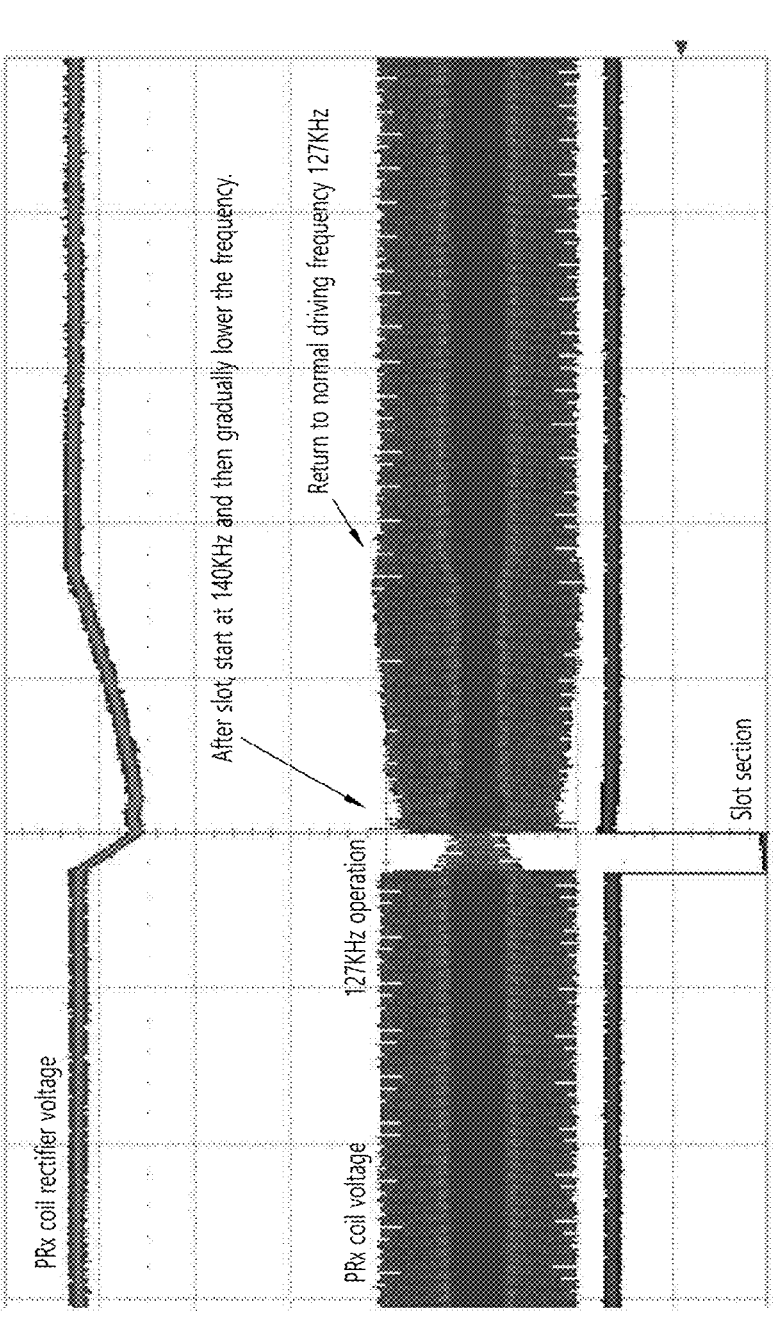
FIG. 31 schematically shows an example in which the overvoltage phenomenon of a wireless power receiver is prevented.

FIG. 31 schematically shows an example in which the overvoltage phenomenon of a wireless power receiver is prevented.

The wireless power transmitter transmits the wireless power to the wireless power receiver based on a first operating frequency before creating a slot, the wireless power transmitter may resume delivering wireless power based on the second operating frequency after the end of the slot. At this time, the second operating frequency may correspond to a higher frequency than the first operating frequency.

Additionally, the wireless power transmitter may transmit the wireless power based on a second operating frequency after the slot and then transmit the wireless power based on the first operating frequency. Here, the wireless power transmitter may gradually lower the operating frequency from the second operating frequency to the first operating frequency.

In this way, when an overvoltage situation is expected, the wireless power transmitter performs input control when returning to operation to prevent the overvoltage phenomenon of the wireless power receiver.

For example, to control the operation of the wireless power receiver in the slot, the wireless power transmitter may slowly increase the input of the wireless power transmitter after the slot. Through this, the wireless power transmitter can adjust the coil rectification voltage of the wireless power receiver to the target voltage.

An example of the result of this operation is shown in FIG. 31.

For example, the wireless power transmitter may transmit wireless power to the wireless power receiver based on an operating frequency of 127 KHz. Here, the coil voltage in the wireless power receiver when the wireless power transmitter transmits wireless power based on 127 KHz is shown in FIG. 31.

Here, after the slot has elapsed, the wireless power transmitter may resume transmitting wireless power to the wireless power receiver based on the operating frequency having a value of 140 KHz. In this way, if the wireless power transmitter transmits wireless power based on an operating frequency of 140 KHz, which is higher than the existing operating frequency of 127 KHz, as shown in FIG. 31, overvoltage can be prevented from occurring in the wireless power receiver.

On the other hand, if the wireless power transmitter transmits wireless power based on an operating frequency of 140 KHz immediately after the slot, gradually, the wireless power transmitter can lower its operating frequency to its initial operating frequency of 127 KHz.

As explained earlier, the reason why overvoltage is prevented when the operating frequency is temporarily increased is because there is a correlation between the operating frequency and power. For example, as the operating frequency increases, the power becomes relatively low, and as the operating frequency decreases, the power becomes relatively high. Accordingly, if the wireless power transmitter transmits low power using a high operating frequency immediately after the slot, the voltage at the coil of the wireless power receiver jumps relatively low. In other words, if the wireless power transmitter resumes power transfer at a high operating frequency, the problem of coil circuit damage even if an overshoot occurs in the coil voltage of the wireless power receiver can be solved.

Hereinafter, in order to reduce overshoot, an example of selecting an operating frequency with an output of 80% of the output at the existing operating frequency will be described. For this example, various simulation results will be explained.

FIGS. 32 to 35 are simulation results for an example of selecting an operating frequency with an output of 80% of the output at the existing operating frequency.

According to FIGS. 32 to 35, the wireless power receiver and/or wireless power transmitter may return to charging in an output state of 80% of the basic operation to reduce overvoltage.

Here, from the K measured in the slot and the gain graph compared to the current output and driving frequency, the operating frequency with an output value of 80% to be used for restoration of power transfer after the slot can be calculated.

Figure 32:
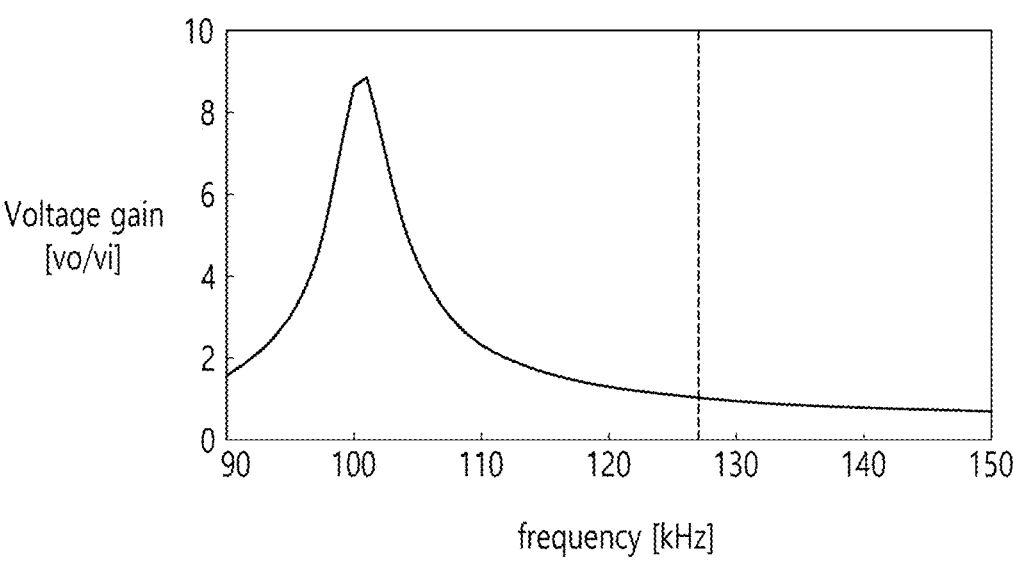
FIGS. 32 to 35 are simulation results for an example of selecting an operating frequency with an output of 80% of the output at the existing operating frequency.

In the example of FIG. 32, K can be assumed to be 0.336 and Output to be 0.8 W. Here, the existing driving frequency may be 127 KHz. In this situation, the driving frequency with an output value of 80% of 127 KHz is 137 KHz.

At this time, the wireless power transmitter may resume transmitting wireless power based on 137 KHz after the slot, and then return to transmitting wireless power based on 127 KHz.

Figure 33:
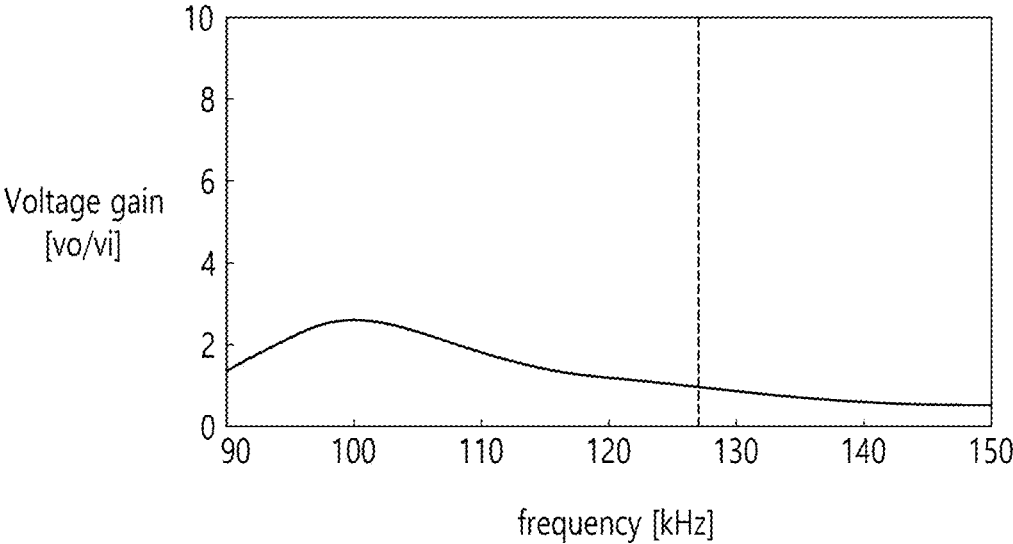

In the example of FIG. 33, K can be assumed to be 0.336 and Output to be 6.4 W. Here, the existing driving frequency may be 127 KHz. In this situation, the driving frequency with an output value of 80% of 127 KHz is 136 KHz.

At this time, the wireless power transmitter may resume transmitting wireless power based on 136 KHz after the slot, and then return to transmitting wireless power based on 127 KHz.

Figure 34:
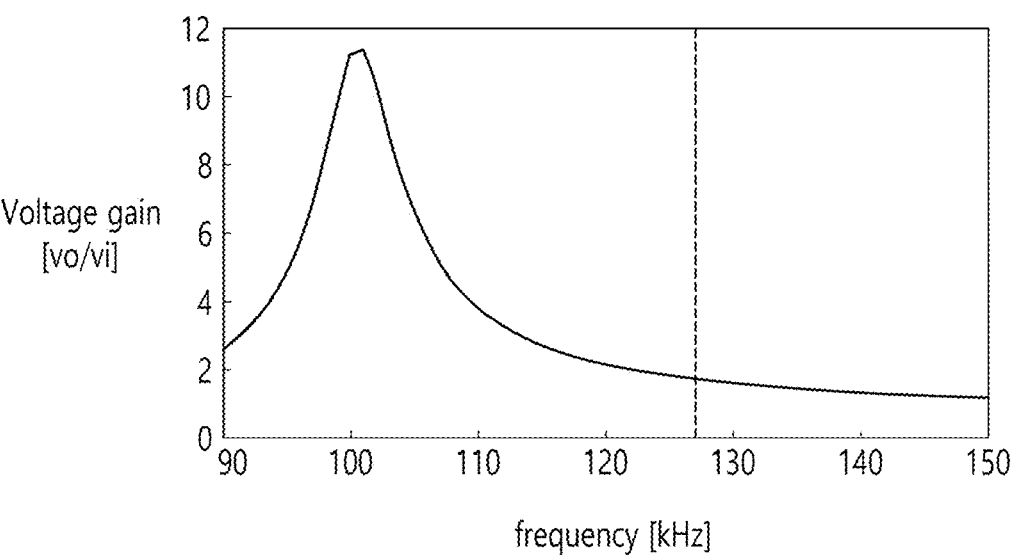

In the example of FIG. 34, K can be assumed to be 0.56 and Output to be 0.8 W. Here, the existing driving frequency may be 127 KHz. In this situation, the driving frequency with an output value of 80% of 127 KHz is 139 KHz.

At this time, the wireless power transmitter may resume transmitting wireless power based on 139 KHz after the slot, and then return to transmitting wireless power based on 127 KHz.

Figure 35:
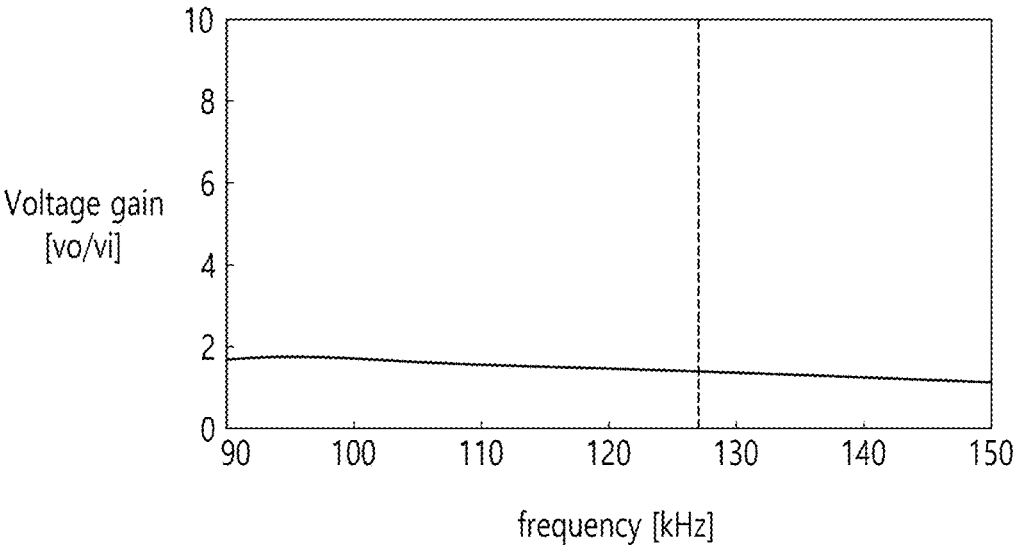

In the example of FIG. 35, K can be assumed to be 0.56 and Output to be 6.4 W. Here, the existing driving frequency may be 127 KHz. In this situation, the driving frequency with an output value of 80% of 127 KHz is 149 KHz.

At this time, the wireless power transmitter can resume transmitting wireless power based on 149 KHz after the slot, and can then return to transmitting wireless power based on 127 KHz.

Hereinafter, an example of an input control test of a wireless power transmitter to prevent overvoltage of the wireless power receiver will be explained through simulation results.

Figure 36:
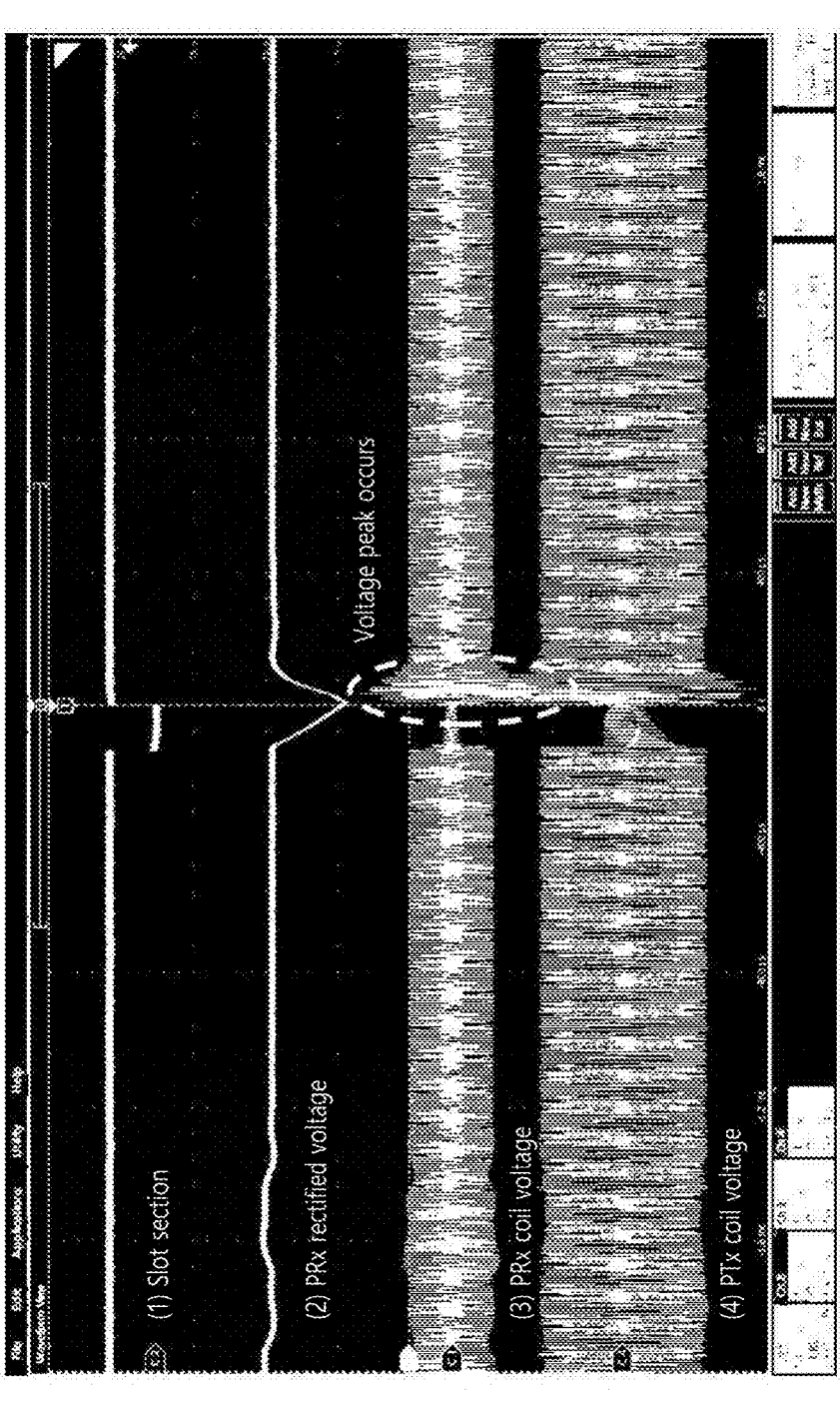
FIG. 36 is a simulation result of power transfer between a wireless power transmitter and a wireless power receiver for testing when the embodiment of the present specification is not applied.
Figure 37:
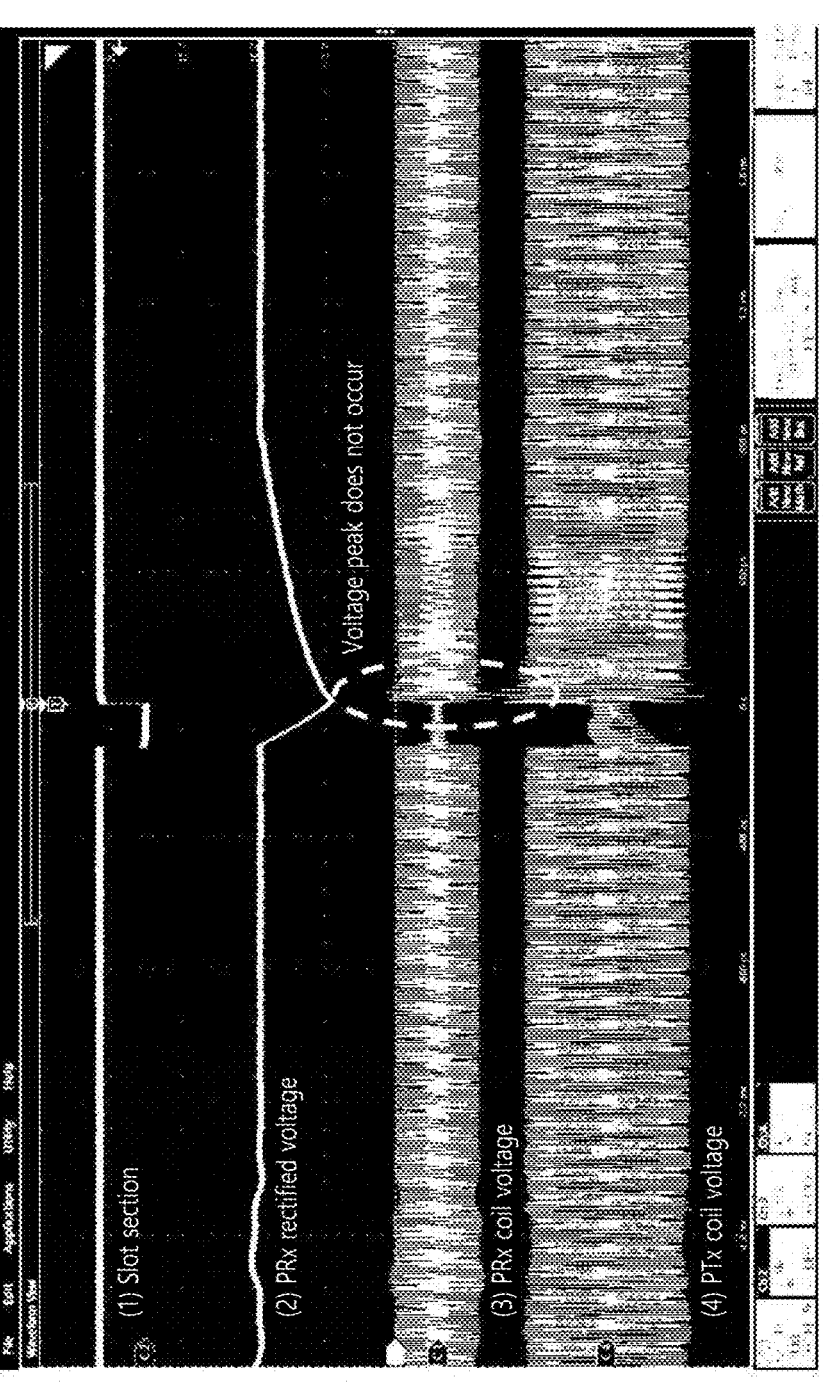
FIG. 37 is a simulation result of power transfer between a wireless power transmitter and a wireless power receiver for testing when an embodiment of the present specification is applied.

FIG. 36 is a simulation result of power transfer between a wireless power transmitter and a wireless power receiver for testing when the embodiment of the present specification is not applied. FIG. 37 is a simulation result of power transfer between a wireless power transmitter and a wireless power receiver for testing when an embodiment of the present specification is applied.

According to FIGS. 36 and 37, in an example of implementation using a wireless power transmitter and a wireless power receiver for testing, the rectified voltage of the wireless power receiver may be assumed to be 10V. And, the load can be assumed to be 800 mA.

As shown, in the example of FIG. 36, since the driving frequency control is not applied after the slot, a peak may occur in the coil voltage.

On the other hand, as shown, in the example of FIG. 37, since the driving frequency control is applied after the slot, a peak may not occur in the coil voltage.

Here, in the example of FIG. 37, as described above, PRx operation in the slot through PTx input control is shown. Here, after the slot, the wireless power transmitter can slowly increase the input to target the rectified voltage of the coil in the wireless power receiver. And, in the example of FIG. 37, it is assumed that the wireless power transmitter generates a slot at 127 KHz, which is the normal driving frequency, as described above. And, in the example of FIG. 37, it can be assumed that the wireless power transmitter gradually lowers the operating frequency from 140 KHz, which is the return frequency after the slot, to 127 KHz.

Meanwhile, as described above, when the wireless power transmitter creates a slot and the transmission of wireless power is temporarily interrupted, the voltage of the coil rectifier of the wireless power receiver may drop in the slot section.

Here, if the voltage at the coil rectifier of the wireless power receiver drops excessively, a problem may occur in which the wireless power transfer itself is interrupted.

Accordingly, the following will describe a configuration for preventing the undervoltage phenomenon of the wireless power receiver.

2. Prevention of Undervoltage Phenomenon and Undervoltage Phenomenon

Figure 38:
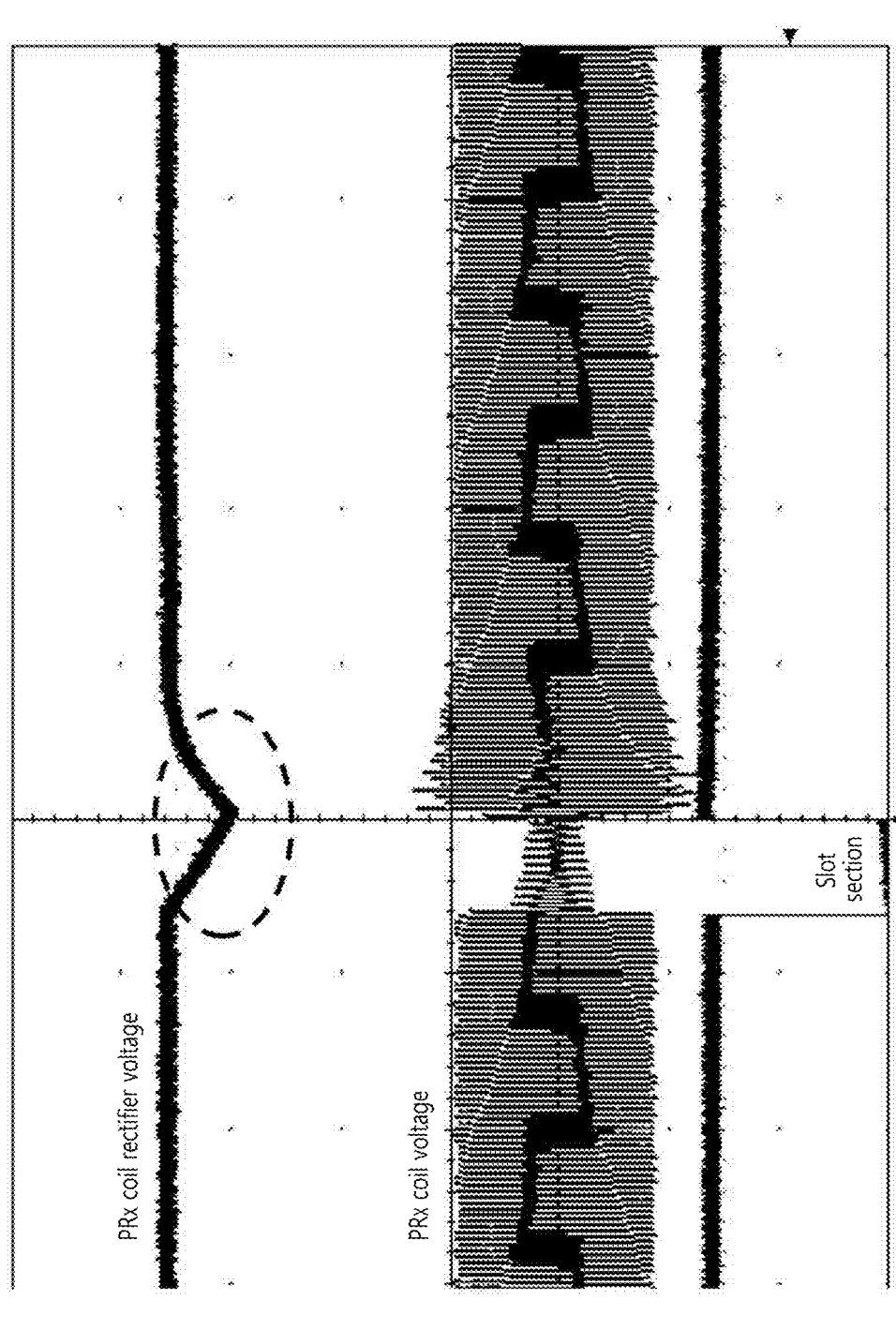
FIG. 38 schematically shows the overvoltage phenomenon of a wireless power receiver.

FIG. 38 schematically shows the overvoltage phenomenon of a wireless power receiver.

According to FIG. 38, the phenomenon in which the rectifier voltage of the wireless power receiver is temporarily lowered after the slot is shown.

Here, if the wireless power receiver takes a relatively large load while the rectified voltage of the wireless power receiver is low, an undervoltage phenomenon in the wireless power receiver may occur. That is, if the voltage becomes lower than the MCU driving voltage of the wireless power receiver, a problem in which charging of the wireless power receiver is stopped (undervoltage phenomenon) may occur.

Here, two methods can be provided to prevent the undervoltage phenomenon from occurring due to a drop in the coil rectifier voltage shown in FIG. 38.

As a method to prevent PRx undervoltage in the slot section, a method of controlling the input of the wireless power transmitter may be provided. That is, when an undervoltage phenomenon is expected in the wireless power transmitter, the wireless power transmitter can prevent a drop in the rectified voltage of the wireless power receiver by increasing the input voltage before entering the slot.

As another method for preventing PRx undervoltage in the slot section, a method of controlling the rectified voltage target of the wireless power receiver may be provided. That is, when the wireless power receiver is expected to operate in a slot, the wireless power receiver can increase the rectified voltage target compared to the existing operation. Operating in this way can result in the same effect as input control of a wireless power transmitter.

Figure 39:
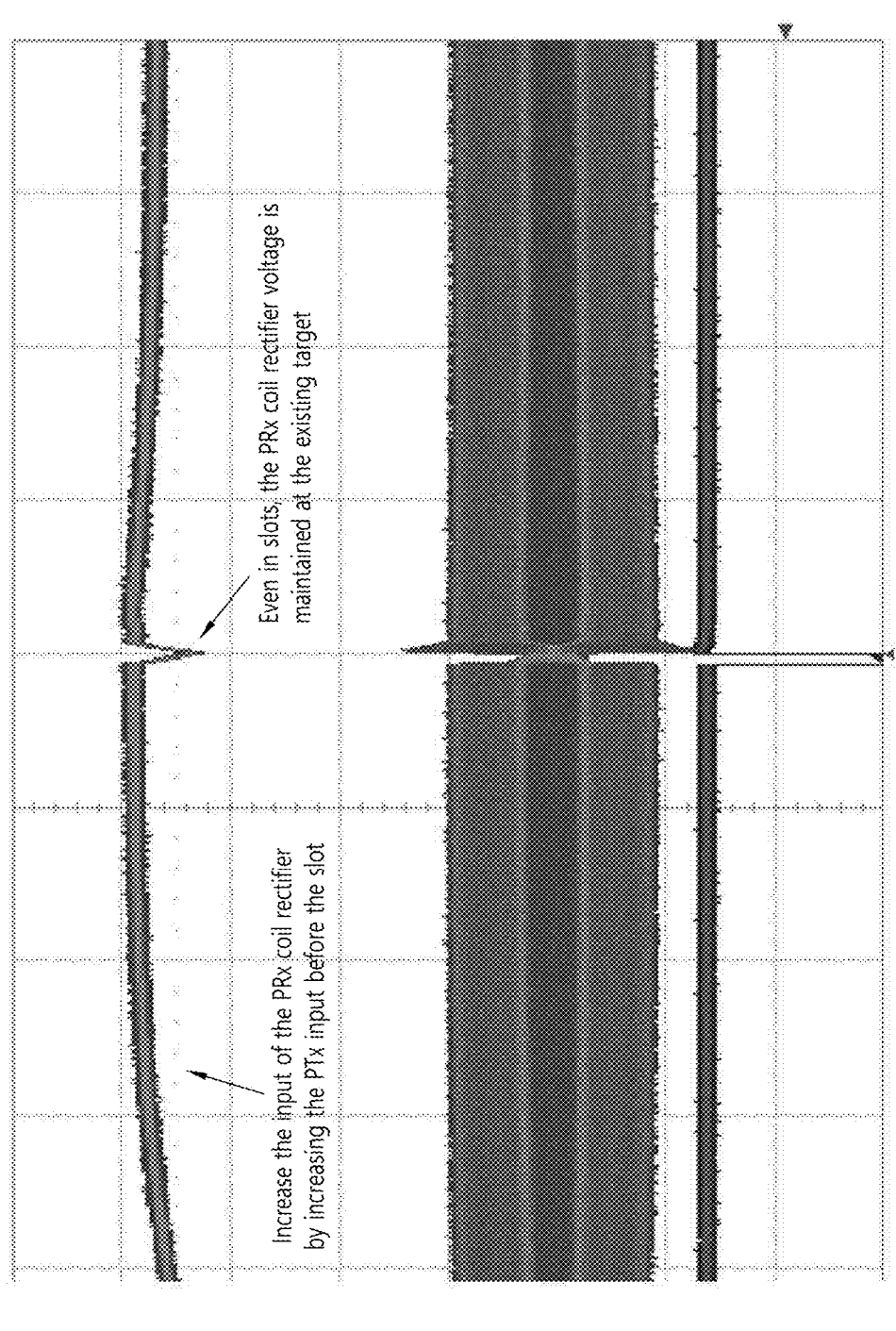
FIG. 39 schematically shows an example in which the undervoltage phenomenon of a wireless power receiver is prevented.

The operation of the wireless power receiving device in the slot through input control (or control of the rectified voltage target) of these wireless power transmitters is shown in FIG. 39.

FIG. 39 schematically shows an example in which the undervoltage phenomenon of a wireless power receiver is prevented.

As shown in FIG. 39, the wireless power transmitter and/or wireless power receiver may increase the input of the wireless power transmitter before entering the slot to increase the coil rectification voltage of the wireless power receiver. In this case, the coil rectified voltage may not fall below the target value in the slot section. And, after the slot, the input voltage of the wireless power transmitter can be gradually reduced to set the coil rectified voltage to the target.

Figure 40:
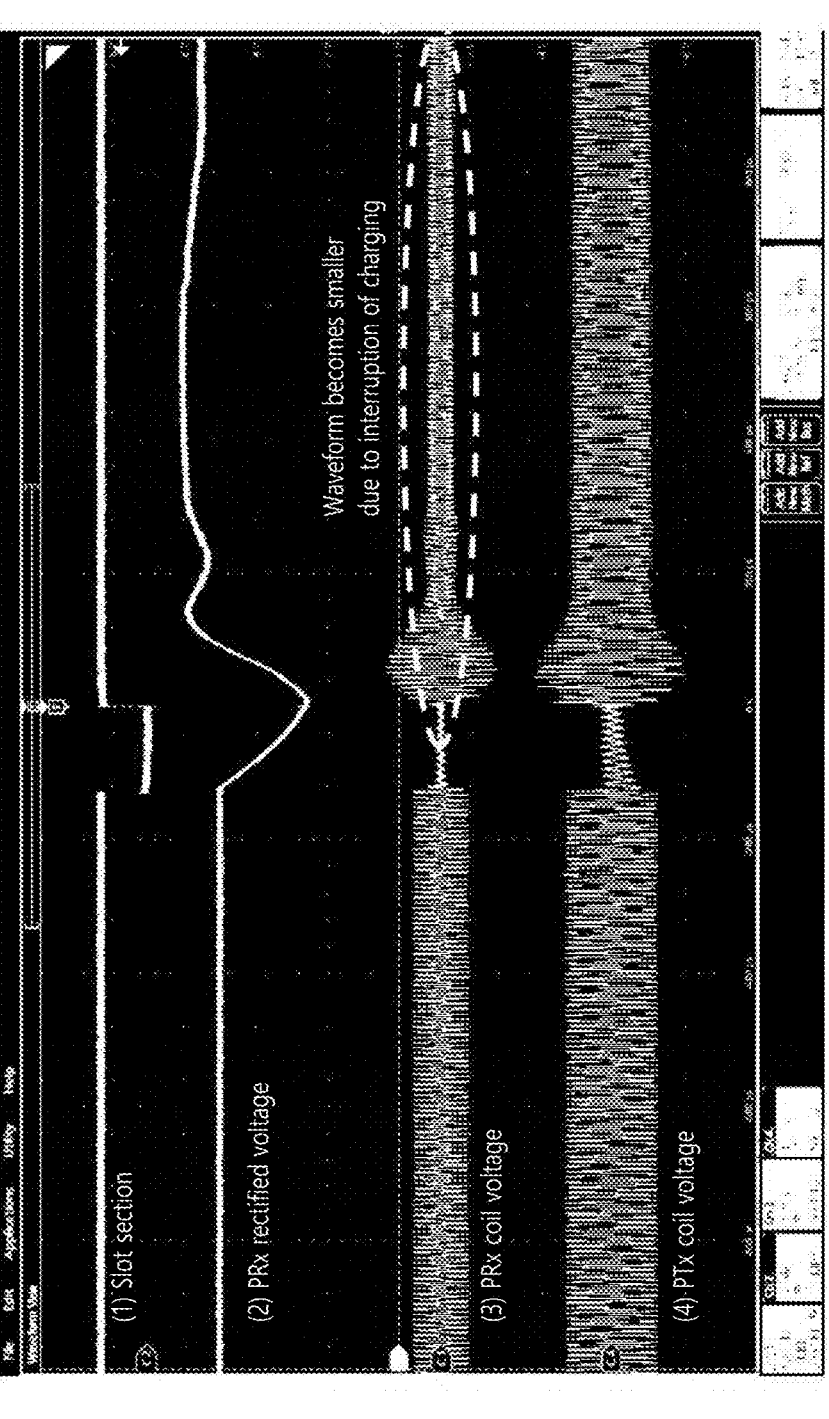
FIG. 40 is a simulation result of power transfer between a wireless power transmitter and a wireless power receiver for testing when the embodiment of the present specification is not applied.
Figure 41:
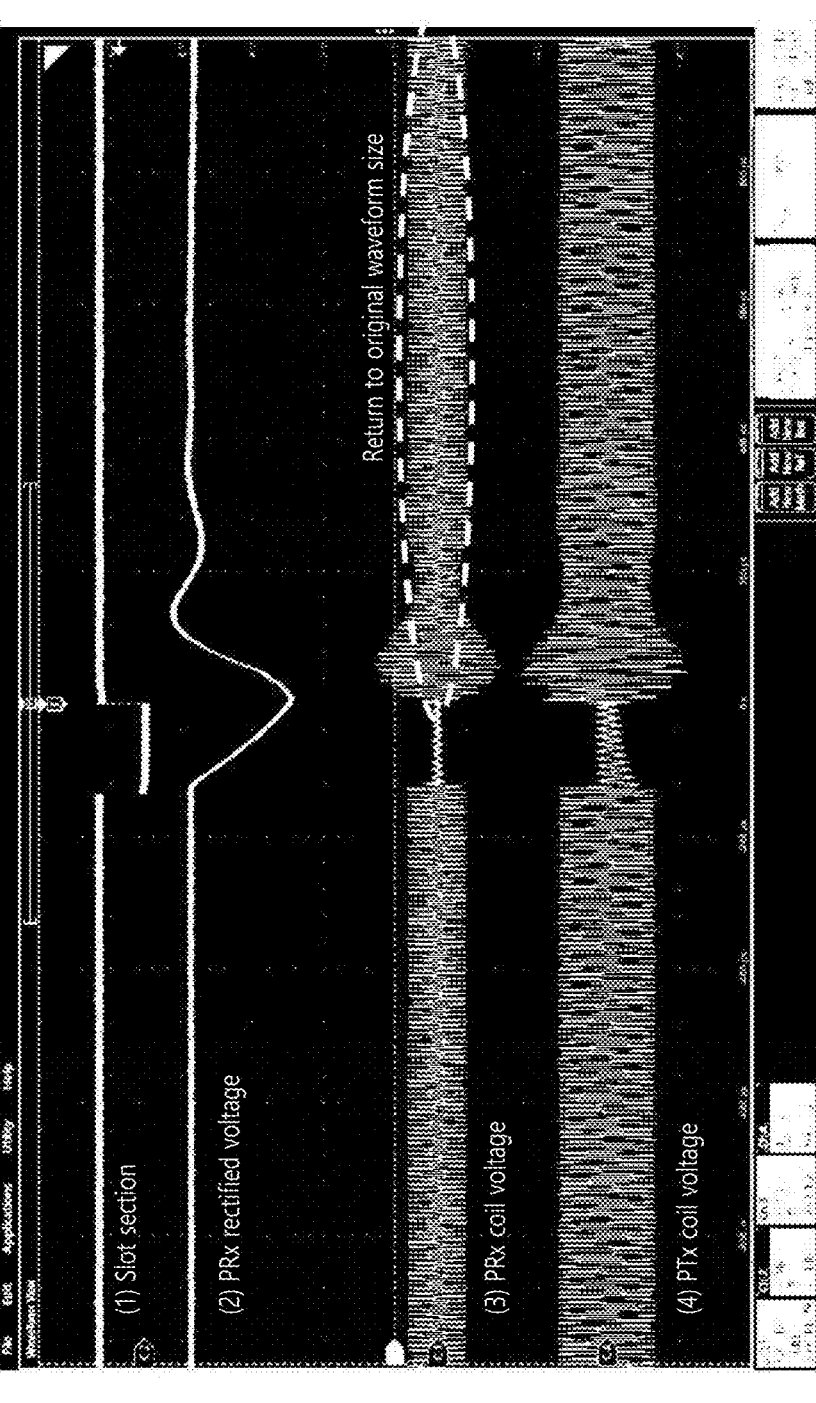
FIG. 41 is a simulation result of power transfer between a wireless power transmitter and a wireless power receiver for testing when an embodiment of the present specification is applied.

FIG. 40 is a simulation result of power transfer between a wireless power transmitter and a wireless power receiver for testing when the embodiment of the present specification is not applied. FIG. 41 is a simulation result of power transfer between a wireless power transmitter and a wireless power receiver for testing when an embodiment of the present specification is applied.

According to FIGS. 40 and 41, an example of an input control test of a wireless power transmitter to prevent undervoltage of the wireless power receiver in the slot section is shown. Here, in an example of implementation using a wireless power transmitter and a wireless power receiver for testing, it can be assumed that the PRx rectified voltage is 5V and the load is 500 mA.

As shown in FIG. 40, if input voltage control is not applied before entering the slot, the rectified voltage in the slot may fall below 3.3V. In other words, the coil rectification voltage of the wireless power receiver can be lower than 3.3V for driving the MCU. In such cases, charging may be interrupted due to MCU stoppage.

FIG. 40 shows an example in which the load on the wireless power receiver disappears due to charging interruption and the coil waveform becomes smaller after the slot.

As shown in FIG. 41, when the input voltage of the wireless power transmitter is increased before entering the slot, the rectified voltage in the slot can be maintained at 3.3V or higher. In this case, normal operation can be performed between the wireless power transmitter and/or wireless power receiver even after the slot.

So far, embodiments of the present specification have been described. Here, when the embodiments of the present specification are applied, the following requirements can be satisfied.

Figure 42:
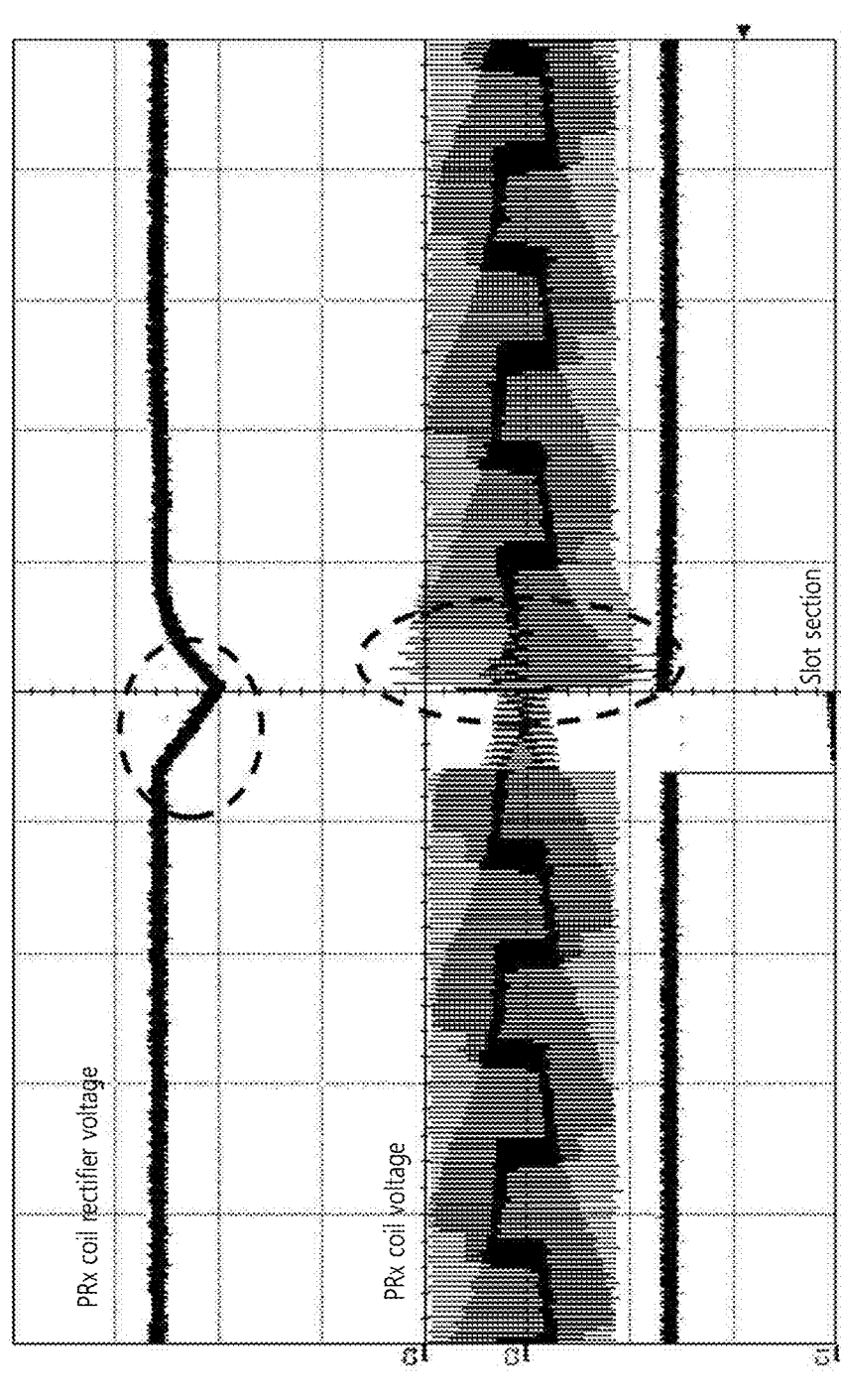
FIG. 42 schematically shows the rectifier voltage and coil voltage when a slot occurs.

FIG. 42 schematically shows the rectifier voltage and coil voltage when a slot occurs.

According to FIG. 42, overshoot may occur in the coil of the wireless power receiver after the slot. And, the rectification terminal voltage of the wireless power receiver may drop on the slot.

Despite this, according to the present specification, the following requirements can be met when implementing a slot to protect the wireless power receiver and prevent charging interruption.

In slot operation, the Over Voltage of the PRx coil voltage can be controlled to within 10% of the coil voltage before slot creation.

In slot operation, the PRx rectified voltage can be controlled so that it does not fall below the MCU driving voltage.

Hereinafter, embodiments of the present specification will be described again from the viewpoint of various subjects.

The following drawings were prepared to explain a specific example of the present specification. Since the names of specific devices or specific signals/messages/fields described in the drawings are provided as examples, the technical features of this specification are not limited to the specific names used in the drawings below.

FIG. 43 is a flowchart of a method for transmitting wireless power from the perspective of a wireless power transmitter, according to an embodiment of the present specification.

According to FIG. 43, the wireless power transmitter may enter a power transfer phase related to transferring the wireless power to the wireless power receiver (S4310).

Here, the wireless power transmitter may create a slot in the power transfer phase (S4320).

Afterwards, the wireless power transmitter may perform foreign object detection on the slot (S4330).

Here, the wireless power transmitter transmits the wireless power to the wireless power receiver based on a first operating frequency before generating the slot, the wireless power transmitter resumes transmitting the wireless power based on a second operating frequency after the end of the slot, and the second operating frequency may be a higher frequency than the first operating frequency.

At this time, the wireless power transmitter may transmit the wireless power based on the second operating frequency after the slot and then transmit the wireless power based on the first operating frequency. Here, the wireless power transmitter may gradually lower the operating frequency from the second operating frequency to the first operating frequency.

Meanwhile, the wireless power transmitter measures a first quality factor on the slot, and the wireless power transmitter may perform the foreign object detection based on the first quality factor. Here, the wireless power transmitter measures a second quality factor before the power transfer, and the wireless power transmitter may perform the foreign object detection based on the first quality factor and the second quality factor. At this time, the wireless power transmitter may detect that the foreign object has been inserted based on the fact that the first quality factor is lowered to a threshold or higher compared to the second quality factor.

Additionally, the wireless power transmitter measures a coupling factor on the slot, and the wireless power transmitter may perform the foreign object detection based on the coupling factor. Here, the coupling factor may be a factor indicating how well the wireless power transmitter and wireless power receiver are aligned.

Although not separately shown, a wireless power transmitter may be provided. The wireless power transmitter may include a converter involved in transferring wireless power to a wireless power receiver and a communication/controller involved in controlling the transfer of the wireless power. The wireless power transmitter enters a power transfer phase related to transferring the wireless power to the wireless power receiver, in the power transfer phase, a slot may be created and foreign object detection may be performed on the slot. The wireless power transmitter transmits the wireless power to the wireless power receiver based on a first operating frequency before generating the slot, the wireless power transmitter resumes transmitting the wireless power based on a second operating frequency after the end of the slot, and the second operating frequency may be a higher frequency than the first operating frequency.

FIG. 44 is a flowchart of a method of receiving wireless power from the perspective of a wireless power receiver, according to an embodiment of the present specification.

According to FIG. 44, the wireless power receiver may enter a power transfer phase related to receiving the wireless power from the wireless power transmitter (S4410).

Here, the wireless power receiver receives the wireless power from the wireless power transmitter based on a first operating frequency before creating a slot, the wireless power receiver resumes receiving the wireless power based on a second operating frequency after the end of the slot, and the second operating frequency may be a higher frequency than the first operating frequency.

Although not separately shown, a wireless power receiver may be provided. The wireless power receiver may include a power pickup device related to receiving wireless power from a wireless power transmitter and a communication/controller device related to controlling the reception of the wireless power. The wireless power receiver may enter a power transfer phase related to receiving the wireless power from the wireless power transmitter. The wireless power receiver receives the wireless power from the wireless power transmitter based on a first operating frequency before creating a slot, the wireless power receiver resumes receiving the wireless power based on a second operating frequency after the end of the slot, and the second operating frequency may be a higher frequency than the first operating frequency.

Hereinafter, the effects of this specification will be described.

As described previously, when the wireless power transmitter returns to operation after the slot, in a wireless power receiver, an overvoltage phenomenon (for example, a situation where an overshoot of a coil voltage that the wireless power receiver cannot handle) may occur.

According to the present specification, the wireless power transmitter controls the operating frequency, so that even if overshoot of the voltage after the slot occurs, only the overshoot occurs within a range that the wireless power receiver can handle.

Accordingly, according to the embodiment according to the present specification, the effect of protecting the circuit of the wireless power receiver may occur.

In particular, the embodiments of the present specification correspond to a more effective method than including a capacitor with a larger capacity in the wireless power receiver.

For this reason, if a large capacity capacitor is included in the wireless power receiver, the problem of increasing the material cost of the wireless power receiver may occur. In addition, when the wireless power receiver includes a large capacitor, an increase in the weight of the wireless power receiver becomes a problem. In other words, when a large capacity capacitor is installed in a wireless power receiver that is generally used as a portable device, the weight of the wireless power receiver increases and user convenience may be greatly reduced.

In contrast, according to the embodiment of the present specification, there are no additional components to the wireless power receiver. In other words, the material cost of the wireless power receiver can be reduced and the weight of the wireless power receiver does not increase.

In particular, considering that wireless power transmitters can already control the operating frequency, in the embodiment according to the present specification, there is a significant effect that overvoltage of the wireless power receiver can be prevented even if no additional components are added.

Additionally, since undervoltage can also be prevented in this specification, there is an effect of preventing the problem of wireless power transmission being stopped after the slot.

Effects obtainable through specific examples of the present specification are not limited to the effects listed above. For example, there may be various technical effects that a person having ordinary skill in the related art can understand or derive from this specification. Accordingly, the specific effects of the present specification are not limited to those explicitly described in the present specification, and may include various effects that can be understood or derived from the technical features of the present specification.

The claims set forth herein can be combined in a variety of ways. For example, the technical features of the method claims of this specification may be combined to be implemented as a device, and the technical features of the device claims of this specification may be combined to be implemented as a method. In addition, the technical features of the method claims of the present specification and the technical features of the device claims may be combined to be implemented as a device, and the technical features of the method claims of the present specification and the technical features of the device claims may be combined to be implemented as a method.

What is claimed is:

1. A method for transferring a wireless power in a wireless power transfer system, the method performed by a wireless power transmitter and comprising:

entering a power transfer phase related to transferring the wireless power to a wireless power receiver;

generating a slot in the power transfer phase; and performing a foreign object detection on the slot, wherein the wireless power transmitter transfers the wireless power to the wireless power receiver based on a first operating frequency before generating the slot, wherein the wireless power transmitter resumes transferring the wireless power based on a second operating frequency after end of the slot, and wherein the second operating frequency is a higher frequency than the first operating frequency.

2. The method of claim 1, wherein the wireless power transmitter transfers the wireless power based on the second operating frequency after the slot and then transfers the wireless power based on the first operating frequency.

3. The method of claim 2, wherein the wireless power transmitter gradually lowers an operating frequency from the second operating frequency to the first operating frequency.

4. The method of claim 1, wherein the wireless power transmitter measures a first quality factor on the slot, and wherein the wireless power transmitter performs the foreign object detection based on the first quality factor.

5. The method of claim 4, wherein the wireless power transmitter measures a second quality factor prior to transferring the wireless power, and wherein the wireless power transmitter performs the foreign object detection based on the first quality factor and the second quality factor.

6. The method of claim 5, wherein the wireless power transmitter detects that a foreign object is inserted based on the first quality factor being lowered by equal to or more than a threshold compared to the second quality factor.

7. The method of claim 1, wherein the wireless power transmitter measures a coupling factor on the slot, and wherein the wireless power transmitter performs the foreign object detection based on the coupling factor.

8. A wireless power transmitter, comprising:

a converter related to transferring wireless power to a wireless power receiver; and a communicator/controller related to controlling the transfer of the wireless power, wherein the wireless power transmitter:

enters a power transfer phase related to transferring the wireless power to the wireless power receiver;

generates a slot in the power transfer phase; and performs a foreign object detection on the slot, wherein the wireless power transmitter transfers the wireless power to the wireless power receiver based on a first operating frequency before generating the slot, wherein the wireless power transmitter resumes transferring the wireless power based on a second operating frequency after end of the slot, and wherein the second operating frequency is a higher frequency than the first operating frequency.

9. The wireless power transmitter of claim 8, wherein the wireless power transmitter transfers the wireless power based on the second operating frequency after the slot and then transfers the wireless power based on the first operating frequency.

10. The wireless power transmitter of claim 9, wherein the wireless power transmitter gradually lowers an operating frequency from the second operating frequency to the first operating frequency.

11. The wireless power transmitter of claim 8, wherein the wireless power transmitter measures a first quality factor on the slot, and wherein the wireless power transmitter performs the foreign object detection based on the first quality factor.

12. The wireless power transmitter of claim 11, wherein the wireless power transmitter measures a second quality factor prior to transferring the wireless power, and wherein the wireless power transmitter performs the foreign object detection based on the first quality factor and the second quality factor.

13. The wireless power transmitter of claim 12, wherein the wireless power transmitter detects that a foreign object is inserted based on the first quality factor being lowered by equal to or more than a threshold compared to the second quality factor.

14. The wireless power transmitter of claim 8, wherein the wireless power transmitter measures a coupling factor on the slot, and wherein the wireless power transmitter performs the foreign object detection based on the coupling factor.

* * * * *